(12) United States Patent
Ku et al.

(10) Patent No.: US 12,543,320 B2
(45) Date of Patent: Feb. 3, 2026

(54) SEMICONDUCTOR MEMORY DEVICE

(71) Applicant: Samsung Electronics Co., Ltd., Suwon-si (KR)

(72) Inventors: Byeongjoo Ku, Suwon-si (KR); Keunnam Kim, Suwon-si (KR); Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/101,606

(22) Filed: Jan. 26, 2023

(65) Prior Publication Data

US 2023/0380173 A1 Nov. 23, 2023

(30) Foreign Application Priority Data

May 23, 2022 (KR) .................. 10-2022-0063070

(51) Int. Cl.
*H10B 12/00* (2023.01)
*G11C 16/08* (2006.01)
(Continued)

(52) U.S. Cl.
CPC ............ *H10B 43/40* (2023.02); *G11C 16/08* (2013.01); *G11C 16/26* (2013.01);
(Continued)

(58) Field of Classification Search
CPC ....... H10B 12/30; H10B 12/50; H10B 12/315
See application file for complete search history.

(56) References Cited

U.S. PATENT DOCUMENTS 7,418,685 B2  8/2008  Watanabe et al.
8,455,925 B2  6/2013  Moritoki et al.
(Continued)

FOREIGN PATENT DOCUMENTS

CN   111448661 A   7/2020
CN   112928119 A   6/2021
(Continued)

OTHER PUBLICATIONS

Second Office Action dated May 27, 2024 for corresponding TW Patent Application No. 112116900.
(Continued)

*Primary Examiner* — Christopher A Johnson
(74) *Attorney, Agent, or Firm* — Muir Patent Law, PLLC

(57) ABSTRACT

A semiconductor memory device includes a semiconductor substrate, a peripheral circuit structure disposed on the semiconductor substrate, and a cell array structure located on the peripheral circuit structure and including a memory cell array including a plurality of memory cells, wherein each of the plurality of memory cells of the cell array structure includes a bit line extending in a first horizontal direction, a channel pattern including a horizontal channel portion on the bit line and a vertical channel portion vertically protruding from the horizontal channel portion, a first word line extending in a second horizontal direction crossing the first horizontal direction on the channel pattern, a first gate insulating pattern located between the channel pattern and the first word line, a landing pad connected to the vertical channel portion of the channel pattern, and a data storage pattern disposed on the landing pad.

19 Claims, 62 Drawing Sheets

(51) Int. Cl.
  *G11C 16/26*   (2006.01)
  *H01L 23/528*  (2006.01)
  *H10B 41/10*   (2023.01)
  *H10B 41/27*   (2023.01)
  *H10B 41/40*   (2023.01)
  *H10B 43/10*   (2023.01)
  *H10B 43/27*   (2023.01)
  *H10B 43/40*   (2023.01)

(52) U.S. Cl.
  CPC ......... *H01L 23/5283* (2013.01); *H10B 41/10* (2023.02); *H10B 41/27* (2023.02); *H10B 41/40* (2023.02); *H10B 43/10* (2023.02); *H10B 43/27* (2023.02)

(56) References Cited

U.S. PATENT DOCUMENTS

| | | | |
|---|---|---|---|
| 8,637,364 | B2 | 1/2014 | Ueda |
| 8,809,927 | B2 | 8/2014 | Takemura |
| 9,318,374 | B2 | 4/2016 | Atsumi et al. |
| 9,548,085 | B2 | 1/2017 | Saitoh |
| 10,720,444 | B2 | 7/2020 | Nishikawa et al. |
| 11,127,744 | B2 | 9/2021 | Servalli et al. |
| 11,183,594 | B2 | 11/2021 | Sharma et al. |
| 11,302,626 | B2 | 4/2022 | Lee |
| 11,482,277 | B2 | 10/2022 | Kim et al. |
| 11,696,434 | B2 | 7/2023 | Lee et al. |
| 11,729,974 | B2 | 8/2023 | Lee et al. |
| 11,950,423 | B2 | 4/2024 | Lee et al. |
| 2004/0201043 | A1 | 10/2004 | Mao et al. |
| 2020/0020386 | A1* | 1/2020 | Yu .......... H10D 89/10 |
| 2022/0102352 | A1 | 3/2022 | Lee et al. |
| 2023/0164977 | A1* | 5/2023 | Sung ........ H10B 12/03 257/295 |

FOREIGN PATENT DOCUMENTS

| | | | |
|---|---|---|---|
| CN | 114284269 | A | 4/2022 |
| CN | 114446344 | A | 5/2022 |
| KR | 1020220043981 | A | 4/2022 |
| TW | 200421539 | A | 10/2004 |
| TW | 200518278 | A | 6/2005 |
| TW | 202137494 | A | 10/2021 |
| TW | 202209634 | A | 3/2022 |
| TW | 202213743 | A | 4/2022 |
| TW | 202219954 | A | 5/2022 |

OTHER PUBLICATIONS

Office Action dated Feb. 19, 2024 for corresponding TW Patent Application No. 112116900.

* cited by examiner

SEMICONDUCTOR MEMORY DEVICE

CROSS-REFERENCE TO RELATED APPLICATION

This application is based on and claims priority under 35 U.S.C. § 119 to Korean Patent Application No. 10-2022-0063070, filed on May 23, 2022, in the Korean Intellectual Property Office, the disclosure of which is incorporated by reference herein in its entirety.

BACKGROUND

The inventive concept relates to a semiconductor memory device, and more particularly, to a semiconductor memory device including vertical channel transistors.

As design rules for semiconductor devices decrease, manufacturing technology has been developed toward improving the degree of integration of semiconductor devices and improving an operation speed and yield. Therefore, a transistor having a vertical channel has been proposed in order to increase the degree of integration, resistance, and current driving capability of the transistor.

SUMMARY

The inventive concept provides a semiconductor memory device having improved electrical characteristics and high integration density.

According to an aspect of the inventive concept, there is provided a semiconductor memory device.

The semiconductor memory device includes a semiconductor substrate, a peripheral circuit structure disposed on the semiconductor substrate, and a cell array structure located on the peripheral circuit structure and including a memory cell array including a plurality of memory cells, wherein the peripheral circuit structure includes a first transistor integrated on an upper surface of the semiconductor substrate and a connection wiring structure located on the first transistor and including a first connection wiring and a first connection contact plug electrically connecting the first connection wiring to the first transistor, wherein each of the plurality of memory cells of the cell array structure includes a bit line extending in a first horizontal direction and electrically connected to the first connection wiring, a channel pattern including a horizontal channel portion on the bit line and a vertical channel portion vertically protruding from the horizontal channel portion, a first word line extending in a second horizontal direction crossing the first horizontal direction on the channel pattern, a first gate insulating pattern located between the channel pattern and the first word line, a landing pad connected to the vertical channel portion of the channel pattern, and a data storage pattern disposed on the landing pad, wherein the first connection wiring and the first connection contact plug electrically connecting the bit line to the first transistor overlap the plurality of memory cells in a vertical direction.

According to another aspect of the inventive concept, there is provided a semiconductor memory device including a semiconductor substrate, a peripheral circuit structure including a sense amplifier region disposed on the semiconductor substrate, in which a sense amplifier is located, a sub-word line driver region in which a sub-word line driver is located, and a coupling region in which a driving circuit driver and a switch for driving the sub-word line driver or the sense amplifier are located, and a cell array structure located on the peripheral circuit structure and including a memory cell array including a plurality of memory cells each including a selection device and a data storage device, wherein the selection device is a vertical channel transistor, wherein at least a portion of at least one of the sense amplifier region, the sub-word line driver region, and the coupling region overlaps the plurality of memory cells in a vertical direction, and wherein an electrical path of the plurality of memory cells and the sense amplifier overlaps the plurality of memory cells in the vertical direction.

According to another aspect of the inventive concept, there is provided a semiconductor memory device including a semiconductor substrate, a peripheral circuit structure including a sense amplifier region disposed on the semiconductor substrate, in which a sense amplifier is located, a sub-word line driver region in which a sub-word line driver is located, and a coupling region in which a driving circuit driver and a switch for driving the sub-word line driver or the sense amplifier are located, and a cell array structure disposed on the peripheral circuit structure and including a memory cell array constituted by a plurality of memory cells, wherein the peripheral circuit structure includes a first transistor integrated on an upper surface of the semiconductor substrate and constituting the sense amplifier and a second transistor constituting the sub-word line driver, a peripheral contact plug electrically connected to each of the first transistor and the second transistor, a peripheral circuit wiring electrically connected to the peripheral contact plug, and a connection wiring structure disposed on the peripheral circuit wiring and including a first connection wiring and a first connection contact plug electrically connecting the first connection wiring to the peripheral circuit wiring, wherein each of the plurality of memory cells of the cell array structure includes a bit line extending in a first horizontal direction and electrically connected to the connection wiring, a channel pattern including a horizontal channel portion on the bit line and a vertical channel portion vertically protruding from the horizontal channel portion, a first word line extending in a second horizontal direction intersecting the first horizontal direction on the channel pattern, a first gate insulating pattern located between the channel pattern and the first word line, a landing pad electrically connected to the vertical channel portion of the channel pattern, and a data storage pattern disposed on the landing pad, wherein at least a portion of the sense amplifier region overlaps the plurality of memory cells in a vertical direction, and the first connection wiring, the first connection contact plug, the peripheral circuit wiring, and the peripheral contact plug electrically connecting the bit line to the first transistor vertically overlap the plurality of memory cells.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
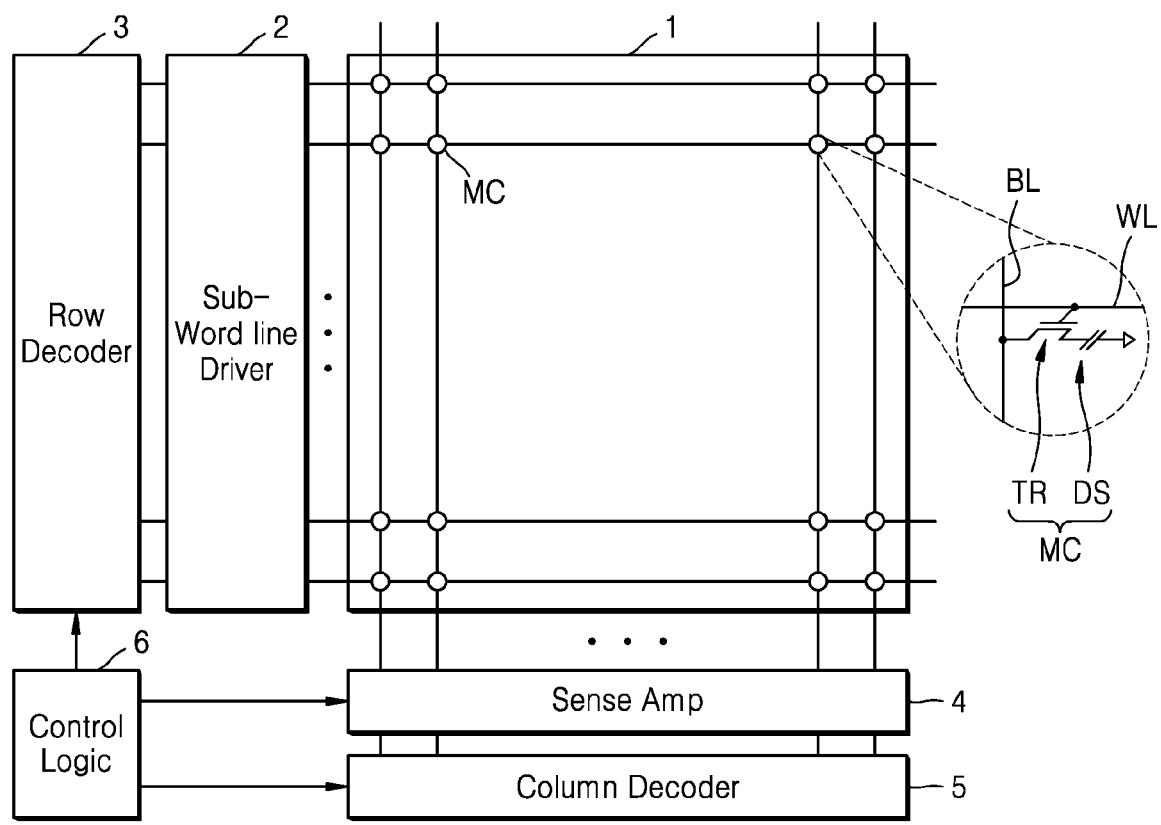
FIG. 1 is a block diagram of a semiconductor memory device according to embodiments.

FIG. 1 is a block diagram of a semiconductor memory device according to embodiments.

Referring to FIG. 1, the semiconductor memory device may include a memory cell array 1, a sub-word line driver 2, a row decoder 3, a sense amplifier 4, a column decoder 5, and a control logic 6.

The memory cell array 1 may include a plurality of memory cells MC arranged two-dimensionally or three-dimensionally. Each of the memory cells MC may be connected between a word line WL and a bit line BL that cross each other. For example, each memory cell MC may be disposed between a word line WL and a bit line BL, and may be electrically connected to the word line WL and the bit line BL.

Each of the memory cells MC includes a selection device TR and a data storage device DS, and the selection device TR may be electrically connected to the data storage device DS in series. The selection device TR may be electrically connected between/to the data storage device DS and the word line WL, and the data storage device DS may be electrically connected to the bit line BL through the selection device TR. The selection device TR may be a field effect transistor (FET), and the data storage device DS may be implemented as a capacitor, a magnetic tunnel junction pattern, or a variable resistor. For example, the selection device TR may include or may be a transistor, a gate electrode of the transistor may be electrically connected to the word line WL, and drain/source terminals of the transistor may be electrically connected to the bit line BL and the data storage device DS.

As used herein, components described as being "electrically connected" are configured such that an electrical signal can be transferred from one component to the other (although such electrical signal may be attenuated in strength as it transferred and may be selectively transferred).

The row decoder 3 may select any one of the word lines WL of the memory cell array 1 by decoding an externally input address. The address decoded by the row decoder 3 may be provided to the sub-word line driver 2, and the sub-word line driver 2 may provide a certain voltage to each of the selected word line WL and unselected word lines WL, in response to the control of the control circuits.

The sense amplifier 4 may sense, amplify, and output a voltage difference between a selected bit line BL and a reference bit line according to a decoded address from the column decoder 5.

The column decoder 5 may provide a data transmission path between the sense amplifier 4 and an external device (e.g., a memory controller). The column decoder 5 may select any one of the bit lines BL by decoding an externally input address.

The control logic 6 may generate control signals for controlling operations of writing or reading data to or from the memory cell array 1.

Figure 2:
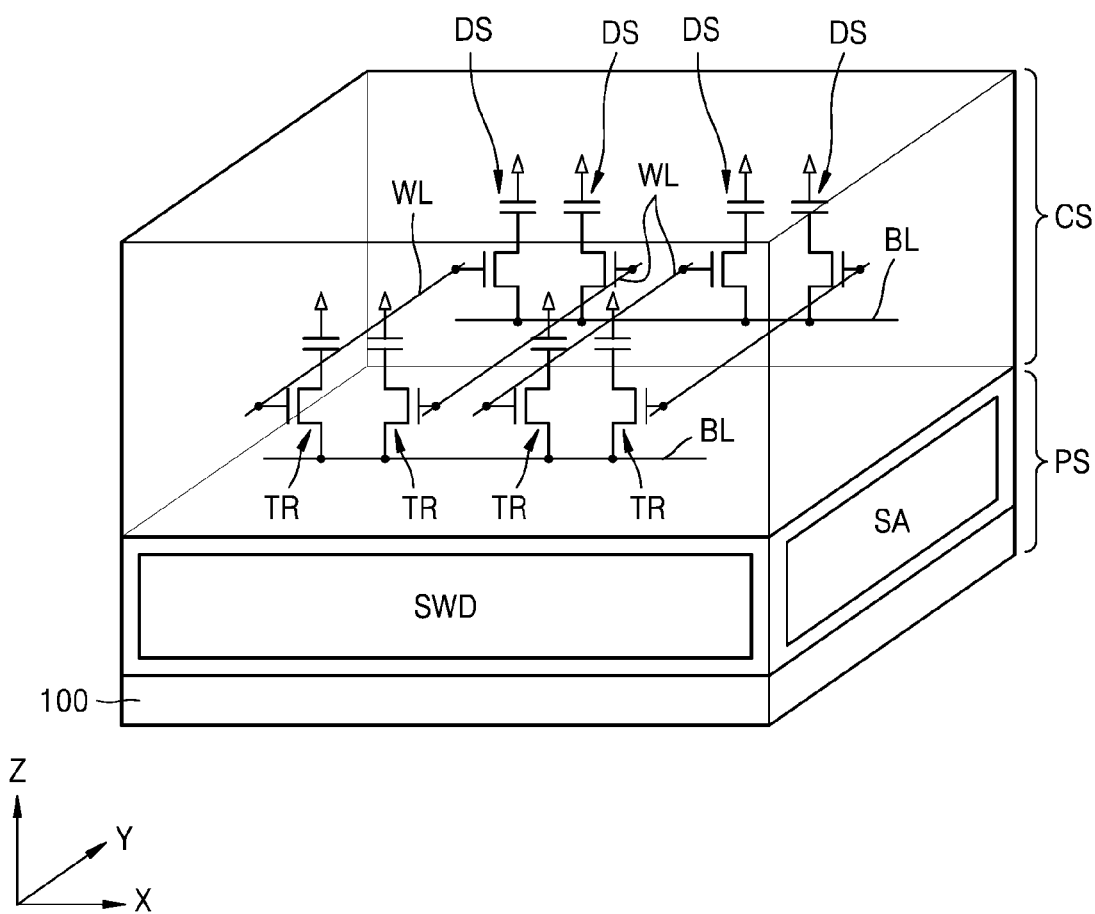
FIG. 2 is a perspective view schematically illustrating a semiconductor memory device according to embodiments.

FIG. 2 is a perspective view schematically illustrating a semiconductor memory device according to embodiments.

Referring to FIG. 2, the semiconductor memory device may include a peripheral circuit structure PS on a semiconductor substrate 100 and a cell array structure CS on the peripheral circuit structure PS.

The peripheral circuit structure PS may include a core and peripheral circuits formed on the semiconductor substrate 100. The core and peripheral circuits may include the sub-word line driver 2, the row decoder 3, the sense amplifier 4, the column decoder 5, and the control logic 6 described above with reference to FIG. 1. For example, the peripheral circuit structure PS may include a sub-word line driver region SWD, in which the sub-word line driver (2 of FIG. 1) is disposed, and a sense amplifier region SA, in which the sense amplifier (4 of FIG. 1) is disposed. The peripheral circuit structure PS may be provided between the semiconductor substrate 100 and the cell array structure CS in a vertical direction (a Z direction) perpendicular to the upper surface of the semiconductor substrate 100.

The cell array structure CS may include bit lines BL, word lines WL and memory cells (MCs of FIG. 1) therebetween. The memory cells (MC of FIG. 1) may be arranged two-dimensionally or three-dimensionally on a plane extending in a first horizontal direction (an X direction) and a second horizontal direction (a Y direction) that intersect each other, to configure the memory cell array (1 of FIG. 1). The bit lines BL may extend in the first horizontal direction (the X direction), and the word lines WL may extend in the second horizontal direction (the Y direction). Each of the memory cells (MC of FIG. 1) may include a selection device TR and a data storage device DS.

In some embodiments, at least a portion of at least one of the sub-word line driver region SWD and the sense amplifier region SA may be located in the peripheral circuit structure PS to overlap the memory cell array (1 of FIG. 1) in the vertical direction (the Z direction). In some embodiments, at a portion in which the sub-word line driver region SWD and the sense amplifier region SA intersect each other, at least a portion of a coupling region (C/J in FIGS. 3A to 3I), in which a driving circuit driver for driving the sub-word line driver (2 of FIG. 1) or the sense amplifier (4 of FIG. 1) and a switch are arranged, may be disposed in the peripheral circuit structure PS to overlap the memory cell array (1 of FIG. 1) in the vertical direction (the Z direction). For example, at least some of the sub-word line driver (2 of FIG. 1), the sense amplifier (4 of FIG. 1), a driving circuit driver for driving the sense amplifier (4 of FIG. 1), and a switch may be disposed in the peripheral circuit structure PS to overlap the memory cell array (1 of FIG. 1) in the vertical direction (the Z direction).

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

In some embodiments, a vertical channel transistor (VCT) may be included as the selection device TR of each memory cell (MC of FIG. 1). The vertical channel transistor may be a structure in which a channel length extends in the vertical direction (the Z direction). In some embodiments, the data storage device DS of each memory cell (MC of FIG. 1) may be a capacitor.

FIGS. 3A to 3I are planar layouts schematically illustrating a semiconductor memory device according to embodiments.

Referring to FIGS. 3A to 3I together, the semiconductor memory device may include a memory cell array CELL ARRAY, a sub-word line driver region SWD, a sense amplifier region SA, and a coupling region C/J.

The memory cell array CELL ARRAY may be the memory cell array 1 shown in FIG. 1, and may be located in the cell array structure CS shown in FIG. 2. The memory cell array CELL ARRAY may include the memory cells (MC of FIG. 1) electrically connected between the word lines (WL of FIG. 1) and the bit lines (BL of FIG. 1) crossing each other and arranged two-dimensionally or three-dimensionally. The bit lines (BL of FIG. 1) may extend in the first horizontal direction (the X direction), and the word lines (WL of FIG. 1) may extend in the second horizontal direction (the Y direction).

The sub-word line driver 2 shown in FIG. 1 may be located in the sub-word line driver region SWD, and the sub-word line driver region SWD may be located in the peripheral circuit structure PS shown in FIG. 1. The sense amplifier 4 shown in FIG. 1 may be located in the sense amplifier region SA, and the sense amplifier region SA may be located in the peripheral circuit structure PS shown in FIG. 2.

A driving circuit driver for driving the sub-word line driver (2 of FIG. 1) or the sense amplifier (4 of FIG. 1) and a switch are located in the coupling region C/J, and the coupling region C/J may be located in the peripheral circuit structure PS shown in FIG. 2. The coupling region C/J may be located between the sub-word line driver region SWD and the sense amplifier region SA. For example, the coupling region C/J may be located at an intersection of the sub-word line driver region SWD and the sense amplifier region SA.

At least a portion of at least one of the sub-word line driver region SWD, the sense amplifier region SA, and the coupling region C/J may overlap the memory cell array CELL ARRAY in a vertical direction (the Z direction). At least one of the sub-word line driver region SWD, the sense amplifier region SA, and the coupling region C/J may be electrically connected to the memory cell array CELL ARRAY through a portion overlapping the memory cell array CELL ARRAY in the vertical direction (the Z direction), which is described in detail below with reference to FIGS. 4A to 19B. Electrically connecting the sub-word line driver region SWD, the sense amplifier region SA, or the coupling region C/J to the memory cell array CELL ARRAY refers to electrically connecting the sub-word line driver (2 of FIG. 1) located in the sub-word line driver region SWD, the sense amplifier (4 of FIG. 1) located in the sense amplifier region SA, or the driving circuit driver located in the coupling region C/J and driving the sub-word line driver (2 of FIG. 1) or the sense amplifier (4 of FIG. 1) and the switch to the memory cell array CELL ARRAY.

Referring to FIGS. 3A to 3H together, in a top view, the sense amplifier region SA may be located on the first horizontal direction (the X direction) side of the memory cell array CELL ARRAY, and the sub-word line driver region SWD may be located on the second horizontal direction (the Y direction) side of the memory cell array CELL ARRAY. The coupling region C/J may be located between the sub-word line driver region SWD and the sense amplifier region SA. For example, the coupling region C/J may be located to be adjacent to one edge of the memory cell array CELL ARRAY between the sub-word line driver region SWD and the sense amplifier region SA.

Figure 3A:
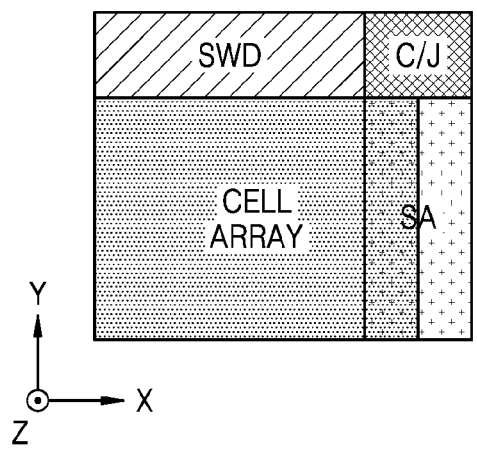
FIGS. 3A to 3I are planar layouts schematically illustrating a semiconductor memory device according to embodiments.

Referring to FIG. 3A, at least a portion of the sense amplifier region SA may overlap the memory cell array CELL ARRAY in the vertical direction (the Z direction), and the sub-word line driver region SWD and the coupling region C/J may not overlap the memory cell array CELL ARRAY in the vertical direction (the Z direction).

The sense amplifier region SA may be electrically connected to the memory cell array CELL ARRAY through a portion overlapping the memory cell array CELL ARRAY in the vertical direction (the Z direction). In some embodiments, the sub-word line driver region SWD may be electrically connected to the memory cell array CELL ARRAY through a portion that does not overlap the memory cell array CELL ARRAY in the vertical direction (the Z direction), for example, a portion of the cell array structure (CS of FIG. 2) located above the sub-word line driver region SWD.

Figure 3B:
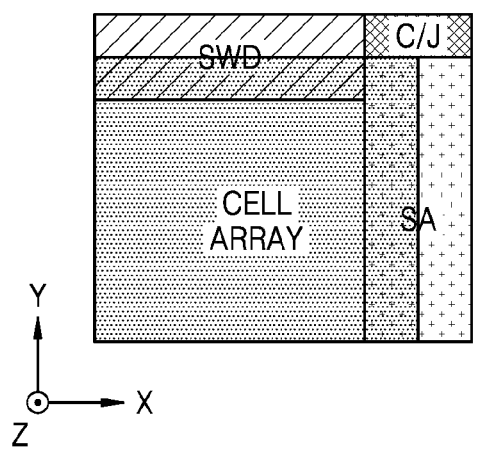

Referring to FIG. 3B, at least a portion of the sense amplifier region SA and at least a portion of the sub-word line driver region SWD may overlap the memory cell array CELL ARRAY in the vertical direction (the Z direction), and the coupling region C/J may not overlap the memory cell array CELL ARRAY in the vertical direction (the Z direction).

The sense amplifier region SA and the sub-word line driver region SWD may be electrically connected to the memory cell array CELL ARRAY through a portion overlapping the memory cell array CELL ARRAY in the vertical direction (the Z direction).

Figure 3C:
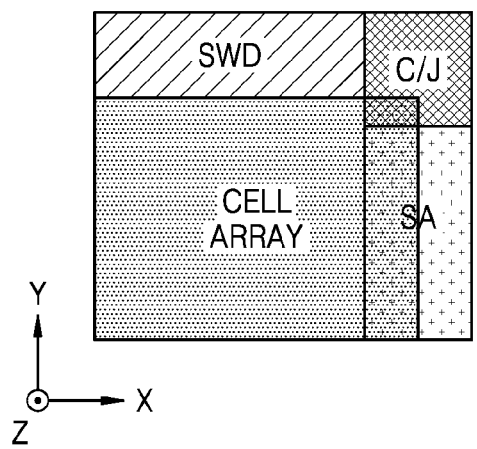

Referring to FIG. 3C, at least a portion of the sense amplifier region SA and at least a portion of the coupling region C/J may overlap the memory cell array CELL ARRAY in the vertical direction (the Z direction), and the sub-word line driver region SWD may not overlap the memory cell array CELL ARRAY in the vertical direction (the Z direction).

The sense amplifier region SA may be electrically connected to the memory cell array CELL ARRAY through a portion overlapping the memory cell array CELL ARRAY in the vertical direction (the Z direction). In some embodiments, the sub-word line driver region SWD may be electrically connected to the memory cell array CELL ARRAY through a portion that does not overlap the memory cell array CELL ARRAY in the vertical direction (the Z direction), for example, a portion of the cell array structure (CS of FIG. 2) located above the sub-word line driver region SWD.

The coupling region C/J may be electrically connected to the memory cell array CELL ARRAY through a portion overlapping the memory cell array CELL ARRAY in the vertical direction (the Z direction), but the inventive concept is not limited thereto. In some embodiments, the coupling region C/J may be electrically connected to the memory cell array CELL ARRAY through the sense amplifier region SA and/or the sub-word line driver region SWD.

Figure 3D:
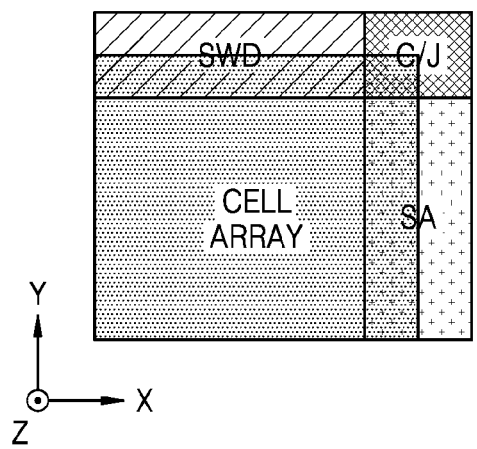

Referring to FIG. 3D, at least a portion of the sense amplifier region SA, at least a portion of the sub-word line driver region SWD, and at least a portion of the coupling region C/J may overlap the memory cell array CELL ARRAY in the vertical direction (the Z direction).

The sense amplifier region SA and the sub-word line driver region SWD may be electrically connected to the memory cell array CELL ARRAY through a portion overlapping the memory cell array CELL ARRAY in the vertical direction (the Z direction).

Figure 3E:
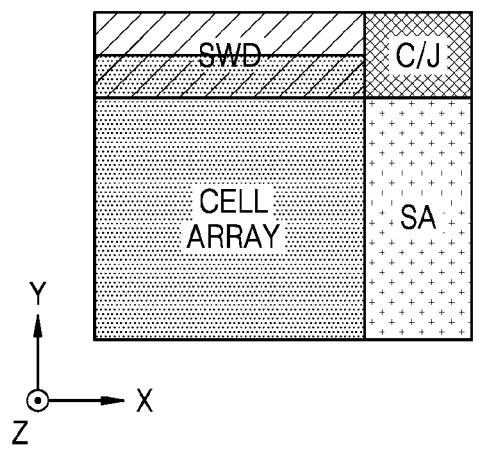

Referring to FIG. 3E, at least a portion of the sub-word line driver region SWD may overlap the memory cell array CELL ARRAY in the vertical direction (the Z direction), and the sense amplifier region SA and the coupling region C/J may not overlap the memory cell array CELL ARRAY in the vertical direction (the Z direction).

The sub-word line driver region SWD may be electrically connected to the memory cell array CELL ARRAY through a portion overlapping the memory cell array CELL ARRAY in the vertical direction (the Z direction). In some embodiments, the sense amplifier region SA may be electrically connected to the memory cell array CELL ARRAY through a portion that does not overlap the memory cell array CELL ARRAY in the vertical direction (the Z direction), for example, a portion of the cell array structure located above the sense amplifier region SA.

Figure 3F:
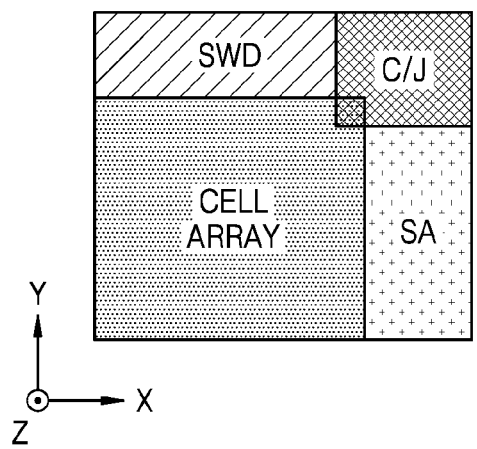

Referring to FIG. 3F, at least a portion of the coupling region C/J may overlap the memory cell array CELL ARRAY in the vertical direction (the Z direction), and the sense amplifier region SA and the sub-word line driver region SWD may not overlap the memory cell array CELL ARRAY in the vertical direction (the Z direction).

The coupling region C/J may be electrically connected to the memory cell array CELL ARRAY through a portion overlapping the memory cell array CELL ARRAY in the vertical direction (the Z direction). The sense amplifier region SA and the sub-word line driver region SWD may be electrically connected to the memory cell array CELL ARRAY through a portion that does not overlap the memory cell array CELL ARRAY in the vertical direction (the Z direction), for example, a portion of the cell array structure (CS of FIG. 2) located above the sub-word line driver region SWD.

Figure 3G:
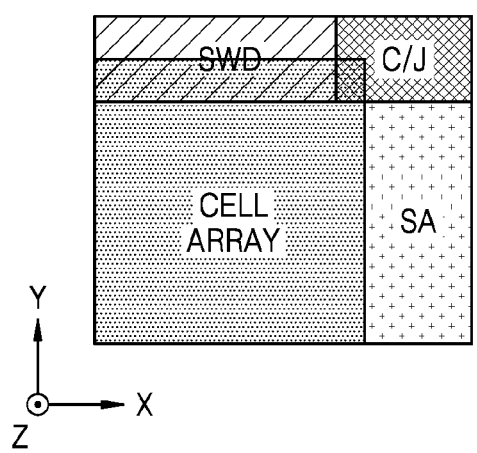

Referring to FIG. 3G, at least a portion of the sub-word line driver region SWD and at least a portion of the coupling region C/J may overlap the memory cell array CELL ARRAY in the vertical direction (the Z direction), and the sense amplifier region SA may not overlap the memory cell array CELL ARRAY in the vertical direction (the Z direction).

The sub-word line driver region SWD may be electrically connected to the memory cell array CELL ARRAY through a portion overlapping the memory cell array CELL ARRAY in the vertical direction (the Z direction). In some embodiments, the sense amplifier region SA may be electrically connected to the memory cell array CELL ARRAY through a portion that does not overlap the memory cell array CELL ARRAY in the vertical direction (the Z direction), for example, a portion of the cell array structure (CS of FIG. 2) located above the sub-word line driver region SWD.

The coupling region C/J may be electrically connected to the memory cell array CELL ARRAY through a portion overlapping the memory cell array CELL ARRAY in the vertical direction (the Z direction), but the inventive concept is not limited thereto. In some embodiments, the coupling region C/J may be electrically connected to the memory cell array CELL ARRAY through the sense amplifier region SA and/or the sub-word line driver region SWD.

Figure 3H:
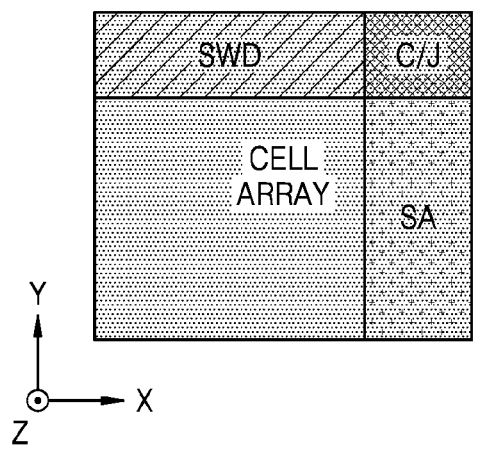

Referring to FIG. 3H, the sense amplifier region SA, the sub-word line driver region SWD, and the coupling region C/J may overlap the memory cell array CELL ARRAY in the vertical direction (the Z direction). For example, the sense amplifier region SA, the sub-word line driver region SWD, and the coupling region C/J may all overlap the memory cell array CELL ARRAY in the vertical direction (the Z direction). The sense amplifier region SA, the sub-word line driver region SWD, and the coupling region C/J may be electrically connected to the memory cell array CELL ARRAY through a portion overlapping the memory cell array CELL ARRAY in the vertical direction (the Z direction).

Figure 3I:
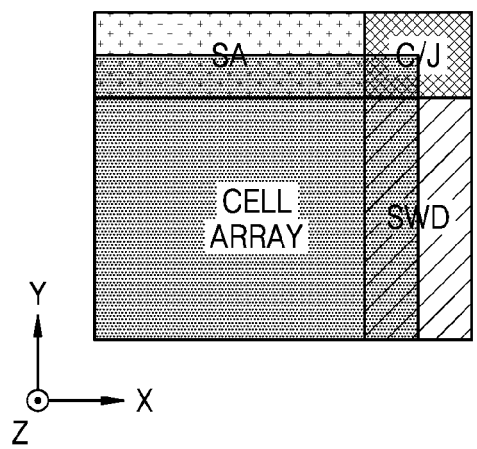

Referring to FIG. 3I, in a top-view, the sense amplifier region SA may be located on the second horizontal direction (the Y direction) side of the memory cell array CELL ARRAY, and the sub-word line driver region SWD may be located in the first horizontal direction (the X direction) side of the memory cell array CELL ARRAY. The coupling region C/J may be located between the sub-word line driver region SWD and the sense amplifier region SA. For example, the coupling region C/J may be located to be adjacent to one edge of the memory cell array CELL ARRAY between the sub-word line driver region SWD and the sense amplifier region SA.

FIG. 3I shows that at least a portion of the sense amplifier region SA, at least a portion of the sub-word line driver region SWD, and at least a portion of the coupling region C/J overlap the memory cell array CELL ARRAY in the vertical direction (the Z direction), but the overlap relations are not limited thereto, and an arrangement relationship between the memory cell array CELL ARRAY and the sub-word line driver region SWD, the sense amplifier region SA, and the coupling region C/J may be variously modified with reference to FIGS. 3A to 3H.

Referring back to FIGS. 3A to 3I, because at least a portion of the sub-word line driver region SWD, the sense amplifier region SA, and the coupling region C/J included in the semiconductor memory device is located to overlap the memory cell array CELL ARRAY in the vertical direction (the Z direction), an area that may be used by the sub-word line driver region SWD, the sense amplifier region SA, and the coupling region C/J may be increased in a top view. Accordingly, a line width, pitch, and area of components located in the sub-word line driver region SWD, the sense amplifier region SA, and the coupling region C/J, such as transistors, conductive lines, and contact plugs, may be relatively increased, or the components may be arranged freely, so that the design freedom of the components may be increased. For example, the design freedom of the components arranged in the sub-word line driver region SWD, the sense amplifier region SA, and the coupling region C/J may be increased by changing the arrangement of transistors constituting the sense amplifier (4 of FIG. 1) located in the sense amplifier region SA or increasing the number of components connected to one conductive line, etc.

Figure 4A:
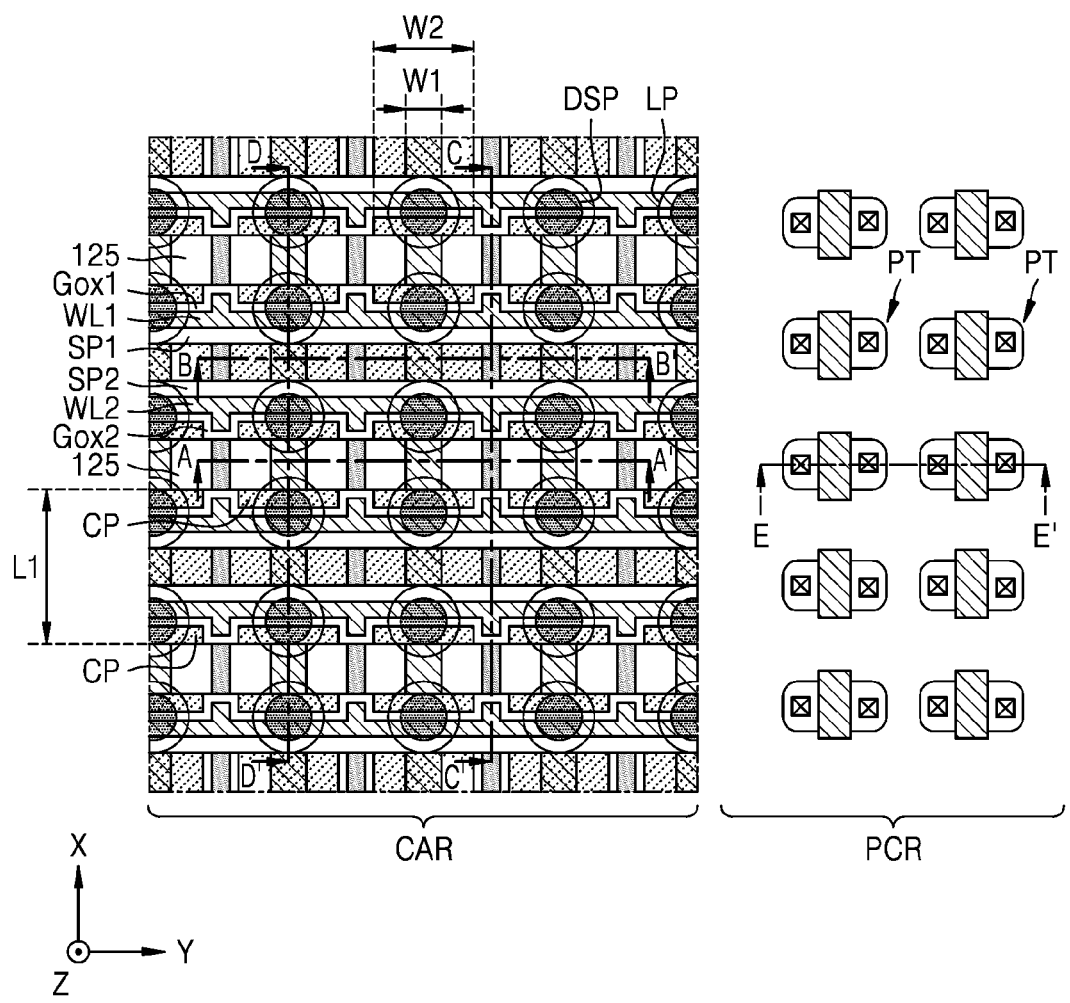
FIG. 4A is a plan view of a semiconductor memory device according to embodiments.
Figure 4B:
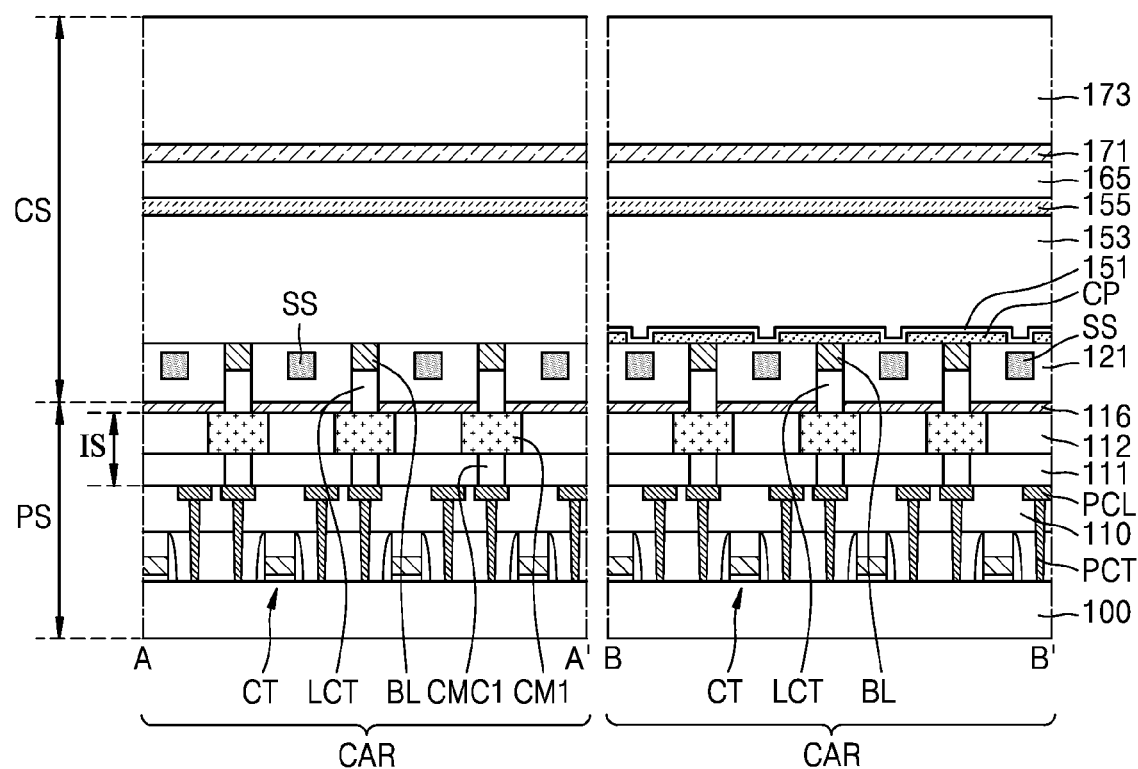
FIGS. 4B and 4C are cross-sectional views of a semiconductor memory device according to embodiments.
Figure 4C:
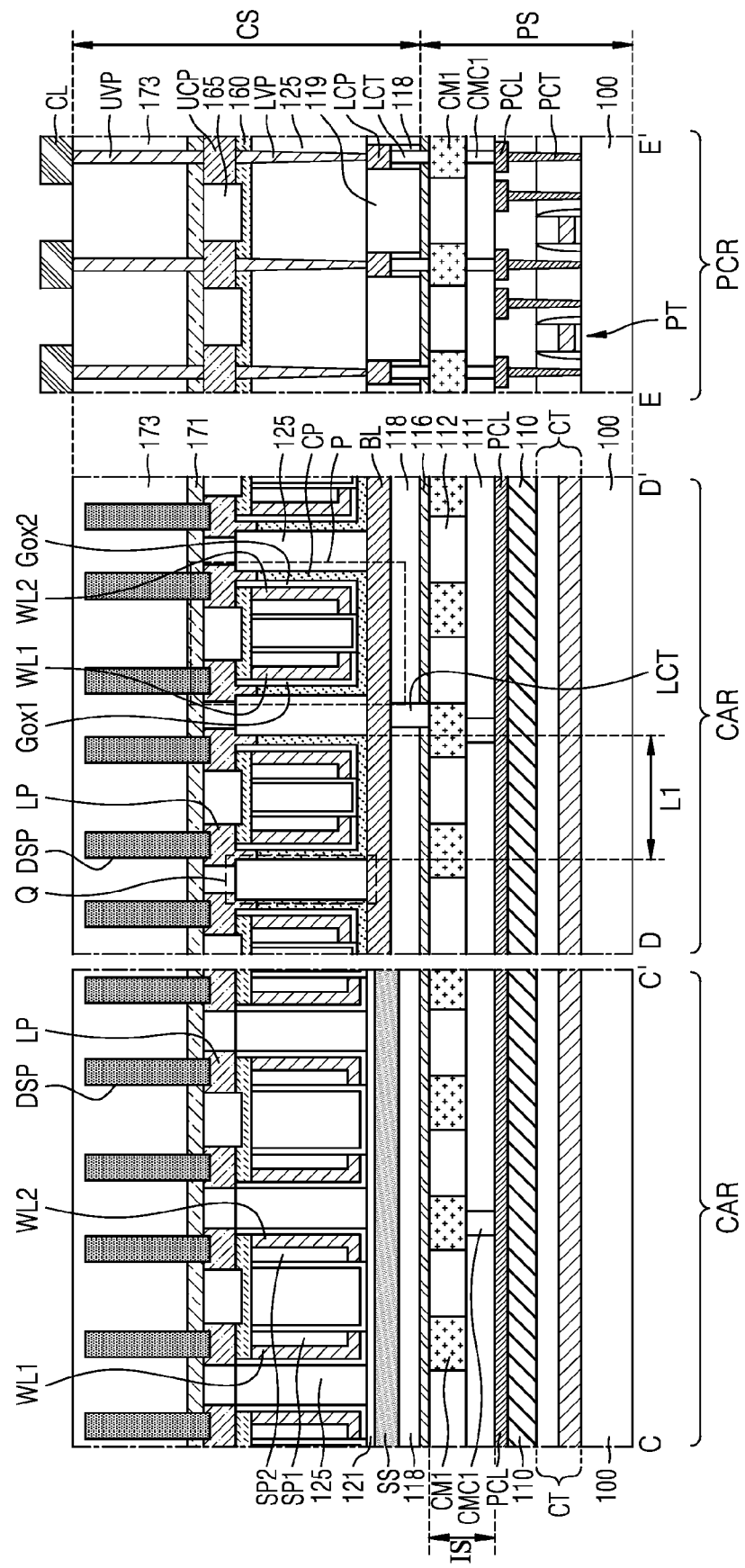

FIG. 4A is a plan view of a semiconductor memory device according to embodiments, and FIGS. 4B and 4C are cross-sectional views of a semiconductor memory device according to embodiments. Specifically, FIG. 4B shows cross-sections taken along lines A-A' and B-B' of FIG. 4A, and FIG. 4C shows cross-sections taken along lines C-C', D-D', and E-E' of FIG. 4A. FIGS. 5A to 5J are enlarged views of portion P of FIG. 4C, and FIGS. 6A to 6D are enlarged views of portion Q of FIG. 4C.

Referring to FIGS. 4A to 4C, the semiconductor memory device may include a peripheral circuit structure PS and a cell array structure CS. The peripheral circuit structure PS may include first circuit transistors CT and second circuit transistors PT integrated on the upper surface of the semiconductor substrate 100, peripheral circuit wirings PCL electrically connected to the first circuit transistors CT and the second circuit transistors PT, an insulating layer 110 covering the first circuit transistors CT and the second circuit transistors PT, and peripheral contact plugs PCT. For example, the semiconductor substrate 100 may be a single crystal silicon substrate. The semiconductor substrate 100 may include a cell array region CAR and a peripheral circuit region PCR.

In the peripheral circuit structure PS, the first circuit transistors CT may be arranged in the cell array region CAR of the semiconductor substrate 100, and second circuit transistors PT may be arranged in the peripheral circuit region PCR of the semiconductor substrate 100. The first circuit transistors CT may include or may be NMOS and PMOS transistors integrated on the semiconductor substrate 100, and the second circuit transistors PT may include or may be NMOS and PMOS transistors integrated on the semiconductor substrate 100. The first circuit transistors CT may overlap the memory cell array (1 of FIG. 1) in the vertical direction (the Z direction), and the second circuit transistors PT may not overlap the memory cell array (1 of FIG. 1) in the vertical direction (the Z direction).

The first circuit transistors CT and the second circuit transistors PT may constitute the sub-word line driver (2 of FIG. 1), the row decoder (3 of FIG. 1), the sense amplifier (4 of FIG. 1), the column decoder (5 of FIG. 1) and the control logic (6 of FIG. 1). In some embodiments, at least some of the sub-word line driver (2 of FIG. 1), the sense amplifier (4 of FIG. 1), and the driving circuit driver and the switch for driving the sub-word line driver (2 of FIG. 1) and the sense amplifier (4 of FIG. 1), among the sub-word line driver (2 of FIG. 2), the row decoder (3 of FIG. 1), the sense amplifier (4 of FIG. 1), the column decoder (5 of FIG. 1), and the control logic (6 of FIG. 1), may be constituted by the first circuit transistors CT and the others may be constituted by the second circuit transistors PT.

The first circuit transistors CT and the second circuit transistors PT may be electrically connected to the peripheral circuit contact plugs PCT and the peripheral circuit wirings PCL. The peripheral circuit insulating layer 110 may cover the first circuit transistors CT and the second circuit transistors PT, the peripheral circuit wirings PCL, and the peripheral circuit contact plugs PCT on the semiconductor substrate 100. The peripheral circuit insulating layer 110 may have a substantially flat upper surface. In some embodiments, upper surfaces of the peripheral circuit wirings PCL and the peripheral circuit insulating layer 110 may be coplanar with each other. The peripheral circuit insulating layer 110 may include or be formed of insulating layers stacked in and/or having multiple layers. For example, the peripheral circuit insulating layer 110 may include a silicon oxide layer, a silicon nitride layer, a silicon oxynitride layer, and/or a low-k dielectric layer.

Terms such as "same," "equal," "planar," "symmetry," or "coplanar," as used herein encompass identicality or near identicality including variations that may occur, for example, due to manufacturing processes. The term "substantially" may be used herein to emphasize this meaning, unless the context or other statements indicate otherwise.

A connection wiring structure IS may be disposed on the peripheral circuit insulating layer 110. The connection wiring structure IS may include a first wiring insulating layer 111, a second wiring insulating layer 112 stacked/formed on the first wiring insulating layer 111, first connection wirings CM1 passing through the second wiring insulating layer 112, and first connection contact plugs CMC1 passing through the first wiring insulating layer 111 to electrically connect the peripheral circuit wirings PCL to the first connection wirings CM1. Each of the first wiring insulating layer 111 and the second wiring insulating layer 112 may include or may be a silicon oxide layer, a silicon nitride layer, a silicon oxynitride layer, and/or a low-k dielectric layer. In some embodiments, the first wiring insulating layer 111 and the second wiring insulating layer 112 may be formed together to form an integral body.

The cell array structure CS may be provided on the connection wiring structure IS. In some embodiments, a cover insulating layer 116 may be located between the second wiring insulating layer 112 and the cell array structure CS. The cover insulating layer 116 may include nitride. For example, the cover insulating layer 116 may include or may be a silicon nitride layer and/or a silicon oxynitride layer.

The cell array structure CS may include bit lines BL, channel patterns CP, first word lines WL1, second word lines WL2, first gate insulating patterns Gox1, second gate insulating patterns Gox2, a gate insulating pattern Gox, and data storage patterns DSP. At least a portion of each of the channel patterns CP may constitute a selection device (TR of FIG. 1), and each of the selection device (TR of FIG. 1) formed by at least a portion of each of the channel patterns CP and each of the data storage patterns DSP may form a memory cell (MC of FIG. 1). The bit lines BL, the channel patterns CP, the first word lines WL1, the second word lines WL2, the first gate insulating patterns Gox1, the second gate insulating patterns Gox2, the gate insulating pattern Gox, and the data storage patterns DSP may constitute a memory cell array (1 of FIG. 1).

The bit lines BL may extend in the first horizontal direction (the X direction) on the peripheral circuit structure PS and may be apart from each other in the second horizontal direction (the Y direction). The bit lines BL may have a first width W1 in the second horizontal direction (the Y direction), and the first width W1 may be about 1 nm to about 50 nm. The bit lines BL may include or be formed of, for example, doped polysilicon, metal, conductive metal nitride, conductive metal silicide, conductive metal oxide, or a combination thereof. The bit lines BL may include or be formed of doped polysilicon, Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, $IrO_x$, $RuO_x$, or a combination thereof, but materials forming or included in the bit lines BL are not limited thereto. The bit lines BL may include or be formed of a single layer or plural layers of the aforementioned materials. In some embodiments, the bit lines BL may include or be formed of one or more of 2D and 3D materials (e.g., 2D/3D semiconductor materials), for example, graphene, which is a carbon-based 2D material, and carbon nanotube, which is a 3D material, or a combination thereof.

The bit lines BL may be respectively electrically connected to the first connection wirings CM1 through lower contact plugs LCT. In the peripheral circuit region PCR, the lower conductive patterns LCP may be at the same level as the bit lines BL. The lower conductive patterns LCP may be respectively electrically connected to the first connection wirings CM1 through the lower contact plugs LCT. The lower conductive patterns LCP may include or be formed of the same conductive material as that of the bit lines BL.

A lower insulating pattern 118 surrounding the lower contact plugs LCT may be located between the bit lines BL and the first connection wirings CM1 in the cell array region CAR. The lower contact plugs LCT may pass through the cover insulating layer 116 and the lower insulating pattern 118. A charging insulating pattern 119 may be located to cover the cover insulating layer 116 and fill a portion between the lower conductive patterns LCP in the peripheral circuit region PCR.

A first insulating pattern 121 may be located between the bit lines BL. The first insulating pattern 121 may include or may be, for example, a silicon oxide layer, a silicon nitride layer, a silicon oxynitride layer, and/or a low-k dielectric layer.

Shielding structures SS may be provided between the bit lines BL, respectively, and the shielding structures SS may extend to be parallel with each other in the first horizontal direction (the X direction). The shielding structures SS may include or be formed of a conductive material, such as metal. The shielding structures SS may be provided in the first insulating pattern 121, and upper surfaces of the shielding structures SS may be at a level lower than upper surfaces of the bit lines BL, and lower surfaces of the shielding structures SS may be at a level lower than lower surfaces of the bit lines BL.

In some embodiments, the shielding structures SS may include a conductive material and may include an air gap or a void therein. In other embodiments, air gaps may be defined in the first insulating pattern 121, instead of the shielding structures SS. For example, the air gap or the void may be in a vacuum state or may include a gas (e.g., a processing gas) or air.

A mold insulating pattern 125 may be disposed/formed on the first insulating pattern 121 and the bit lines BL. The mold insulating pattern 125 may define trenches (refer to T of FIG. 10A) extending in the second horizontal direction (the Y direction) across the bit lines BL and being apart from each other in the first horizontal direction (the X direction). The mold insulating pattern 125 may cover upper surfaces of the lower conductive patterns LCP in the peripheral circuit region PCR. The mold insulating pattern 125 may include or be formed of, for example, a silicon oxide layer, a silicon nitride layer, a silicon oxynitride layer, and/or a low-k dielectric layer.

Channel patterns CP may be located on bit lines BL. The channel patterns CP may be apart from each other in the first horizontal direction (the X direction) by the mold insulating pattern 125 on each bit line BL. For example, the mold insulating pattern 125 may be interposed between the channel patterns CP. The channel patterns CP may be apart from each other in the second horizontal direction (the Y direction) in each trench of the mold insulating pattern 125. For example, the channel patterns CP may be two-dimensionally arranged in the first horizontal direction (the X direction) and the second horizontal direction (the Y direction) intersecting each other. For example, the first and second horizontal directions may be perpendicular to each other.

Each of the channel patterns CP may have a first length L1 in the first horizontal direction (the X direction) and may have a second width W2 that is substantially equal to or greater than the first width W1 of the bit lines BL in the second horizontal direction (the Y direction). An interval between the channel patterns CP in the first horizontal direction (the X direction) may be different from the first length L1 of the channel pattern CP in the first horizontal direction (the X direction). In some embodiments, the interval between the channel patterns CP in the first horizontal direction (the X direction) may be less than the first length L1 of the channel pattern CP in the first horizontal direction (the X direction). In some embodiments, the interval between the channel patterns CP in the first horizontal direction (the X direction) may be substantially equal to the first length L1 of the channel pattern CP in the first horizontal direction (the X direction). In the second horizontal direction (the Y direction), an interval between the channel patterns CP may be substantially equal to or less than the second width W2 of the channel pattern CP.

Figure 5A:
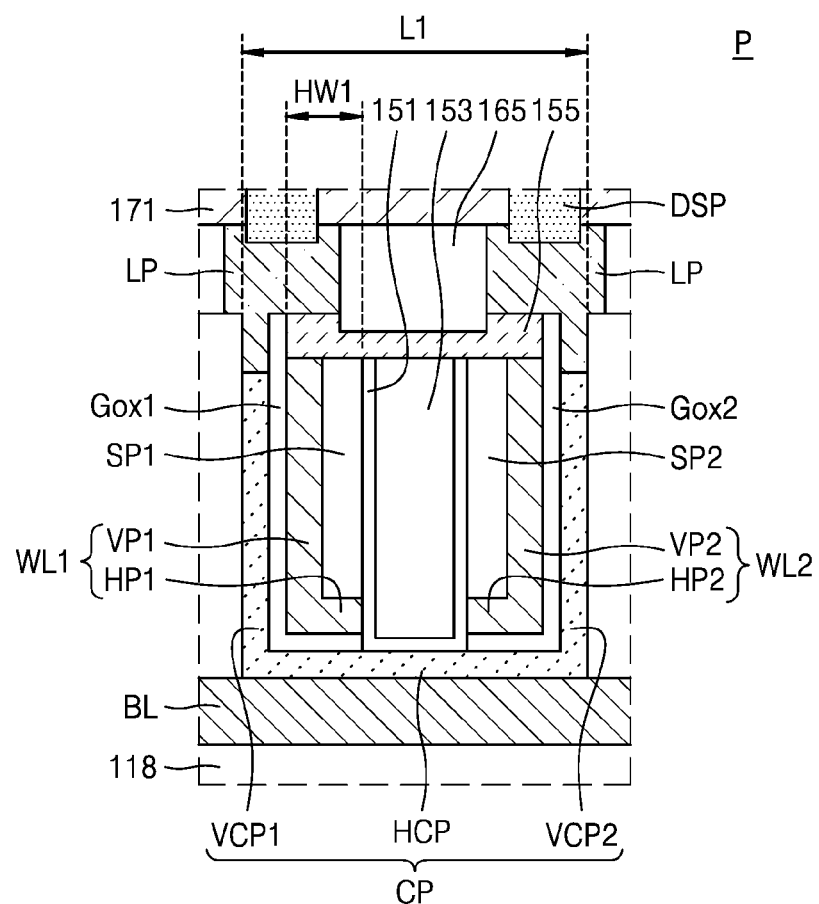
FIGS. 5A to 5J are enlarged views of portion P of FIG. 4C, and FIGS. 6A to 6D are enlarged views of portion Q of FIG. 4C.

Referring to FIGS. 4A to 4C together with FIG. 5A, each of the channel patterns may include a horizontal channel portion HCP located on the bit line BL and first vertical channel portions VCP1 and second vertical channel portions VCP2 protruding upward from the horizontal channel portion HCP (e.g., from opposite ends of the horizontal channel portion HCP) and facing each other in the horizontal direction (the X direction). Each of the first vertical channel portions VCP1 and the second vertical channel portions VCP2 may have an outer wall in contact with the mold insulating pattern 125 and an inner wall opposite the outer wall, and the inner walls of first vertical channel portions VCP1 and the second vertical channel portions VCP2 may face each other in the first horizontal direction (the X direction). The outer walls of the first vertical channel portions VCP1 and the second vertical channel portions VCP2 of the channel patterns CP adjacent to each other in the first horizontal direction (the X direction) may face each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the channel patterns CP may have a first length L1 in a first horizontal direction (the X direction). The first length L1 may be greater than the interval between the adjacent channel patterns CP in the first horizontal direction (the X direction).

Each of the first vertical channel portions VCP1 and the second vertical channel portions VCP2 may have a vertical length in the vertical direction (the Z direction) perpendicular to the upper surface of the semiconductor substrate 100 and may have a width in the first horizontal direction (the X direction). The vertical length of each of the first vertical channel portions VCP1 and the second vertical channel portions VCP2 may be about 2 to 10 times the width thereof, but the inventive concept is not limited thereto. The width of each of the first vertical channel portions VCP1 and the second vertical channel portions VCP2 in the first horizontal direction (the X direction) may be several nm to several tens of nm. For example, the widths of the first vertical channel portions VCP1 and the second vertical channel portions VCP2 may be about 1 nm to about 30 nm. In some embodiments, the widths of the first vertical channel portions VCP1 and the second vertical channel portions VCP2 may be about 1 nm to about 10 nm.

The horizontal channel portions HCP of the channel patterns CP may contact the upper surfaces of the bit lines BL. The thickness of the horizontal channel portions HCP on the upper surfaces of the bit lines BL may be substantially equal to the thickness of the first vertical channel portions VCP1 and the second vertical channel portions VCP2 on the sidewall of the mold insulating pattern 125.

In each of the channel patterns CP, the horizontal channel portion HCP may include a common source/drain region, an upper end of the first vertical channel portion VCP1 may include a first source/drain region, and an upper end of the second vertical channel portion VCP2 may include a second source/drain region. The first vertical channel portion VCP1 may include a first channel region between the first source/drain region and the common source/drain region, and the second vertical channel portion VCP2 may include a second channel region between the second source/drain region and the common source/drain region. The channel region of the first vertical channel portion VCP1 may be controlled by the first word line WL1, and the channel region of the second vertical channel portion VCP2 may be controlled by the second word line WL2.

A portion of the channel pattern CP may be located between the first word lines WL1 and the second word lines WL2. The horizontal channel portion HCP of the channel pattern CP may electrically and commonly connect the first vertical channel portions VCP1 and the second vertical channel portions VCP2 to the bit line BL corresponding thereto. For example, the semiconductor memory device may have a structure in which a pair of vertical channel transistors share one bit line BL.

In some embodiments, the channel patterns CP may include an oxide semiconductor. For example, the oxide semiconductor may be any one of zinc oxide (ZnO) (or $Zn_xO$), gallium oxide (GaO) (or $Ga_xO$), tin oxide (TiO) (or $Ti_xO$), zinc oxynitride (ZnON) (or $Zn_xO_yN$), indium zinc oxide (IZO) (or $In_xZn_yO$), gallium zinc oxide (GZO) (or $Ga_xZn_yO$), tin zinc oxide (TZO) (or $Sn_xZn_yO$), tin gallium oxide (TGO) (or $Sn_xGa_yO$), indium gallium zinc oxide (IGZO) (or $In_xGa_yZn_zO$), indium gallium silicon oxide (IGSO) (or $In_xGa_ySi_zO$), indium tin zinc oxide (ITZO) (or $In_xSn_yZn_zO$), indium tin gallium oxide (ITGO) (or $In_xSn_yGa_zO$), zirconium zinc tin oxide (ZZTO) (or $Zr_xZn_ySn_zO$), hafnium indium zinc oxide (HIZO) (or $Hf_xIn_yZn_zO$), gallium zinc tin oxide (GZTO) (or $Ga_xZn_ySn_zO$), aluminium zinc tin oxide (AZTO) (or $Al_xZn_ySn_zO$), and ytterbium gallium zinc oxide (YGZO) (or $Yb_xGa_yZn_zO$). In some embodiments, the channel patterns CP may include IGZO. The channel patterns CP may include or be formed of a single layer or plural layers of the oxide semiconductor. The channel patterns CP may include, but are not limited to, an amorphous, single-crystalline, polycrystalline, spinel, or c-axis aligned crystalline (CAAC) oxide semiconductor. In some embodiments, the channel patterns CP may include or be formed of a 2D semiconductor material, and the 2D semiconductor material may include or may be, for example, graphene, carbon nanotubes, or a combination thereof. In some embodiments, the channel patterns CP may have a bandgap energy greater than that of silicon. For example, the channel patterns CP may have a bandgap energy of about 1.5 eV to about 5.6 eV. In some embodiments, the channel patterns CP may have a bandgap energy of about 2.0 eV to about 4.0 eV.

The first word lines WL1 and the second word lines WL2 may extend across the bit lines BL on the channel patterns CP in the second horizontal direction (the Y direction). The first word lines WL1 and the second word lines WL2 may be alternately arranged in the first horizontal direction (the X direction). A pair of a first word line WL1 and a second word line WL2 may be symmetrically provided on the horizontal channel portion HCP of each channel pattern CP.

The first word lines WL1 and the second word lines WL2 may include, for example, doped polysilicon, metal, conductive metal nitride, conductive metal silicide, conductive metal oxide, or a combination thereof. The first word lines WL1 and the second word lines WL2 may include doped polysilicon, Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, $IrO_x$, $RuO_x$, or a combination thereof, but the inventive concepts are not limited thereto. The first word lines WL1 and the second word lines WL2 may include or be formed of a single layer or plural layers of the aforementioned materials. In some embodiments, the first word lines WL1 and the second word lines WL2 may include or be formed of a 2D semiconductor material, and the 2D semiconductor material may include or may be, for example, graphene or carbon nanotubes, or a combination thereof.

The first word line WL1 may include a first horizontal portion HP1 located on the horizontal channel portion HCP of the channel pattern CP and a first vertical portion VP1 vertically protruding from the first horizontal portion HP1. For example, the first horizontal portion HP1 of the first word line WL1 may extend lengthwise in a horizontal direction, and the first vertical portion VP1 may extend lengthwise in a vertical direction, e.g., in a cross-sectional view. The first vertical portion VP1 of the first word line WL1 may be adjacent to the inner wall of the first vertical channel portion VCP1 of the channel pattern CP. The second word line WL2 may include a second horizontal portion HP2 located on the horizontal channel portion HCP of the channel pattern CP and a second vertical portion VP2 vertically protruding from the second horizontal portion HP2. The second vertical portion VP2 of the second word line WL2 may be adjacent to the inner wall of the second vertical channel portion VCP2 of the channel pattern CP. The first word lines WL1 and the second word lines WL2 may have an L-shaped vertical cross-section and face each other. In the first horizontal direction (the X direction), the first word lines WL1 and the second word lines WL2 may be arranged mirror-symmetrically with each other.

A pair of a first word line WL1 and a second word line WL2 may be symmetrically arranged on the horizontal channel portion HCP of the channel pattern CP. The first horizontal portion HP1 of the first word line WL1 may have a first thickness on the upper surface of the horizontal channel portion HCP, and the first vertical portion VP1 of the first word line WL1 may have a second thickness, which is substantially equal to the first thickness, on a sidewall of the first vertical channel portion VCP1. The second horizontal portion HP2 of the second word line WL2 may have a first thickness on the upper surface of the horizontal channel portion HCP, and the second vertical portion VP2 of the second word line WL2 may have a second thickness, which is substantially equal to the first thickness, on a sidewall of the second vertical channel portion VCP2.

The first horizontal portions HP1 and the second horizontal portions HP2 of the first word lines WL1 and the second word lines WL2 may have a first horizontal width HW1 in the first horizontal direction (the X direction). Here, the first horizontal width HW1 may be less than half of the length L1 of the channel pattern CP in the first horizontal direction (the X direction).

A first spacer SP1 may be disposed on the first horizontal portion HP1 of the first word line WL1, and the second spacer SP2 may be disposed on the second horizontal portion HP2 of the second word line WL2. The first spacer SP1 may be aligned with a sidewall of the first horizontal portion HP1 of the first word line WL1, and the second spacer SP2 may be aligned with a sidewall of the second horizontal portion HP2 of the second word line WL2.

A first capping pattern 151 and a second insulating pattern 153 may be located between a pair of first and second spacers SP1 and SP2. The first capping pattern 151 may be located between sidewalls of the first spacer SP1 and the second spacer SP2 and the second insulating pattern 153 and between the upper surface of the horizontal channel portion HCP of the channel pattern CP and the second insulating pattern 153. The first capping pattern 151 may have a substantially uniform thickness and may include or be formed of an insulating material, different from that of the second insulating pattern 153. The first capping pattern 151 and the second insulating pattern 153 may extend in the second horizontal direction (the Y direction).

A second capping pattern 155 may be provided on upper surfaces of the first vertical portions VP1 of the first word lines WL1 and the second vertical portions VP2 of the second word lines WL2. The second capping pattern 155 may cover/contact upper surfaces of the first capping pattern 151 and the second insulating pattern 153. The second capping pattern 155 may extend in the second horizontal direction (the Y direction). The upper surface of the second capping pattern 155 may be substantially coplanar with the upper surface of the mold insulating pattern 125. The second capping pattern 155 may include or be formed of an insulating material, different from that of the second insulating pattern 153.

The first gate insulating pattern Gox1 may be located between the first word line WL1 and the channel pattern CP, and the second gate insulating pattern Gox2 may be located between the second word line WL2 and the channel pattern CP. The first gate insulating patterns Gox1 and the second gate insulating patterns Gox2 may extend in the second horizontal direction (the Y direction) to be parallel to the first word lines WL1 and the second word lines WL2. The first gate insulating patterns Gox1 and the second gate insulating patterns Gox2 may cover/contact the surface of the channel patterns CP with a uniform thickness. Between the channel patterns CP adjacent in the first horizontal direction (the X direction), the first gate insulating patterns Gox1 and the second gate insulating patterns Gox2 may be in contact with the upper surface of the first insulating pattern 121 and the sidewalls of the mold insulating pattern 125.

Each of the first gate insulating patterns Gox1 and the second gate insulating patterns Gox2 may substantially have an L-shape to correspond to the first word lines WL1 and the second word lines WL2. For example, similarly to the first word lines WL1 and the second word lines WL2, each of the first gate insulating patterns Gox1 and the second gate insulating patterns Gox2 may include a horizontal portion covering/contacting the horizontal channel portion HCP and a vertical portion covering/contacting the first vertical channel portions VCP1 and the second vertical channel portions VCP2. Also, the first gate insulating pattern Gox1 may be located mirror-symmetrically with the second gate insulating pattern Gox2 in the first horizontal direction (the X direction). One sidewall of the first gate insulating pattern Gox1 may be aligned with the first spacer SP1, and one sidewall of the second gate insulating pattern Gox2 may be aligned with the second spacer SP2.

The first gate insulating patterns Gox1 and the second gate insulating patterns Gox2 may include or be formed of a silicon oxide layer, a silicon oxynitride layer, a high-k layer having a higher dielectric constant than that of the silicon oxide layer, or a combination thereof. The high-k layer may include or be formed of a metal oxide or a metal oxynitride.

Landing pads LP may be disposed on the first vertical channel portions VCP1 and the second vertical channel portions VCP2 of the channel pattern CP. The landing pads LP may contact the first vertical channel portions VCP1 and the second vertical channel portions VCP2. As shown in FIG. 5A, portions of the landing pads LP may be located between the sidewall of the mold insulating pattern 125 and the sidewalls of the first gate insulating patterns Gox1 and the second gate insulating patterns Gox2. The landing pads LP may have various shapes, such as a circular shape, an oval shape, a rectangular shape, a square shape, a rhombus shape, and a hexagon shape, in a plan view. The landing pads LP may include or be formed of doped polysilicon, Al, Cu, Ti, Ta, Ru, W, Mo, Pt, Ni, Co, TIN, TaN, WN, NON, TiAl, TiAlN, TiSi, TiSiN, TaSi, TaSiN, RuTiN, NiSi, CoSi, IrO$_x$, RuO$_x$, or a combination thereof, but the inventive concepts are not limited thereto. Portions between the landing pads LP may be filled with a third insulating pattern. The landing pads LP may be separated from each other by the third insulating pattern 165.

The data storage patterns DSP may be respectively disposed on the landing pads LP. The data storage patterns DSP may be electrically connected to the first vertical channel portions VCP1 and the second vertical channel portions VCP2 of the channel patterns CP through the landing pads LP, respectively. The data storage patterns DSP may be arranged in a matrix form in each of the first horizontal direction (the X direction) and the second horizontal direction (the Y direction) as illustrated in FIG. 4A.

In some embodiments, the data storage patterns DSP may be capacitors, and may include lower electrodes, upper electrodes, and a capacitor dielectric layer located therebetween. The lower electrode may contact the landing pad LP, and the lower electrode may have various shapes, such as a circular shape, an oval shape, a rectangular shape, a square shape, a rhombus shape, and a hexagon shape, in a plan view.

In other embodiments, the data storage patterns DSP may be variable resistance patterns that may be switched to two resistance states by an electrical pulse applied to a memory element. For example, the data storage patterns DSP may include a phase-change materials, perovskite compounds, a transition metal oxide, a magnetic material, a ferromagnetic material, or an antiferromagnetic material changed in crystal state according to an amount of current.

Upper conductive patterns UCP may be disposed on the mold insulating pattern 125 of the peripheral circuit region PCR. The upper conductive patterns UCP may include or be formed of the same conductive material as that of the landing pads LP. The upper conductive patterns UCP may be respectively electrically connected to the lower conductive patterns LCP through the lower conductive vias LVP.

An etch stop layer 171 may cover/contact upper surfaces of the landing pads LP and the upper conductive patterns UCP. A capping insulating layer 173 may be disposed on the etch stop layer 171. The capping insulating layer 173 may cover/contact the data storage patterns DSP of the cell array region CAR. The connection wirings CL may be provided on the capping insulating layer 173 in the peripheral circuit region PCR. The connection wirings CL may be respectively electrically connected to the upper conductive patterns UCP through the upper conductive vias UVP passing through the capping insulating layer 173.

Figure 5B:
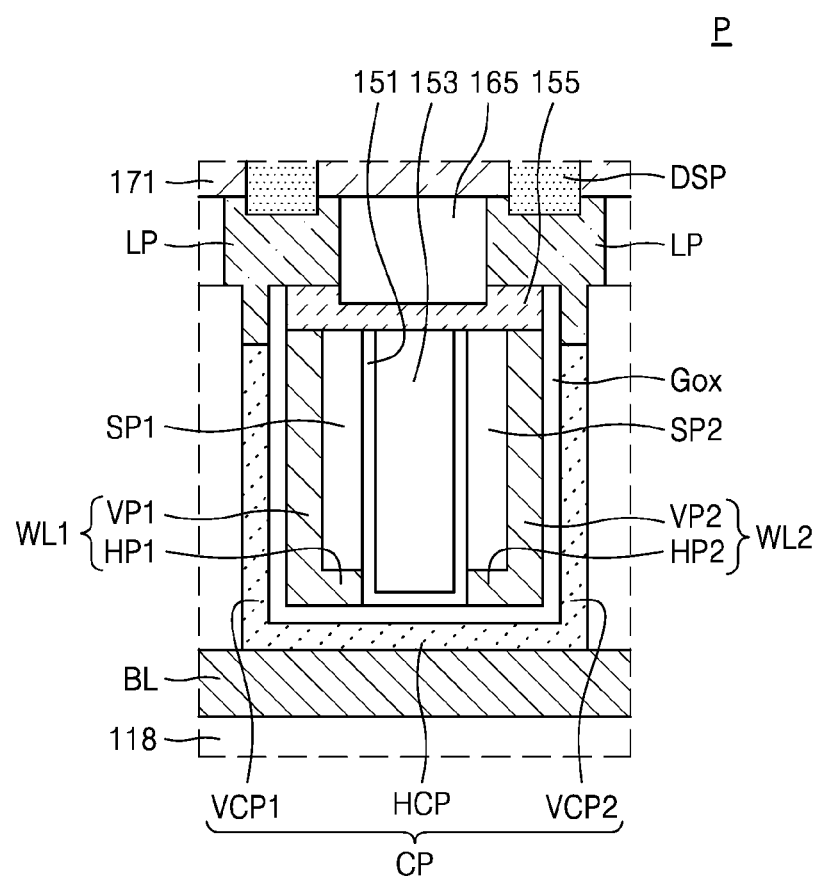

Referring to FIGS. 4A to 4C together with FIG. 5B, the gate insulating pattern Gox may cover the surface of the channel pattern CP with a uniform thickness. The gate insulating pattern Gox may be commonly disposed between the channel pattern CP and the first word lines WL1 and the second word lines WL2. A portion of the gate insulating pattern Gox may be located between the first word lines WL1 and the second word lines WL2, e.g., in a plan view. A portion of the gate insulating pattern Gox may contact the first capping pattern 151.

Figure 5C:
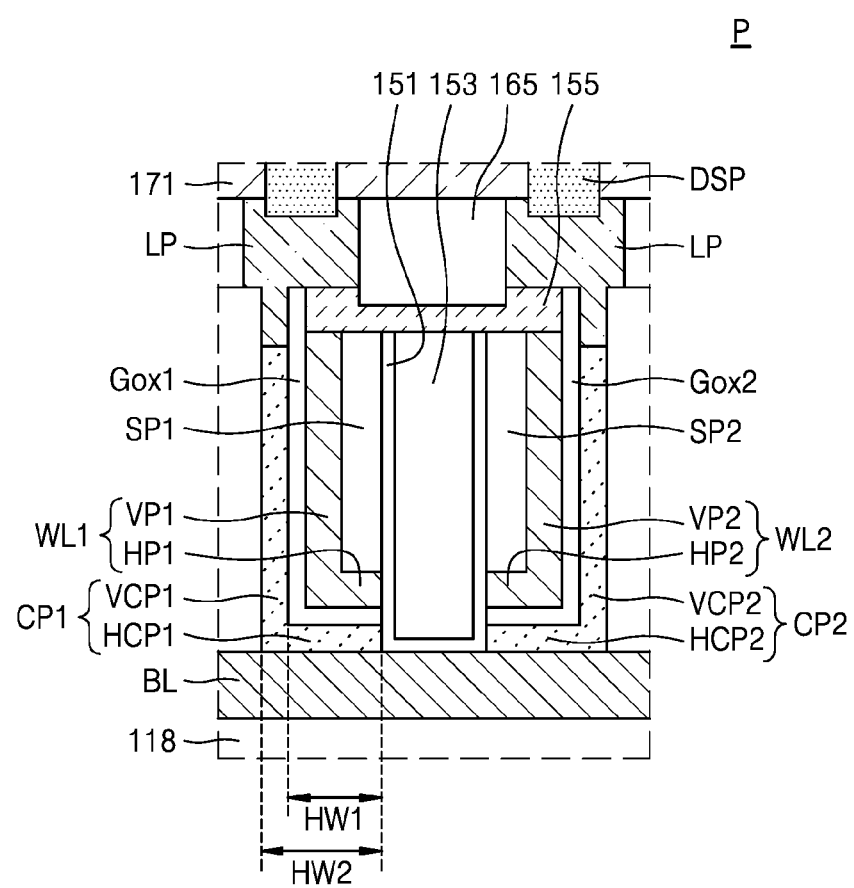

Referring to FIGS. 4A to 4C together with FIG. 5C, first channel patterns CP1 and second channel patterns CP2 may be apart from each other in the first horizontal direction (the X direction) on the bit line BL and may be arranged mirror-symmetrically to each other. A first channel pattern CP1 may include a first horizontal channel portion HCP1 in contact with the bit line BL and a first vertical channel portion VCP1 vertically protruding from the first horizontal channel portion HCP1 and being adjacent to the first vertical portion VP1 of the first word line WL1. A second channel pattern CP2 may include a second horizontal channel portion HCP2 in contact with the bit line BL and a second vertical channel portion VCP2 vertically protruding from the second horizontal channel portion HCP2 and being adjacent to an outer wall of the second word line WL2.

A sidewall of the first horizontal channel portion HCP1 of the first channel pattern CP1 and a sidewall of the first gate insulating pattern Gox1 may be aligned/coplanar with the sidewall of the first horizontal portion HP1 of the first word line WL1, e.g., in a vertical direction. Similarly, a sidewall of the second horizontal channel portion HCP2 of the second channel pattern CP2 and a sidewall of the second gate insulating pattern Gox2 may be aligned/coplanar with the sidewall of the second horizontal portion HP2 of the second word line WL2, e.g., in the vertical direction.

The first horizontal portions HP1 of the first word lines WL1 and the second horizontal portions HP2 of the second word lines WL2 may have a first horizontal width HW1 in the first horizontal direction (the X direction), and the first horizontal channel portions HCP1 of the first channel patterns CP1 and the second horizontal channel portions HCP2 of the second channel patterns CP2 may have a second horizontal width HW2 in the first horizontal direction, greater than the first horizontal width HW1.

When the first channel patterns CP1 and the second channel patterns CP2 are apart from each other on the bit line BL, the first capping pattern 151 may be in contact with the upper surface of the bit line BL between the first channel patterns CP1 and the second channel patterns CP2.

Figure 5D:
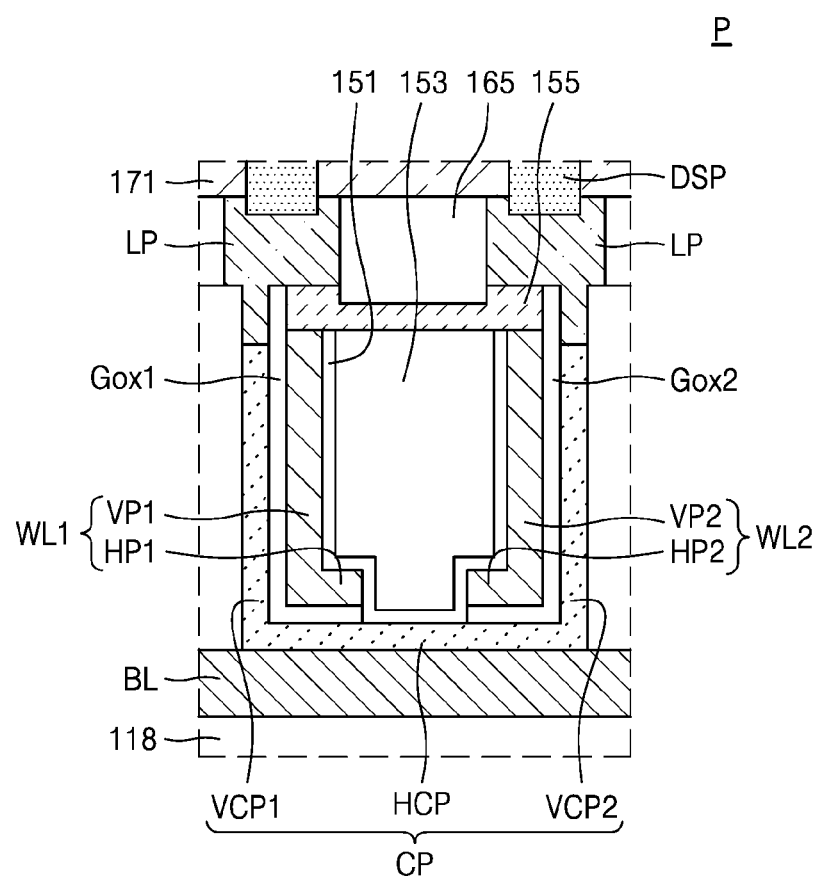

Referring to FIGS. 4A to 4C together with FIG. 5D, the first spacer SP1 and the second spacer SP2 illustrated in FIG. 5A may be omitted, and the first capping pattern 151 may cover/contact the surfaces of the first word line WL1 and the second word line WL2 with a uniform thickness. For example, the first capping pattern 151 may be conformally formed on the surfaces of the first word line WL1, the second word line WL2, the first and second gate insulating patterns Gox1 and Gox2, and the channel pattern CP.

Figure 5E:
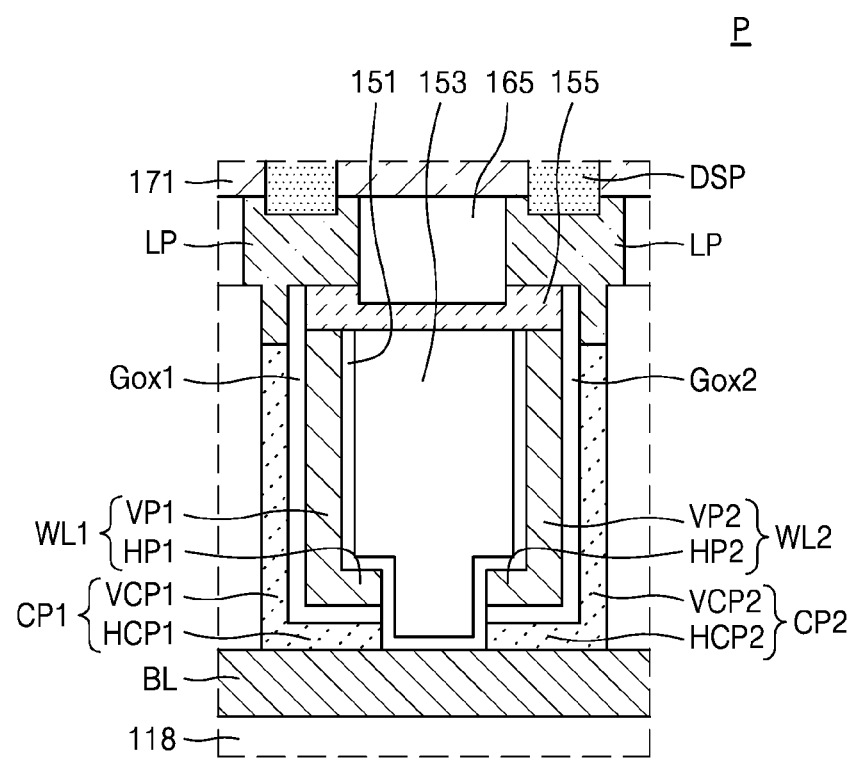

Referring to FIGS. 4A to 4C together with FIG. 5E, the first spacer SP1 and the second spacer SP2 illustrated in FIG. 5C may be omitted, and the first capping pattern 151 may cover/contact the surfaces of the first word line WL1 and second word line WL2, sidewalls of the first channel pattern CP1 and second channel pattern CP2, and a portion of the bit line BL with a uniform thickness. For example, the first capping pattern 151 may be conformally formed on the surfaces of the first word line WL1, the second word line WL2, the first and second gate insulating patterns Gox1 and Gox2, the first and second channel patterns CP1 and CP2, and the bit line BL.

Figure 5F:
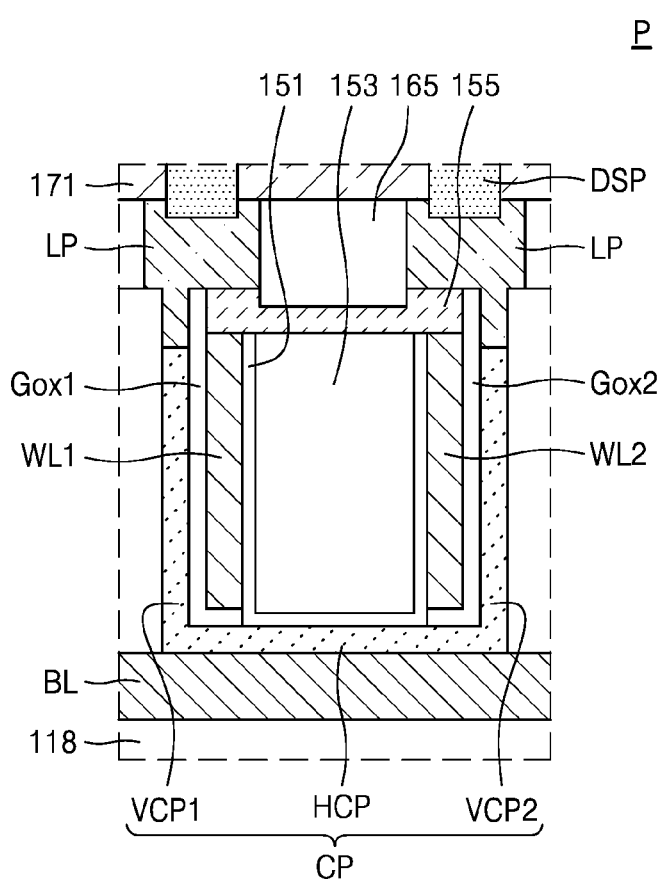

Referring to FIGS. 4A to 4C together with FIG. 5F, unlike the first word line WL1 and second word line WL2 illustrated in FIG. 5D, the first word line WL1 and the second word line WL2 illustrated in FIG. 5F may have an I-shaped vertical cross-sections and may face each other. For example, the first word line WL1 and the second word line WL2 shown in FIG. 5F may correspond to the first vertical portion VP1 of the first word line WL1 and the second vertical portion VP2 of the second word line WL2 illustrated in FIG. 5D.

Figure 5G:
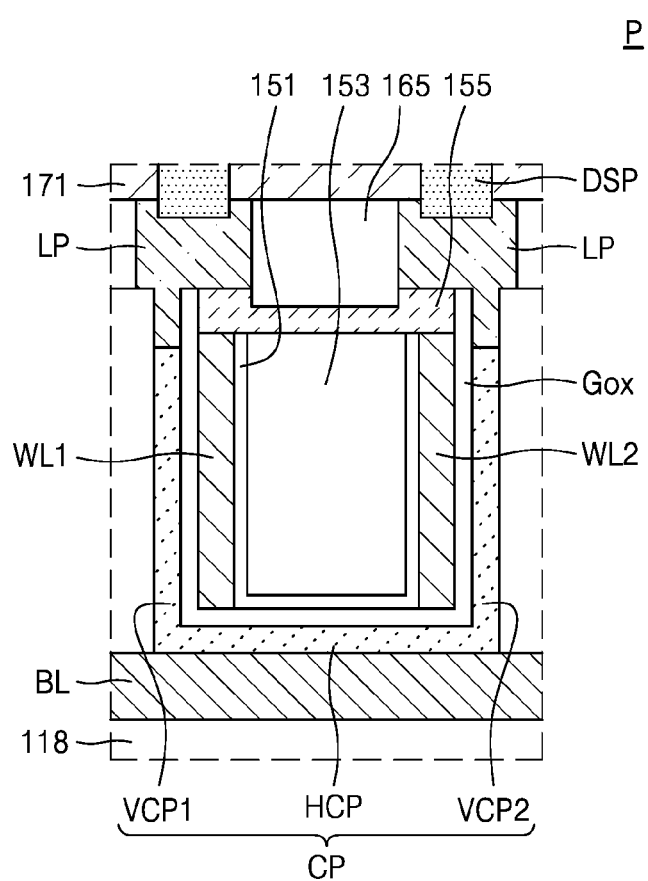

Referring to FIGS. 4A to 4C together with FIG. 5G, the first spacer SP1 and the second spacer SP2 illustrated in FIG. 5B may be omitted, and unlike the first word line WL1 and the second word line WL2 illustrated in FIG. 5B, the first word line WL1 and the second word line WL2 illustrated in FIG. 5G may have an I-shaped vertical cross-sections and face each other. For example, the first word line WL1 and the second word line WL2 shown in FIG. 5G may correspond to the first vertical portion VP1 of the first word line WL1 and the second vertical portion VP2 of the second word line WL2 shown in FIG. 5B.

Figure 5H:
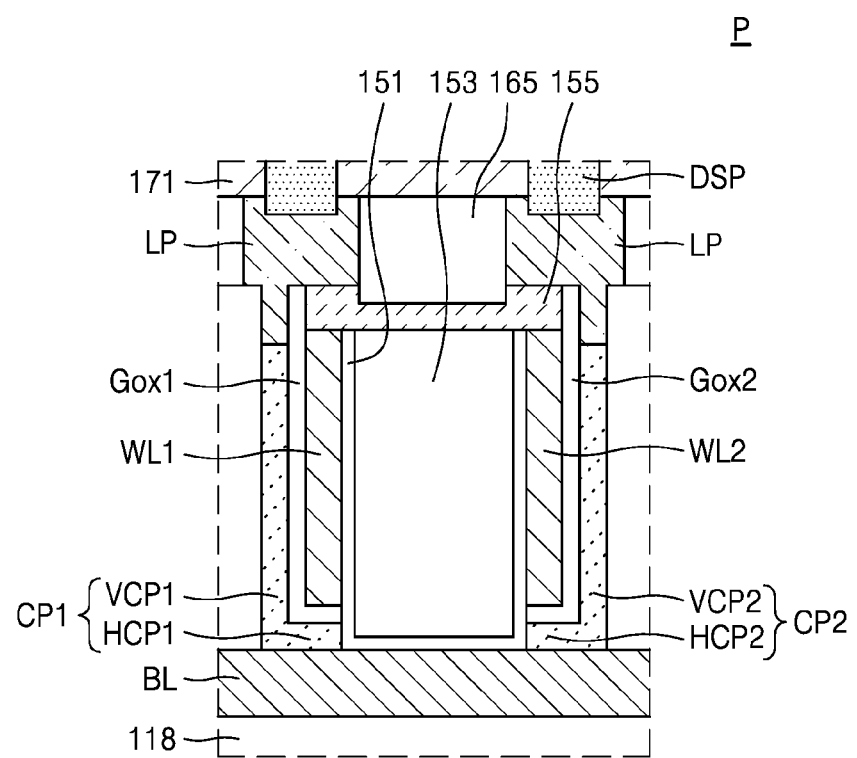

Referring to FIGS. 4A to 4C together with FIG. 5H, the first spacer SP1 and the second spacer SP2 illustrated in FIG. 5C may be omitted, and unlike the first word line WL1 and the second word line WL2 illustrated in FIG. 5C, the first word line WL1 and the second word line WL2 illustrated in FIG. 5H have an I-shaped vertical cross-section and may face each other. For example, the first word line WL1 and the second word line WL2 shown in FIG. 5H may correspond to the first vertical portion VP1 of the first word line WL1 and the second vertical portion VP2 of the second word line WL2 illustrated in FIG. 5C.

Figure 5I:
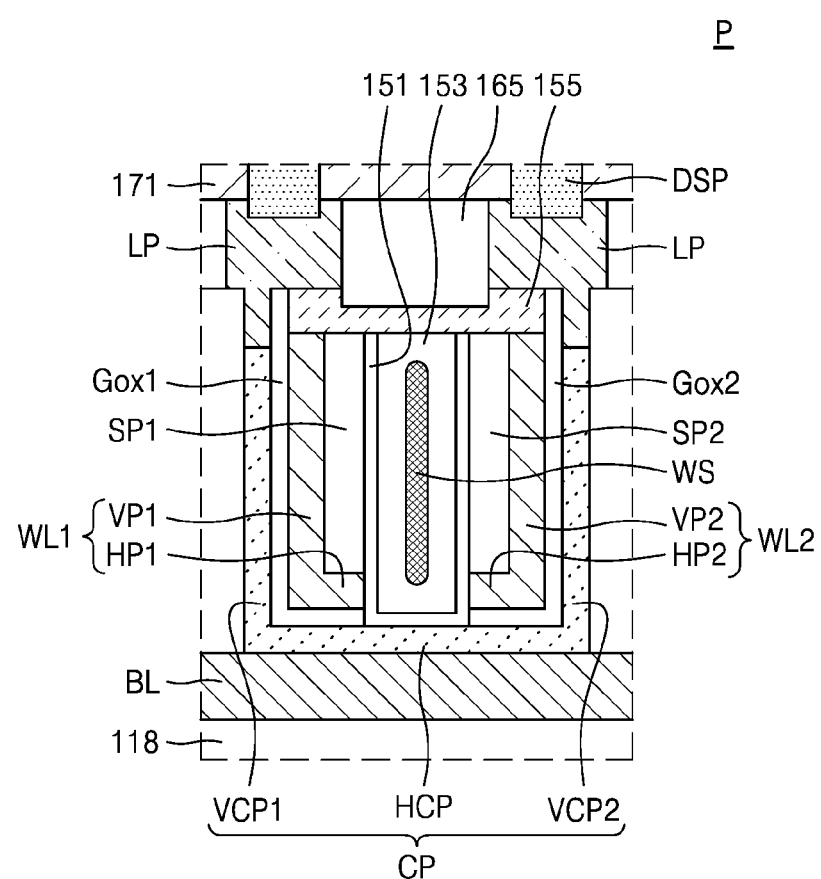

Referring to FIGS. 4A to 4C together with FIG. 5I, word line shielding structures WS or air gaps may be located between the first word lines WL1 and the second word lines WL2, respectively. The word line shielding structures WS may extend in the second horizontal direction (the Y direction) in parallel with the first word lines WL1 and the second word lines WL2. In some embodiments, the word line shielding structures WS may be locally formed in the second insulating patterns 153 by forming an insulating layer defining a gap region and filling the gap region of the insulating layer with a conductive material in the process of forming the second insulating patterns 153 after the first word lines WL1 and the second word lines WL2 are formed. In other embodiments, in the process of forming the second insulating patterns 153, air gaps may be formed in the second insulating patterns 153 by depositing an insulating layer by using a deposition method having poor step coverage characteristics. For example, the air gaps may be in a vacuum state or may be filled with a process gas provided in the deposition process.

Figure 5J:
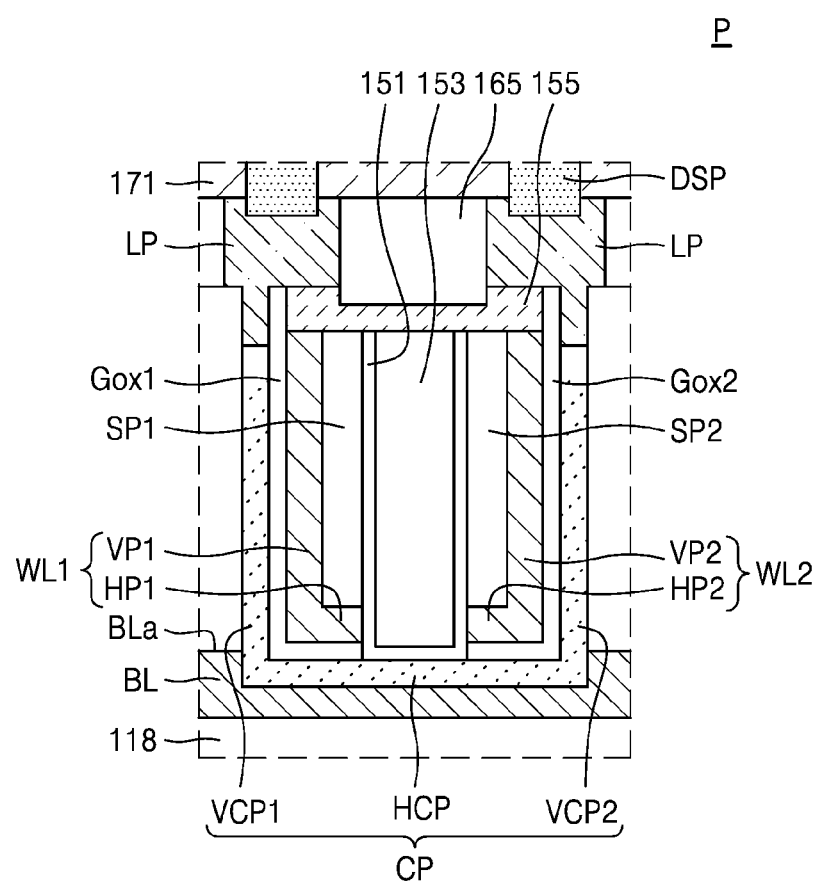

Referring to FIGS. 4A to 4C together with FIG. 5J, upper surfaces of the bit lines BL may have a concave-convex structure. Upper surfaces of the bit lines BL below the channel patterns CP may be at a vertical level lower than an upper surface BLa of the bit lines BL. The upper surface BLa of the bit lines BL may be an upper surface at the highest vertical level among the upper surfaces of the bit lines BL and may not vertically overlap the channel patterns CP.

The lower surface of the horizontal channel portion HCP of the channel patterns CP may be at a vertical level lower than the upper surface BLa of the bit lines BL. At least a portion of the horizontal channel portion HCP of the channel patterns CP may be buried in an upper portion of the bit lines BL. For example, a bottom surface and a portion of side surfaces of the horizontal channel portion HCP of a channel pattern CP may be surrounded by and contact a bit line BL.

Figure 6A:
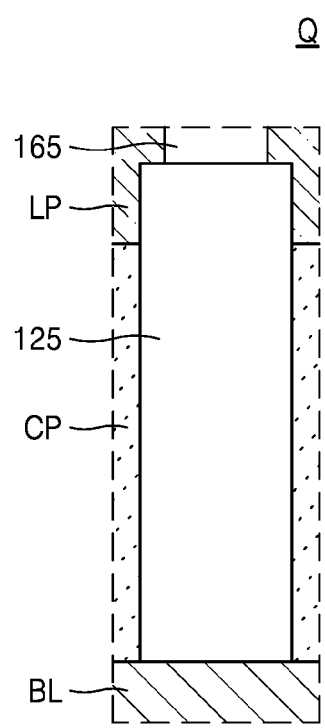

Referring to FIGS. 4A to 4C together with FIG. 6A, the mold insulating pattern 125 may be in contact with the upper surface of the bit line BL. The channel pattern CP may be disposed on the bit line BL, and the landing pad LP may be disposed on the channel pattern CP. The channel pattern CP may include a pair of source/drain regions apart from each other. A pair of source/drain regions may be located at an upper end of the channel pattern CP in contact with the landing pad LP and at a lower end of the channel pattern CP in contact with the bit line BL. The channel pattern CP may include a channel region between the pair of source/drain regions.

Figure 6B:
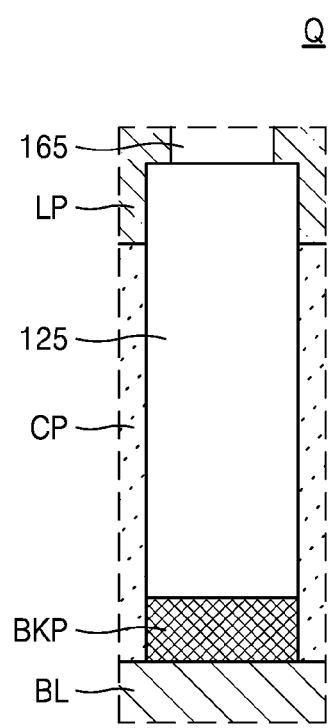

Referring to FIGS. 4A to 4C together with FIG. 6B, a blocking pattern BKP may be located between the mold insulating pattern 125 and the bit line BL. The blocking pattern BKP may be located between the neighboring channel patterns CP. The blocking pattern BKP may be located to be adjacent to lower portions of the channel patterns CP adjacent on the bit line BL. For example, the blocking pattern BKP may contact side surfaces of the lower portions of the channel patterns CP, a top surface of the bit line BL, and a bottom surface of the mold insulating pattern 125. In some embodiments, a plurality of blocking patterns BKP may be disposed on the bit line BL. For example, the plurality of blocking patterns BKP may be apart from each other in the first vertical direction (the X direction) and disposed on the bit line BL. The blocking pattern BKP may include or be formed of at least one of an insulating material and a conductive material. The insulating material may include or may be, for example, at least one of silicon nitride (e.g., $SiN_x$) and metal oxide (e.g., $AlO_x$). The conductive material may include or may be, for example, a metal material.

Figure 6C:
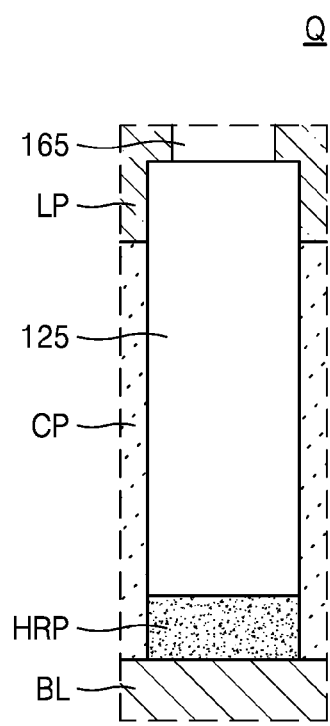

Referring to FIGS. 4A to 4C together with FIG. 6C, a lower pattern HRP may be located between the mold insulating pattern 125 and the bit line BL. The lower pattern HRP may be located between the adjacent channel patterns CP. The lower pattern HRP may be disposed to be adjacent to lower portions of the channel patterns CP adjacent on the bit line BL. The lower pattern HRP may separate the mold insulating pattern 125 from the bit line BL in the vertical direction (the Z direction). For example, the lower pattern HRP may contact side surfaces of the lower portions of the channel patterns CP, a top surface of the bit line BL, and a bottom surface of the mold insulating pattern 125. The lower pattern HRP may include or be formed of at least one of hydrogen (H) and deuterium (D). For example, the lower pattern HRP may include or be formed of silicon oxide including at least one of hydrogen and deuterium.

Figure 6D:
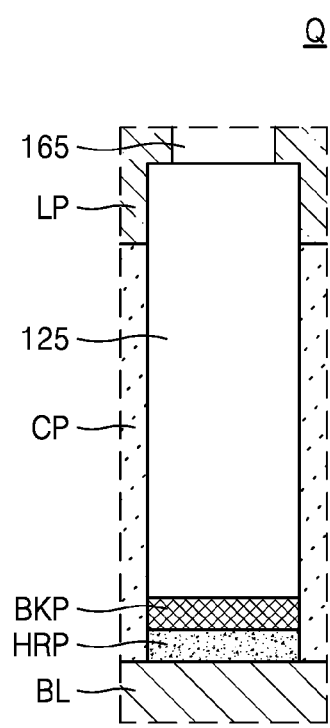

Referring to FIGS. 4A to 4C together with FIG. 6D, the blocking pattern BKP and the lower pattern HRP may be located between the mold insulating pattern 125 and the bit line BL. The blocking pattern BKP and the lower pattern HRP may be located between the adjacent channel patterns CP and may be located to be adjacent to lower portions of the channel patterns CP. In some embodiments, the lower pattern HRP may be located below the blocking pattern BKP and located between the bit line BL and the blocking pattern BKP. For example, the blocking pattern BKP may contact side surfaces of the channel patterns CP, a top surface of the lower pattern HRP, and a bottom surface of the mold insulating pattern 125. For example, the lower pattern HRP may contact side surfaces of the lower portions of the channel patterns CP, a top surface of the bit line BL, and a bottom surface of the blocking pattern BKP.

The blocking pattern BKP may prevent the lower portions of the channel patterns CP from being oxidized due to oxygen (O) included in the mold insulating pattern 125. Accordingly, contact resistance between the bit line BL and the channel patterns CP may be reduced, and as a result, electrical characteristics and reliability of the semiconductor memory device may be improved.

Hydrogen or deuterium included in the lower pattern HRP may diffuse to lower portions of the channel patterns CP to compensate for defects in the lattice structure below the channel patterns CP. Accordingly, contact resistance between the bit line BL and the channel patterns CP may be reduced, and as a result, electrical characteristics and reliability of the semiconductor memory device may be improved.

Again, referring to FIGS. 4A to 4C, the bit lines BL may be electrically connected to the first circuit transistors CT through the connection wiring structure IS. For example, the bit lines BL may be electrically connected to the peripheral circuit wirings PCL through the lower contact plugs LCT, the first connection wirings CM1, and the first connection contact plugs CMC1, and the peripheral circuit wirings PCL may be electrically connected to the first circuit transistors CT through the peripheral circuit contact plugs PCT.

In some embodiments, at least some of the first circuit transistors CT may constitute the sense amplifier (4 of FIG. 1). The first circuit transistors CT constituting the sense amplifier (4 of FIG. 1) may overlap the cell array (1 of FIG. 1) including the memory cells (MC of FIG. 1) of the channel patterns CP in the vertical direction (the Z direction). In addition, the lower contact plugs LCT, the first connection wirings CM1, the first connection contact plugs CMC1, the peripheral circuit wirings PCL, and the peripheral circuit contact plugs PCT forming an electrical connection path between the bit line BL and the first circuit transistors CT constituting the sense amplifier (4 of FIG. 1) may overlap the memory cell array (1 of FIG. 1) including the memory cells (MC of FIG. 1) constituted by the channel patterns CP in the vertical direction (the Z direction).

Accordingly, an electrical path between the memory cells (MC of FIG. 1) constituted by the channel patterns CP and the first circuit transistors CT, for example, an electrical path between the bit lines BL and the first circuit transistors CT may be located in the cell array region CAR to overlap the memory cell array (1 of FIG. 1) including the memory cells (MC of FIG. 1) constituted by the channel patterns CP in the vertical direction (the Z direction), without passing through the peripheral circuit region PCR.

Accordingly, an electrical path between the vertical channel transistors and the first circuit transistors CT included in the selection devices (TR of FIG. 1) may be shortened, so that electrical characteristics and reliability of the vertical channel transistors and the first circuit transistors CT may be improved.

In addition, a region used for the first circuit transistors CT and an electrical path between the memory cells (MC of FIG. 1) and the first circuit transistors CT in a top view may be reduced, or a separate region is not required, thereby improving the degree of integration of the semiconductor memory device.

Figure 7A:
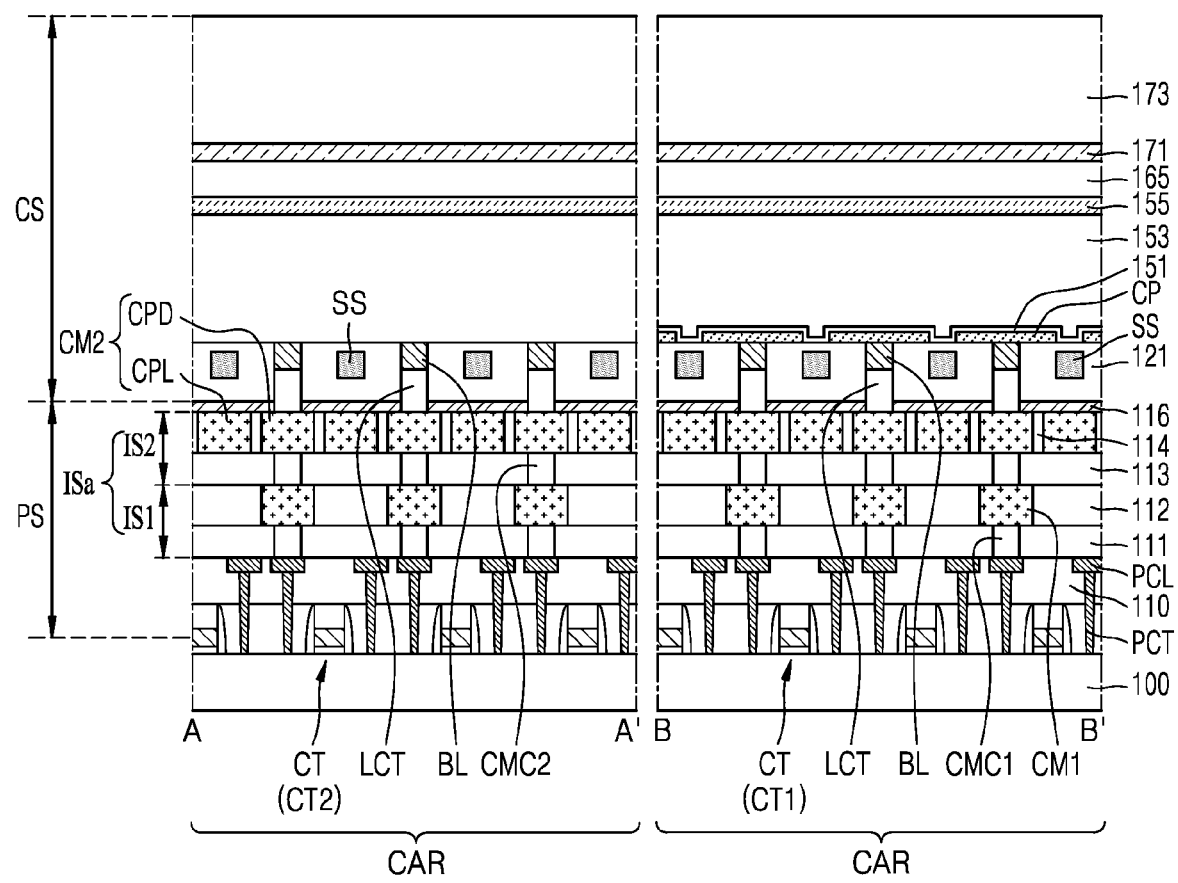
FIGS. 7A and 7B are cross-sectional views of a semiconductor memory device according to embodiments.
Figure 7B:
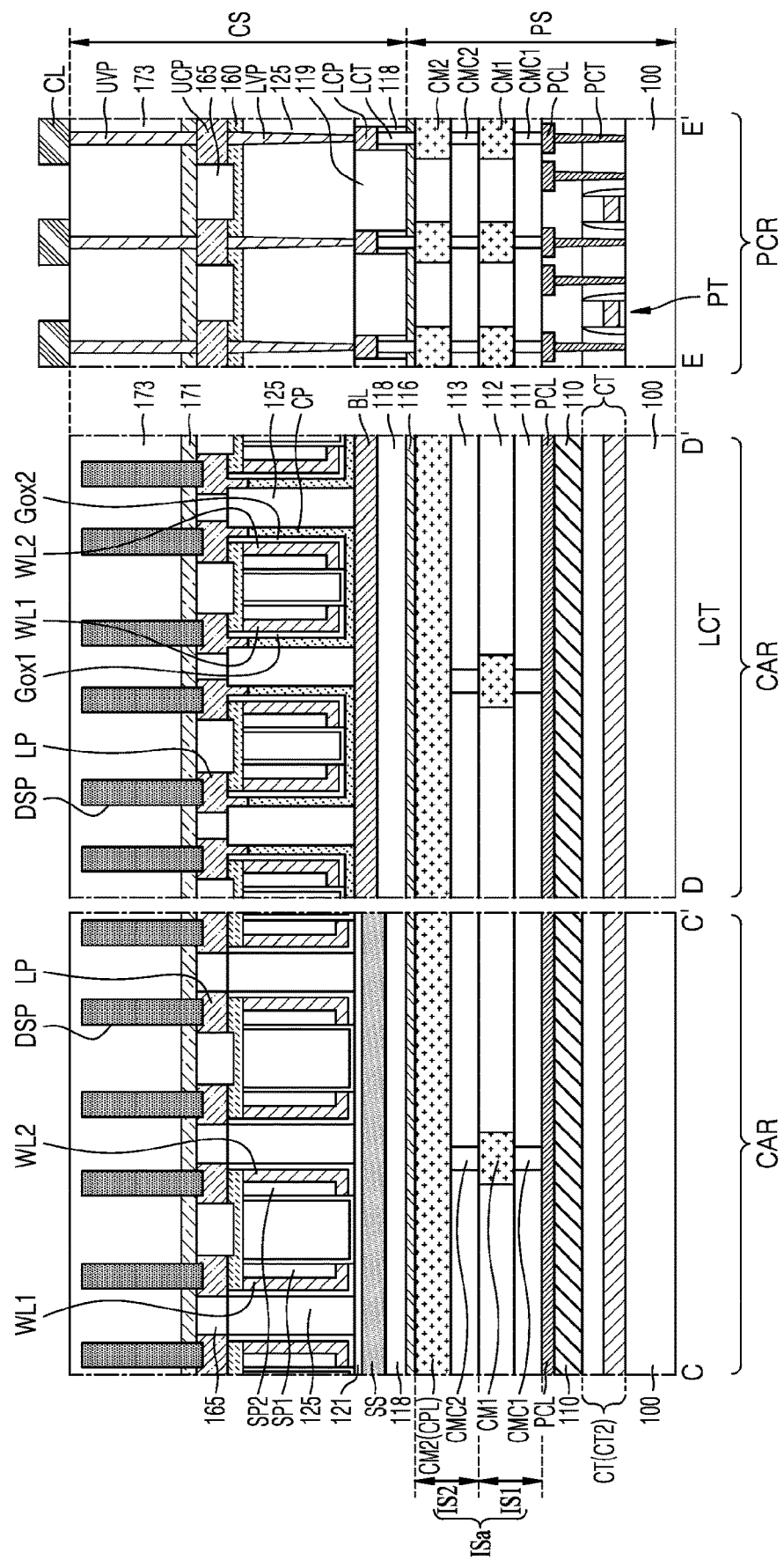

FIGS. 7A and 7B are cross-sectional views of a semiconductor memory device according to embodiments. Specifically, FIG. 7A shows cross-sections taken along lines A-A' and B-B' of FIG. 4A, FIG. 7B shows cross-sections taken along lines C-C', D-D', and E-E' of FIG. 4A, and the same descriptions as those of embodiments illustrated in FIGS. 4A to 4C are omitted in descriptions of embodiments illustrated in FIGS. 7A and 7B.

Referring to FIGS. 4A, 7A and 7B together, a connection wiring structure ISa may be disposed on the peripheral circuit insulating layer 110. The connection wiring structure ISa may include a second connection wiring structure IS2 stacked on the first connection wiring structure IS1.

The first connection wiring structure IS1 may include a first wiring insulating layer 111, a second wiring insulating layer 112 stacked on the first wiring insulating layer 111, first connection wirings CM1 passing through the second wiring insulating layer 112, and first connection contact plugs CMC1 electrically connecting the peripheral circuit wirings PCL to the first connection wirings CM1 through the first wiring insulating layer 111.

The second connection wiring structure IS2 may include a third wiring insulating layer 113, a fourth wiring insulating layer 114 stacked on the third wiring insulating layer 113, second connection wirings CM2 passing through the fourth wiring insulating layer 114, and second connection contact plugs CMC2 electrically connecting the first connection wirings CM1 to the second connection wirings CM2 through the third wiring insulating layer 113.

The second connection wirings CM2 may include connection pads CPD and connection wiring lines CPL. The connection pads CPD may be electrically connected to or contact lower contact plugs LCT electrically connected to or contacting the bit lines BL, and the connection wiring lines CPL may extend in the same direction as an extension direction of the bit lines BL. The connection wiring lines CPL may extend in the first horizontal direction (the X direction). The lower contact plugs LCT may contact the connection pads CPD, but the lower contact plugs LCT may not contact the connection wiring lines CPL. Accordingly, the connection pads CPD may be electrically connected to the bit lines BL, but the connection wiring lines CPL may not be electrically connected to the bit lines BL.

In the peripheral circuit structure PS, the first circuit transistors CT may be arranged in the cell array region CAR of the semiconductor substrate 100, and the second circuit transistors PT may be arranged in the peripheral circuit region PCR of the semiconductor substrate 100. The first circuit transistors CT may include the first transistors CT1 and second transistors CT2.

The bit lines BL may be electrically connected to the first transistors CT1, and the connection wiring lines CPL may be electrically connected to the second transistors CT2. For example, the bit lines BL may be electrically connected to the peripheral circuit wirings PCL through the lower contact plugs LCT, the connection pads CPD among the second connection wirings CM2, the second connection contact plugs CMC2, the first connection wirings CM1, and the first connection contact plugs CMC1, and the peripheral circuit wirings PCL may be electrically connected to the first transistors CT1 through the peripheral circuit contact plugs PCT. For example, the connection wiring lines CPL may be electrically connected to the peripheral circuit wirings PCL through the second connection contact plugs CMC2, the first connection wirings CM1, and the first connection contact plugs CMC1, and the peripheral circuit wirings PCL may be electrically connected to the second transistors CT2 through the peripheral circuit contact plugs PCT.

In some embodiments, the first transistors CT1 may constitute the sense amplifier (4 of FIG. 1), and the first transistors CT1 may constitute the sub-word line driver (2 of FIG. 1).

The first transistors CT1 constituting the sense amplifier (4 of FIG. 1) may overlap the memory cell array (1 of FIG. 1) including the memory cells (MC of FIG. 1) constituted by the channel patterns CP in the vertical direction (the Z direction). In addition, the lower contact plugs LCT, the connection pads CPD among the second connection wirings CM2, the second connection contact plugs CMC2, the first connection wirings CM1, the first connection contact plugs CMC1, the peripheral circuit wirings PCL, and the peripheral circuit contact plugs PCT, forming an electrical connection path between the bit line BL and the first transistors CT1 constituting the sense amplifier (4 of FIG. 1), may overlap the memory cell array (1 of FIG. 1) including the memory cells (MC of FIG. 1) constituted by the channel patterns CP in the vertical direction (the Z direction).

The second transistors CT2 constituting the sub-word line driver (2 of FIG. 1) may overlap the memory cell array (1 of FIG. 1) including the memory cells (MC of FIG. 1) of the channel patterns CP in the vertical direction (the Z direction). In addition, the second connection contact plugs CMC2, the first connection wirings CM1, the first connection contact plugs CMC1, the peripheral circuit wirings PCL, and the peripheral circuit contact plugs PCT, forming an electrical connection path between the connection wiring lines CPL and the second transistors CT2 constituting the sub-word line driver (2 of FIG. 1) may overlap the memory cell array (1 of FIG. 1) including the memory cells (MC of FIG. 1) constituted by the channel patterns CP in the vertical direction (the Z direction).

FIGS. 8A, 9A, 10A, 11A, 12A, 13A, 14A, and 15A are plan views illustrating a method of manufacturing a semiconductor memory device, according to embodiments, and FIGS. 8B, 8C, 9B, 9C, 10B, 10C, 11B, 11C, 12B, 12C, 13B, 13C, 14B, 14C, 15B, 15C, 16A, 16B, 17A, 17B, 18A, 18B, 19A, and 19B are cross-sectional views illustrating a method of manufacturing a semiconductor memory device, according to embodiments.

Figure 8A:
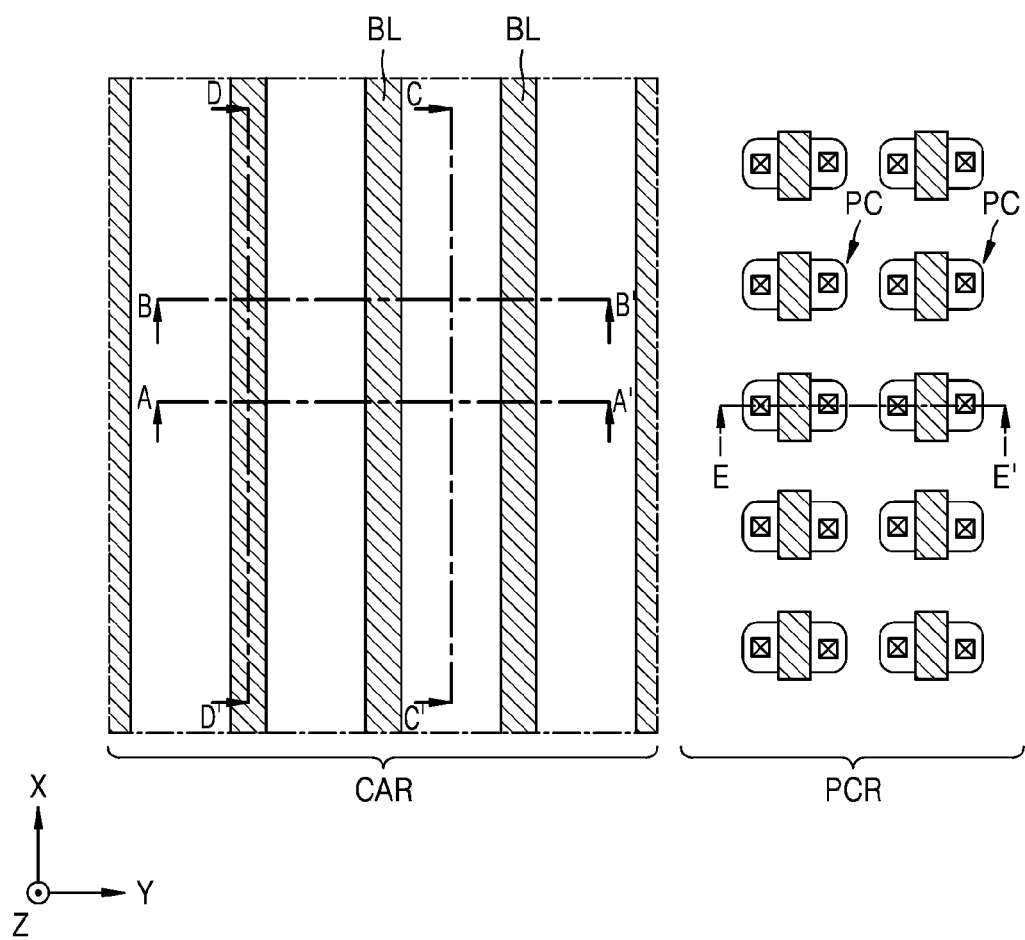
FIGS. 8A, 9A, 10A, 11A, 12A, 13A, 14A, and 15A are plan views illustrating a method of manufacturing a semiconductor memory device, according to embodiments, and FIGS. 8B. 8C, 9B, 9C, 10B, 10C, 11B, 11C, 12B, 12C, 13B, 13C, 14B, 14C, 15B, 15C, 16A, 16B, 17A, 17B, 18A, 18B, 19A, and 19B are cross-sectional views illustrating a method of manufacturing a semiconductor memory device, according to embodiments.
Figure 8B:
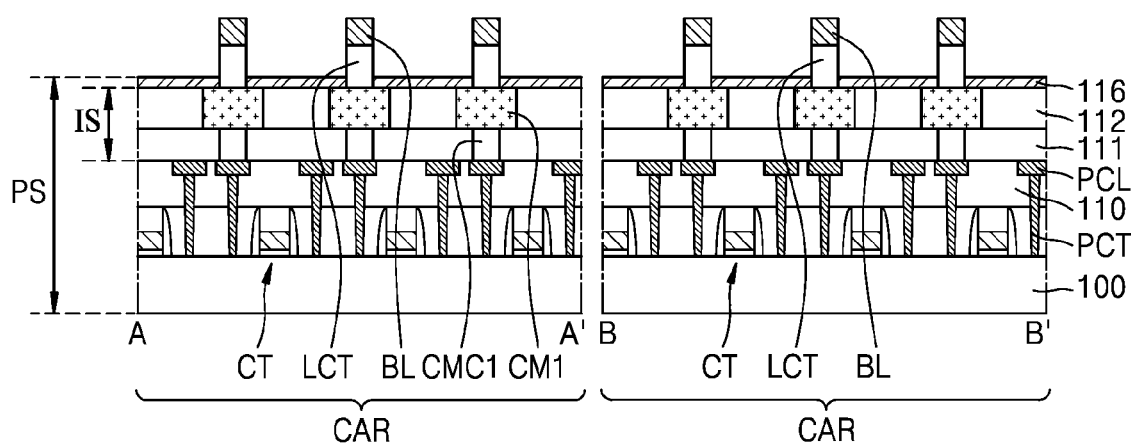
Figure 8C:
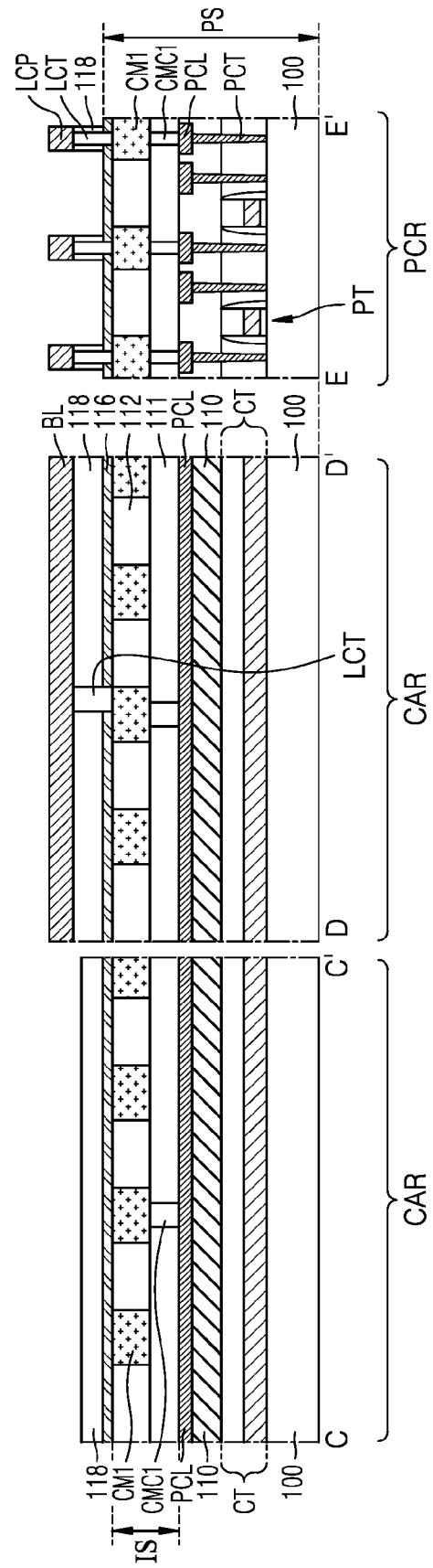
Figure 9A:
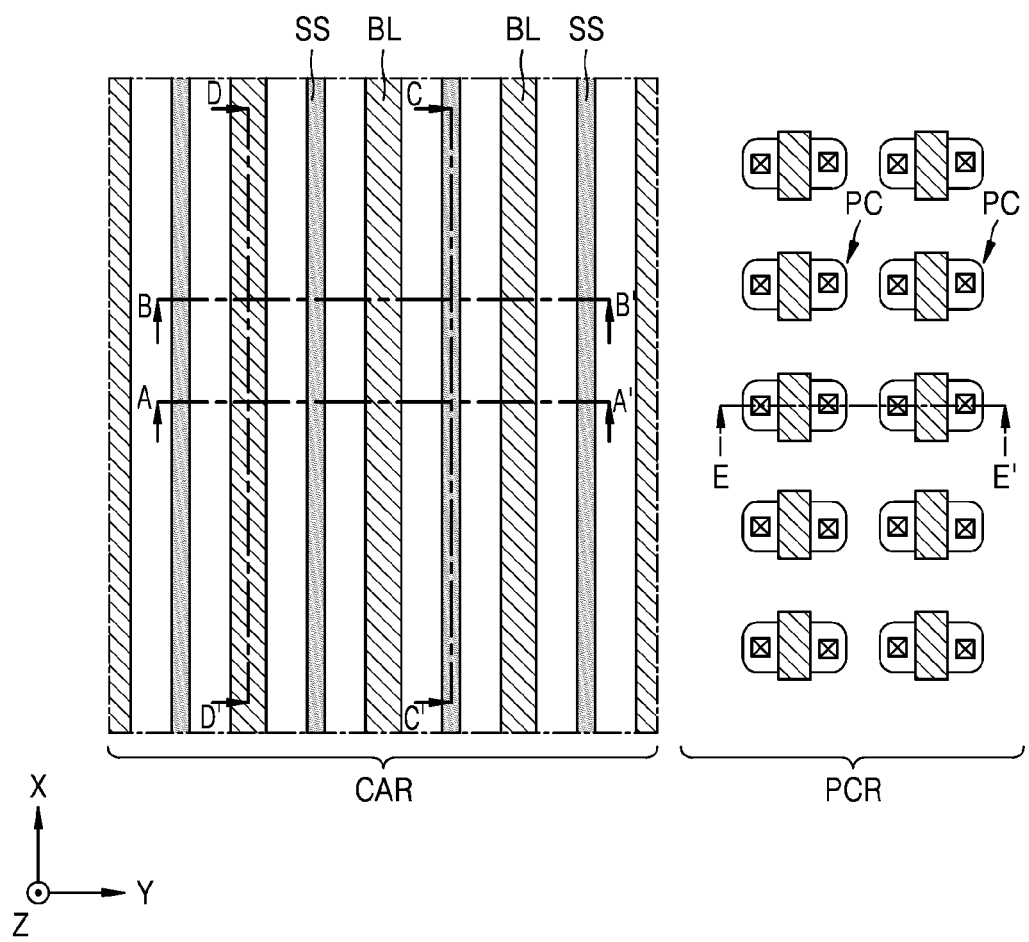
Figure 9B:
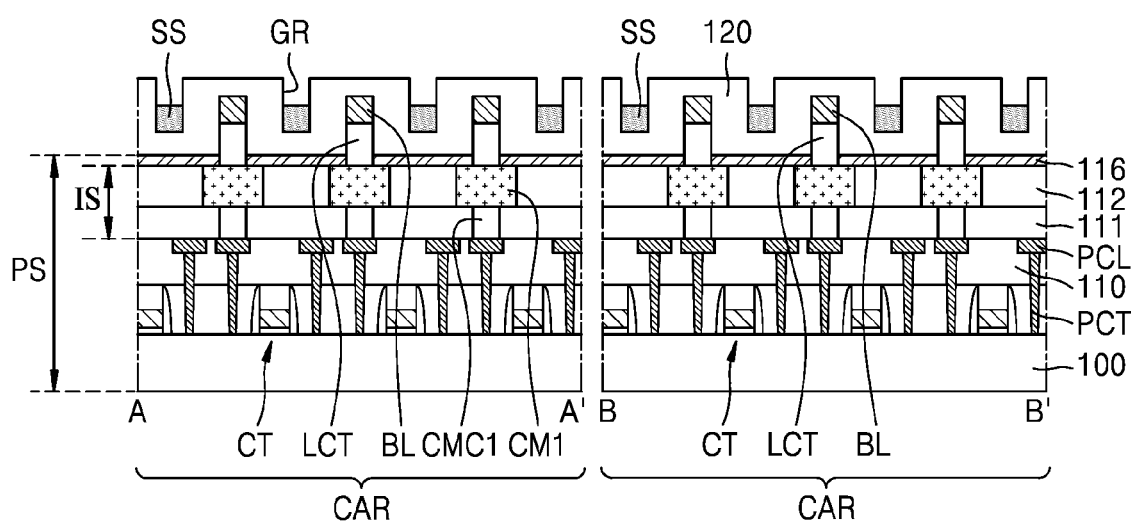
Figure 9C:
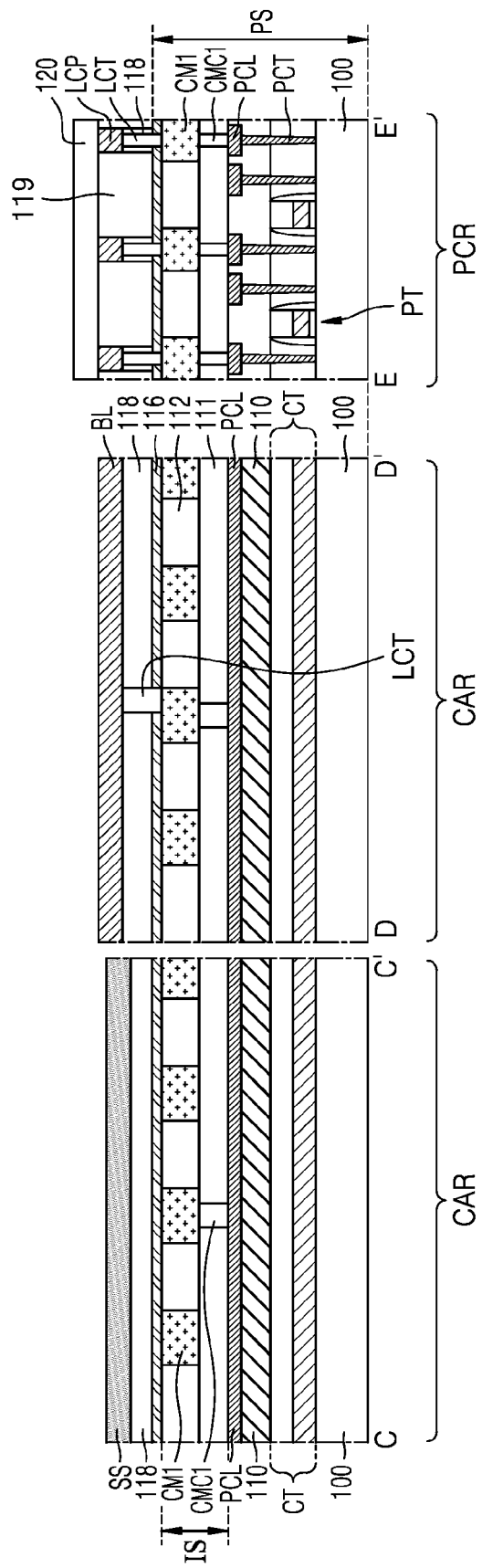
Figure 10A:
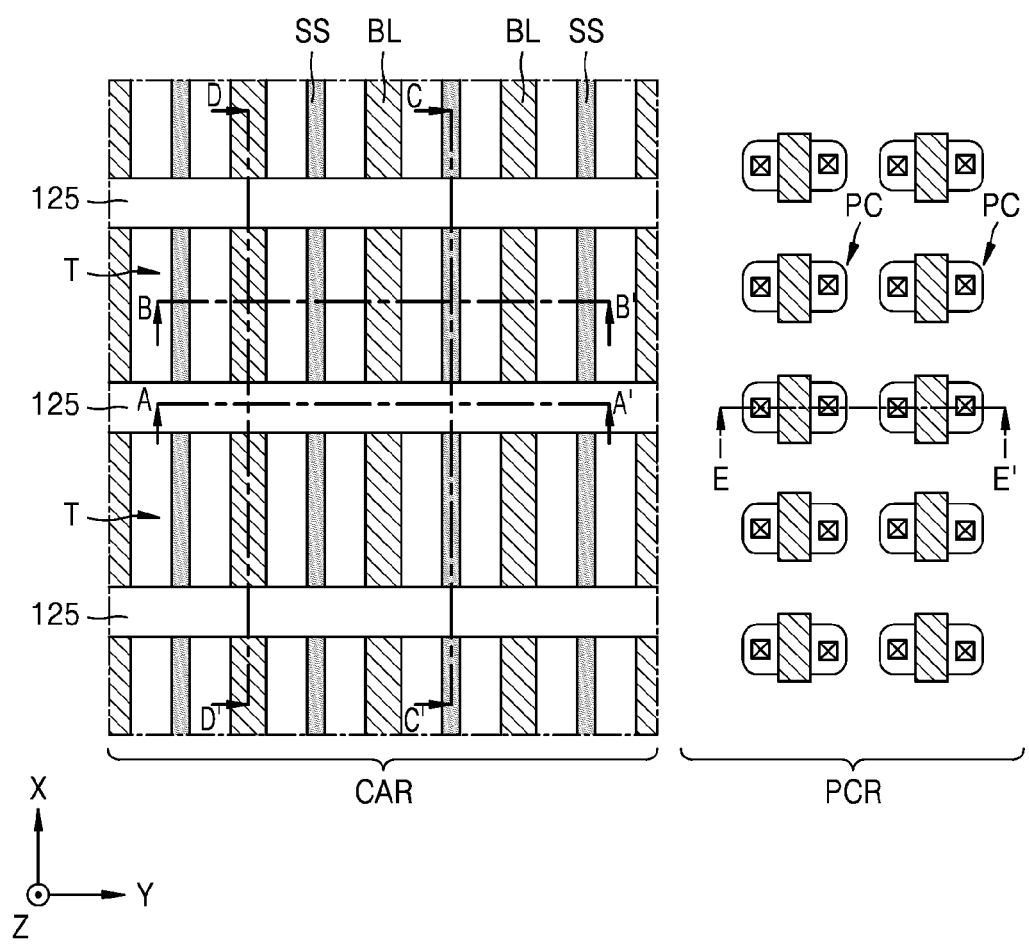
Figure 10B:
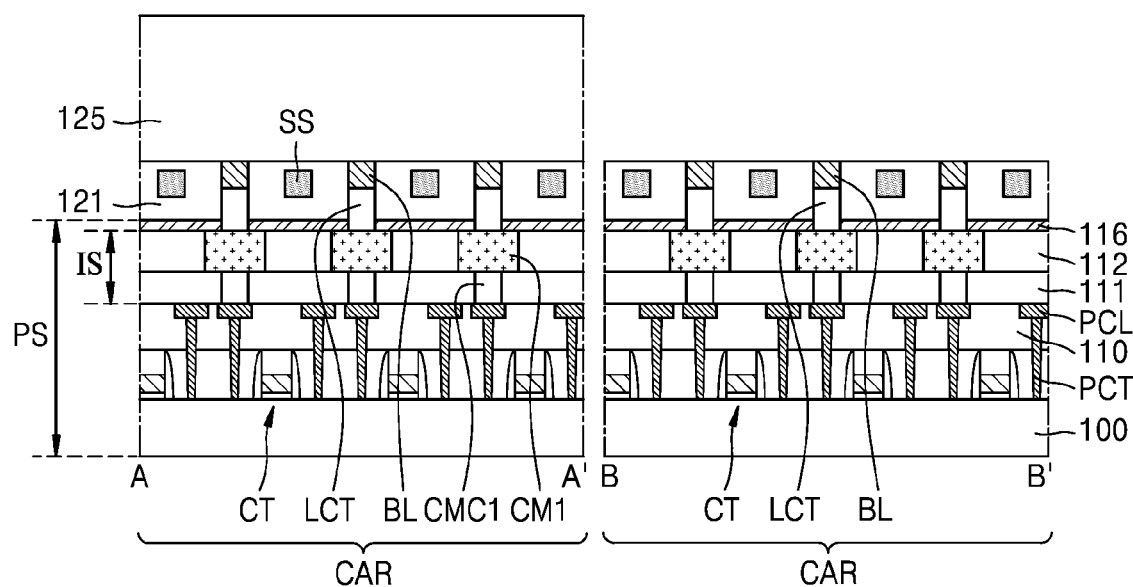
Figure 10C:
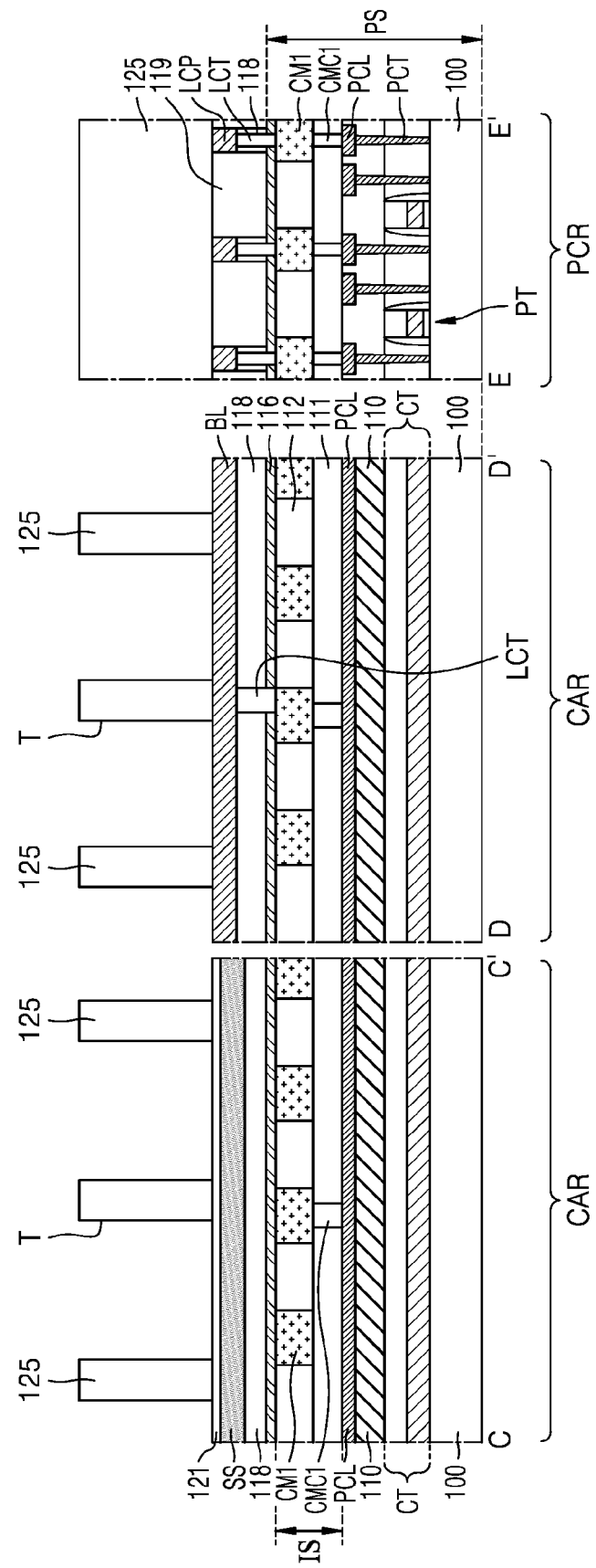
Figure 11A:
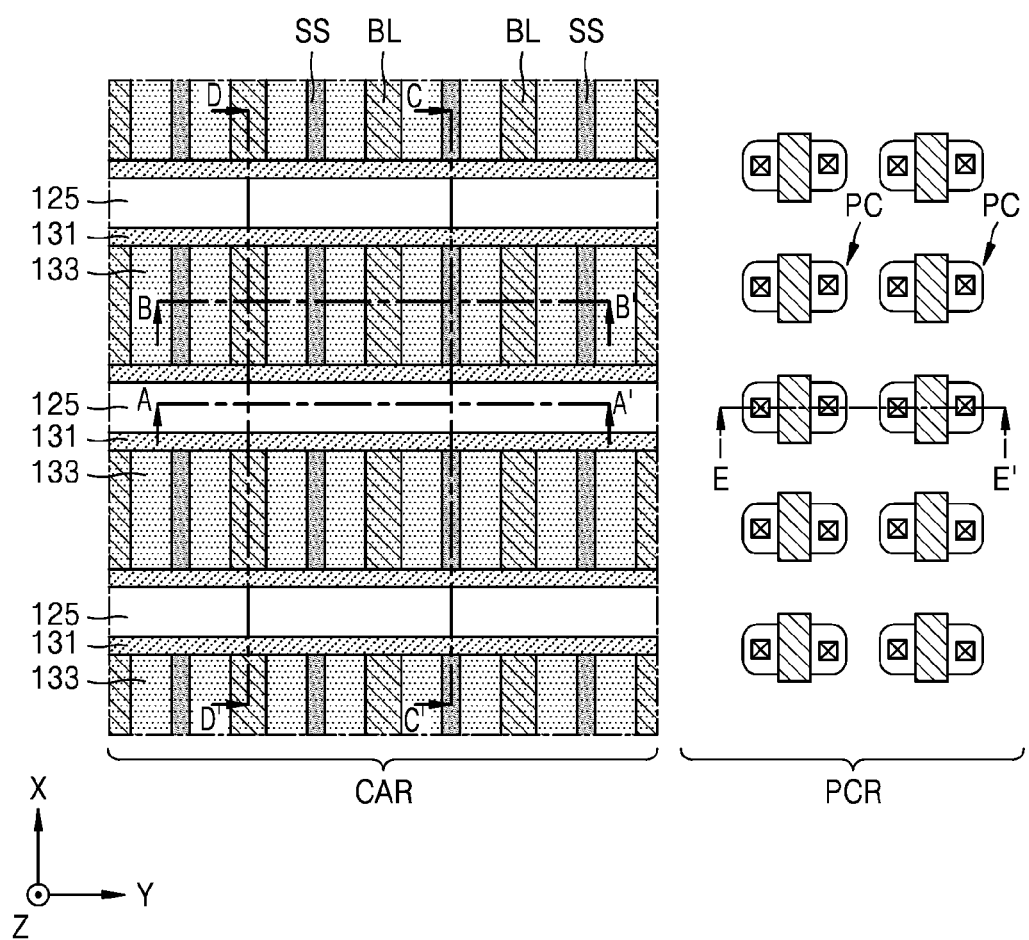
Figure 11B:
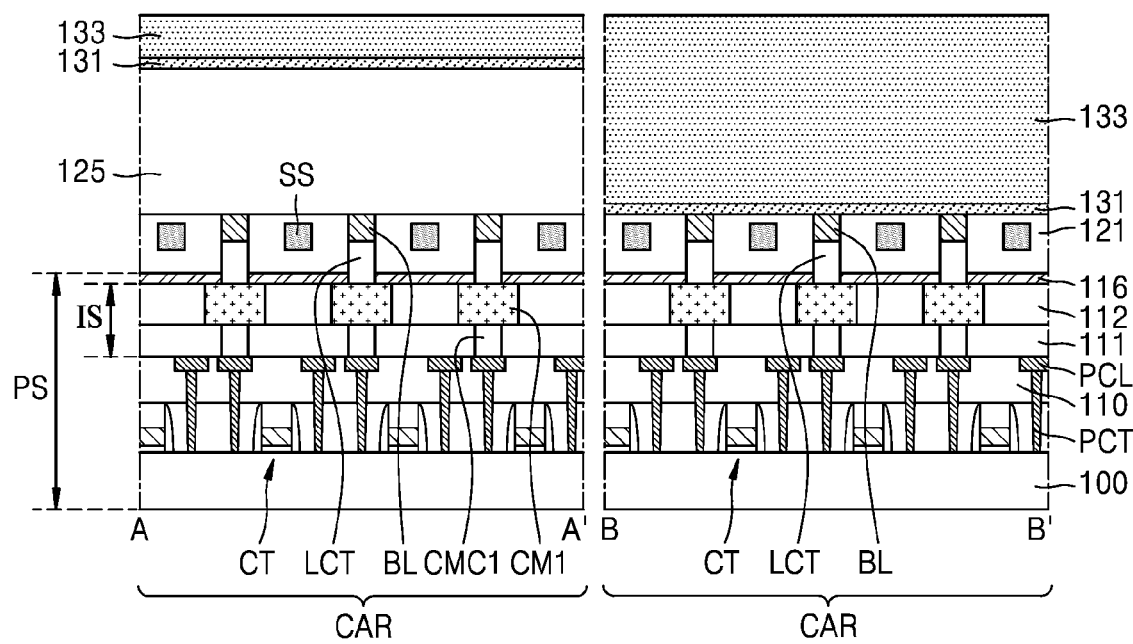
Figure 11C:
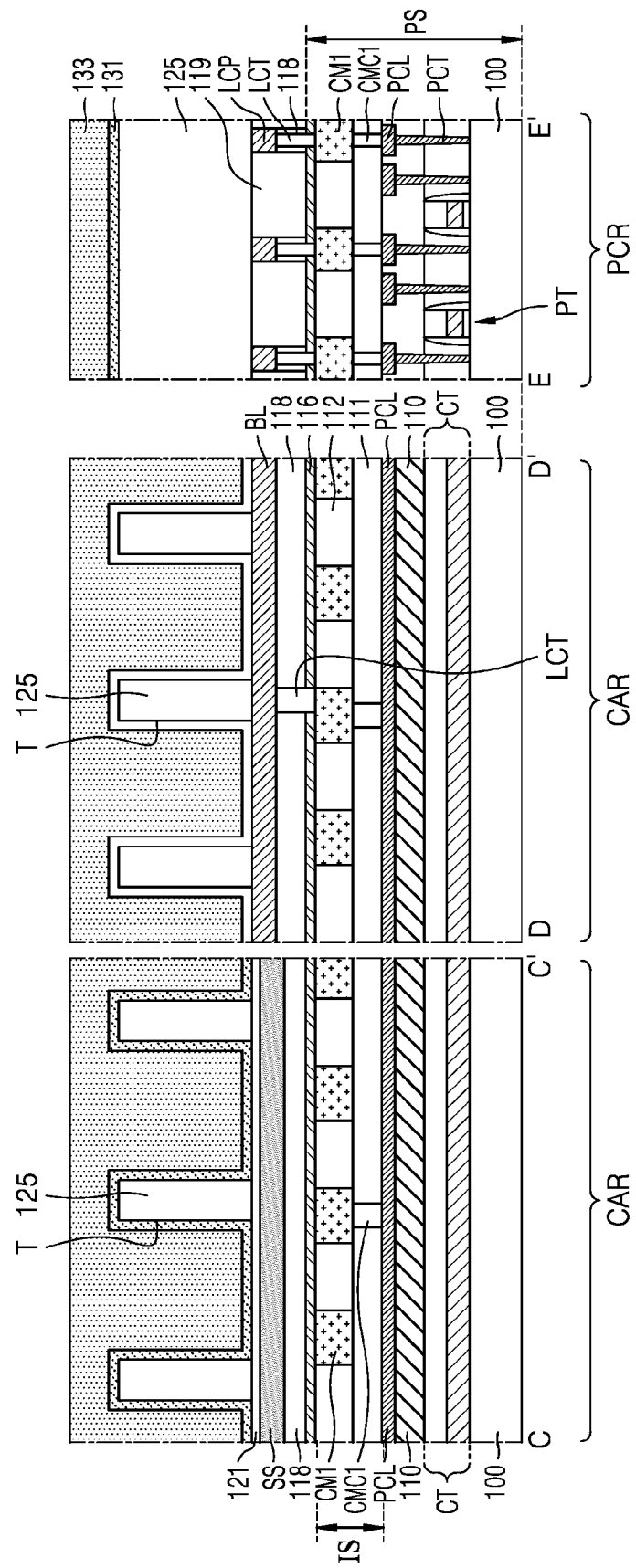
Figure 12A:
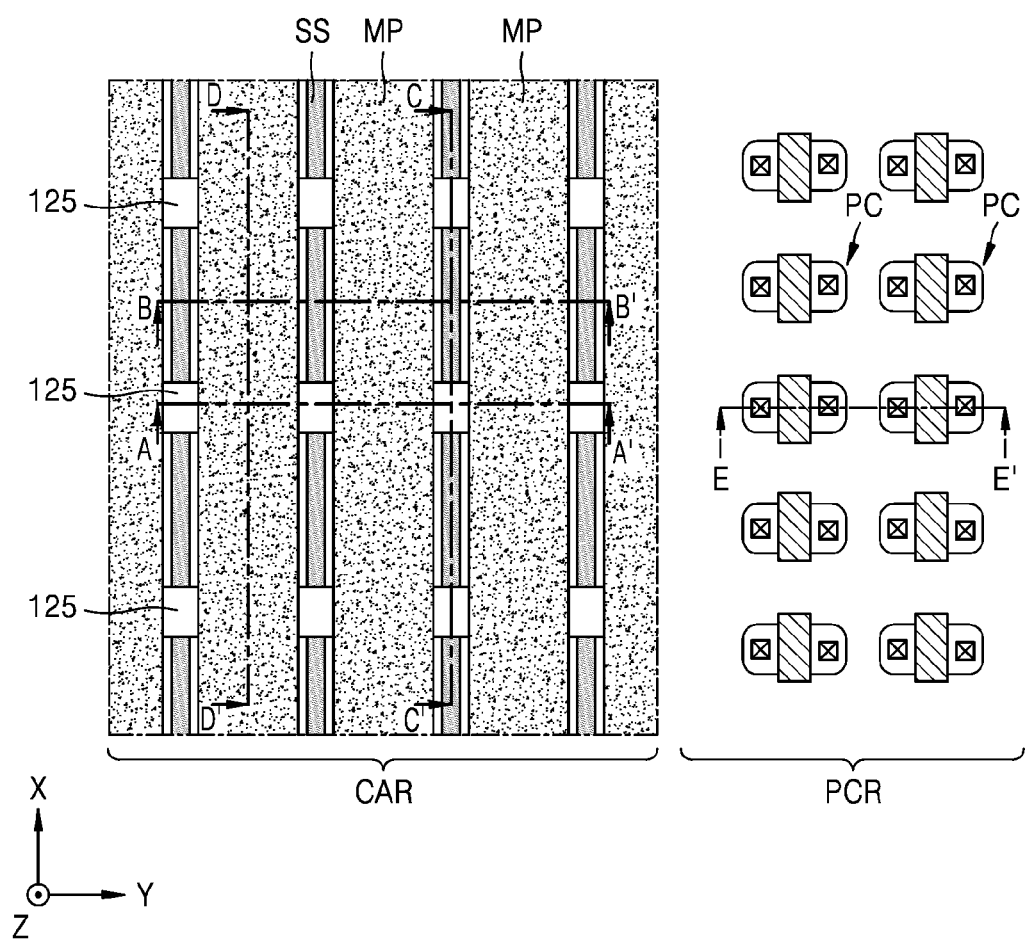
Figure 12B:
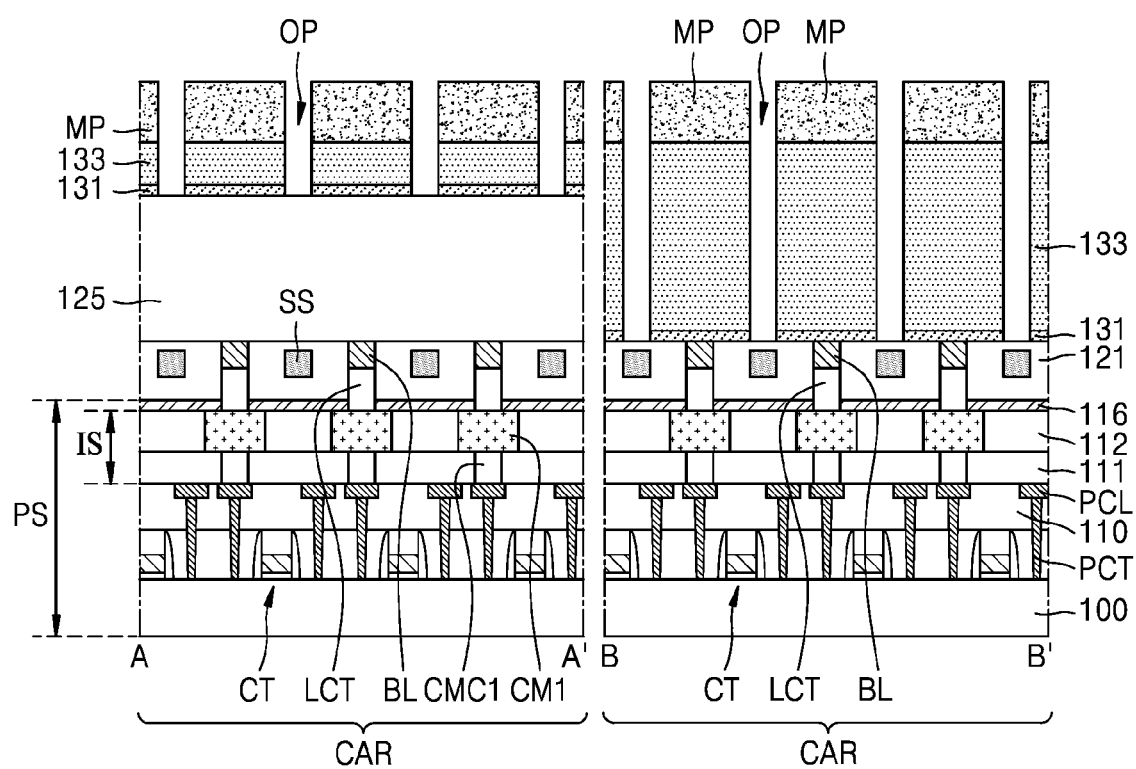
Figure 12C:
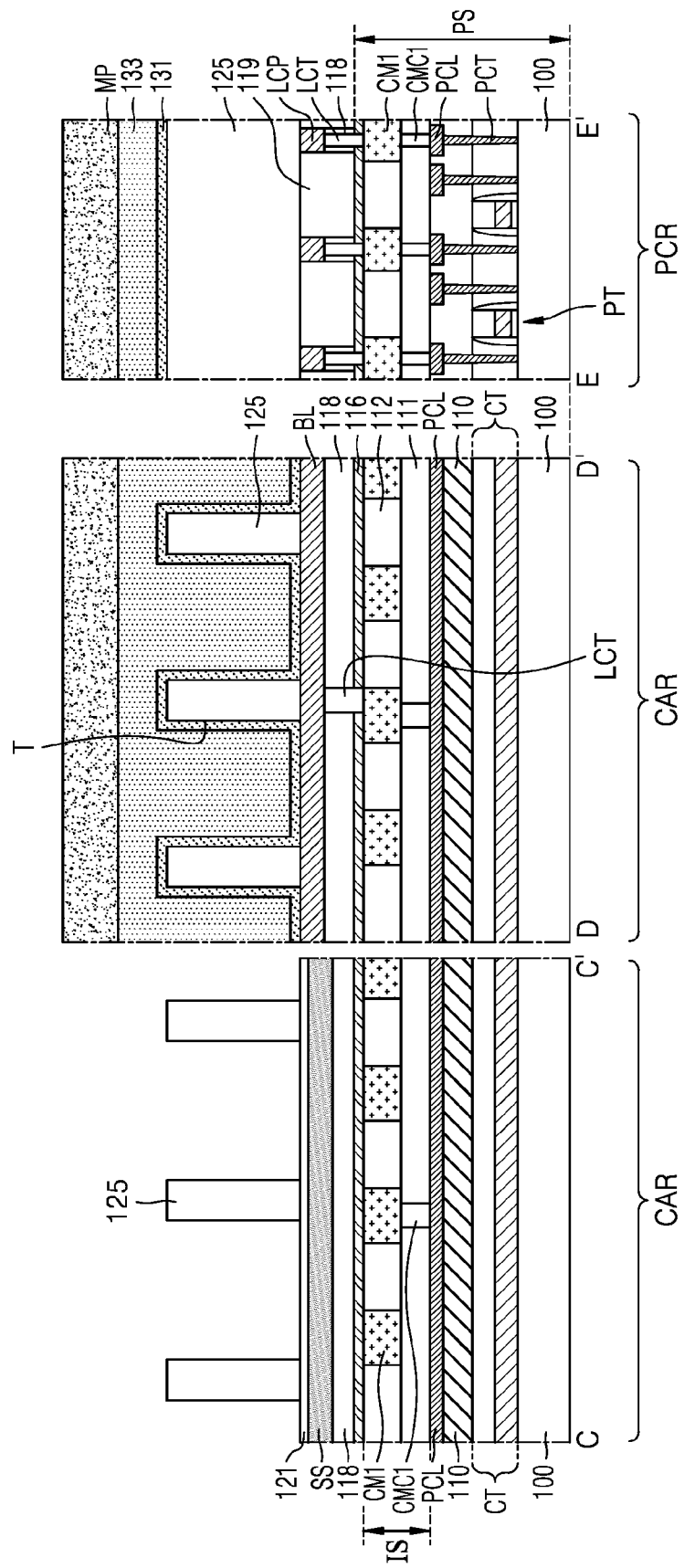
Figure 13A:
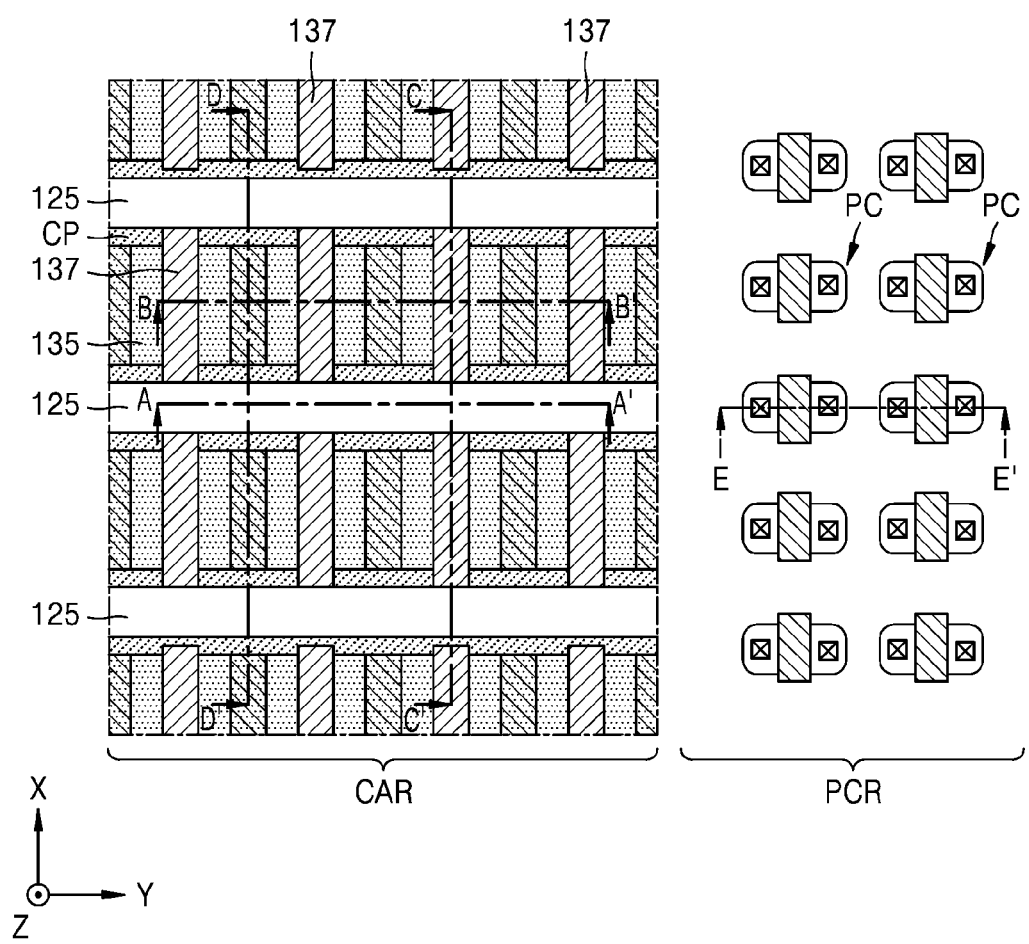
Figure 13B:
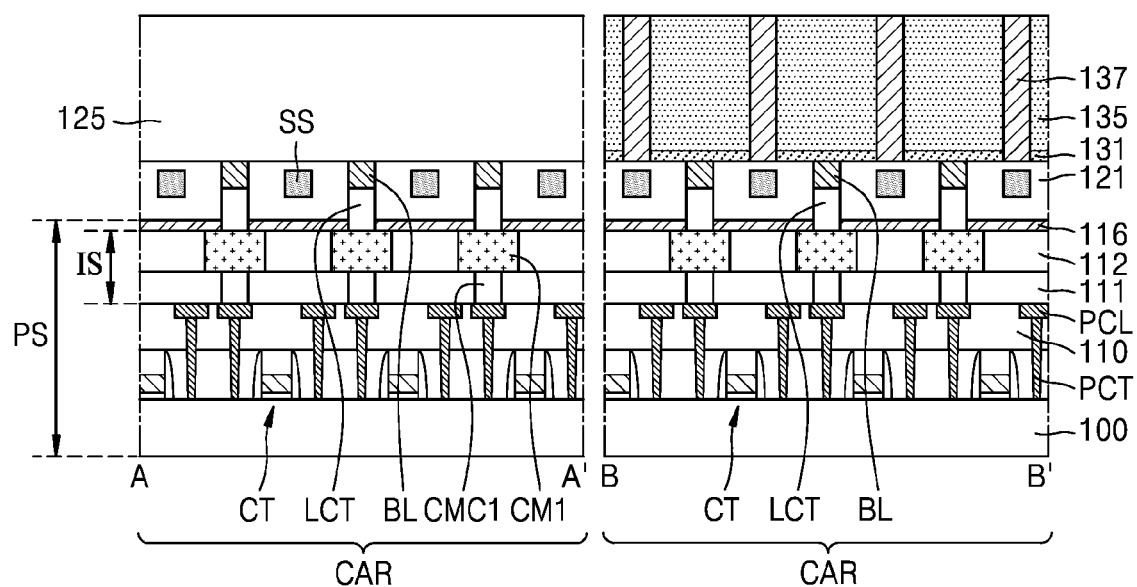
Figure 13C:
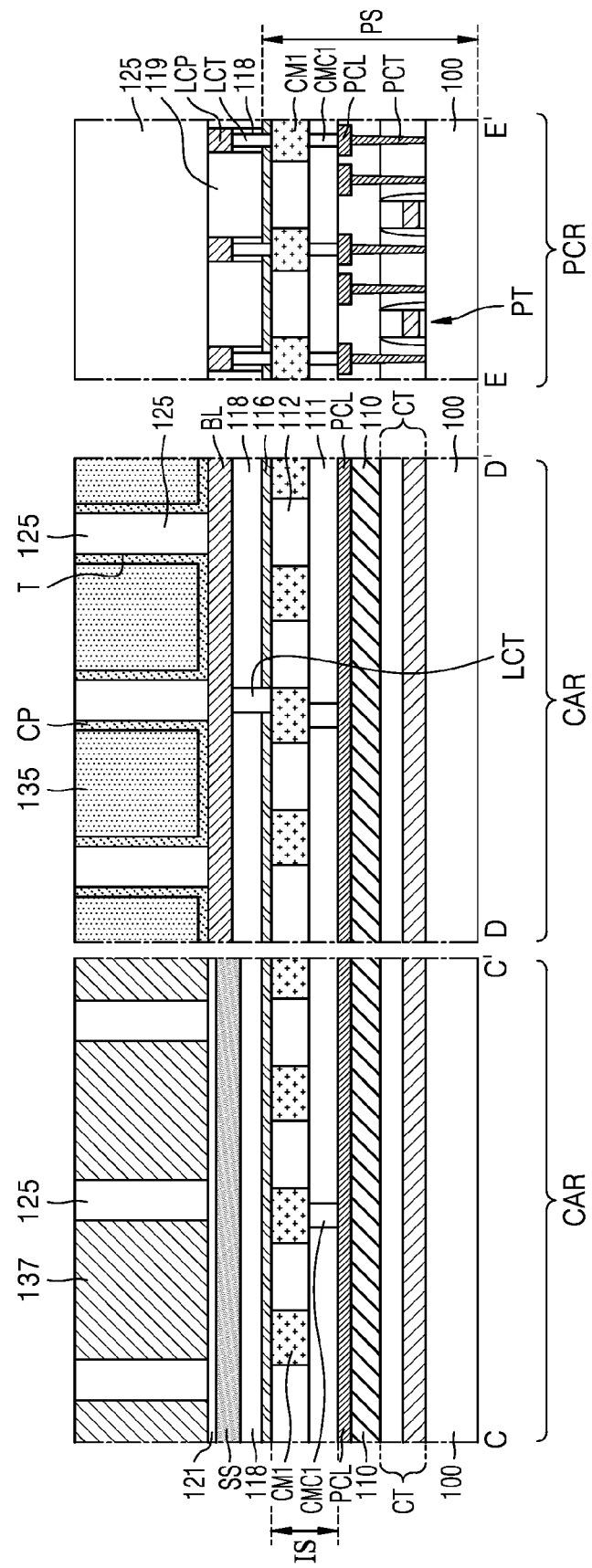
Figure 14A:
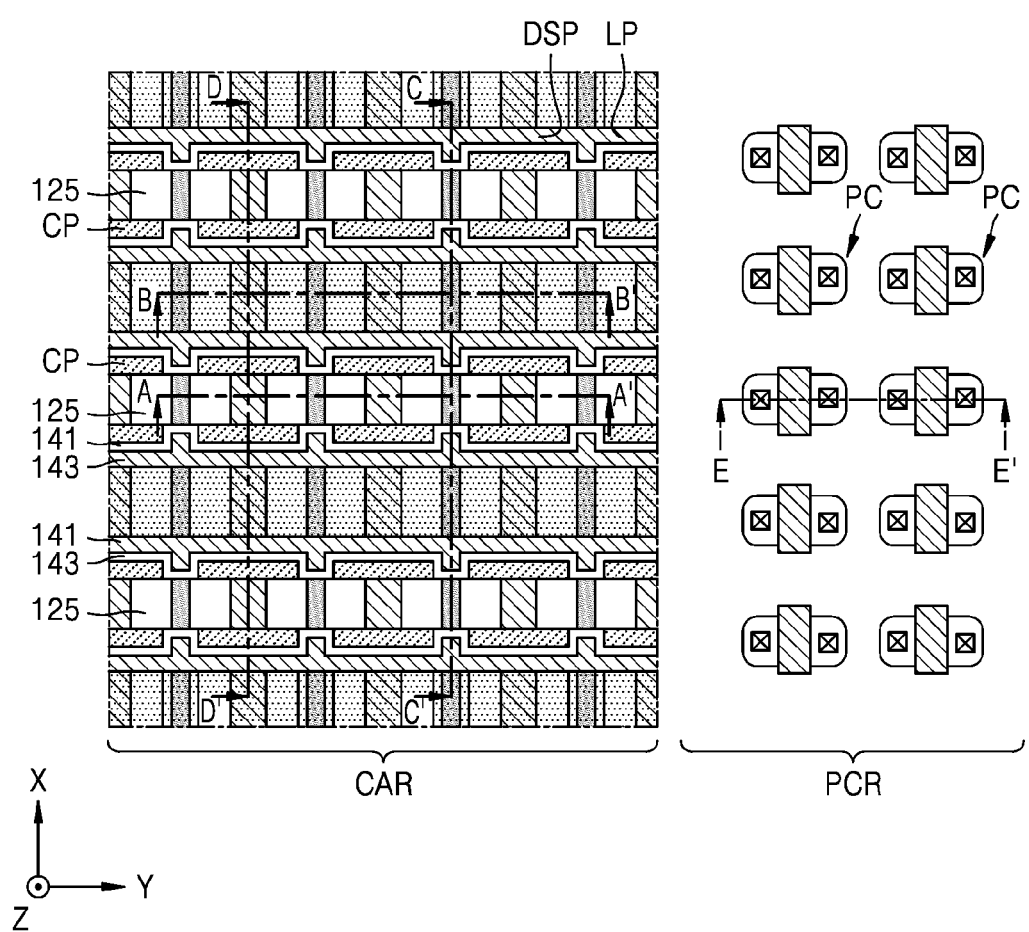
Figure 14B:
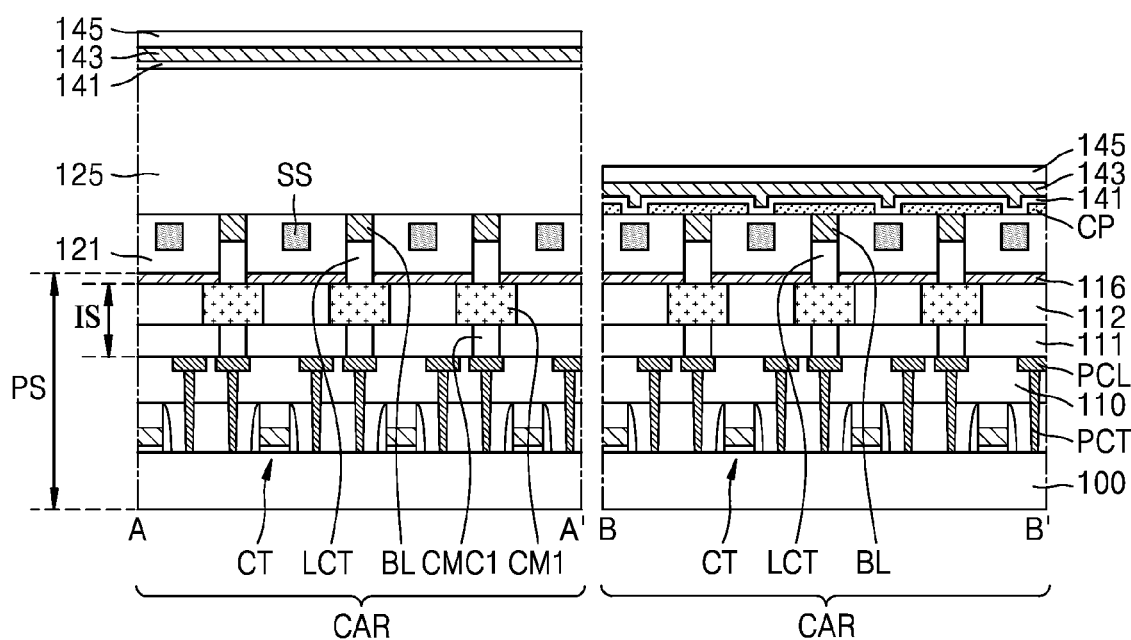
Figure 14C:
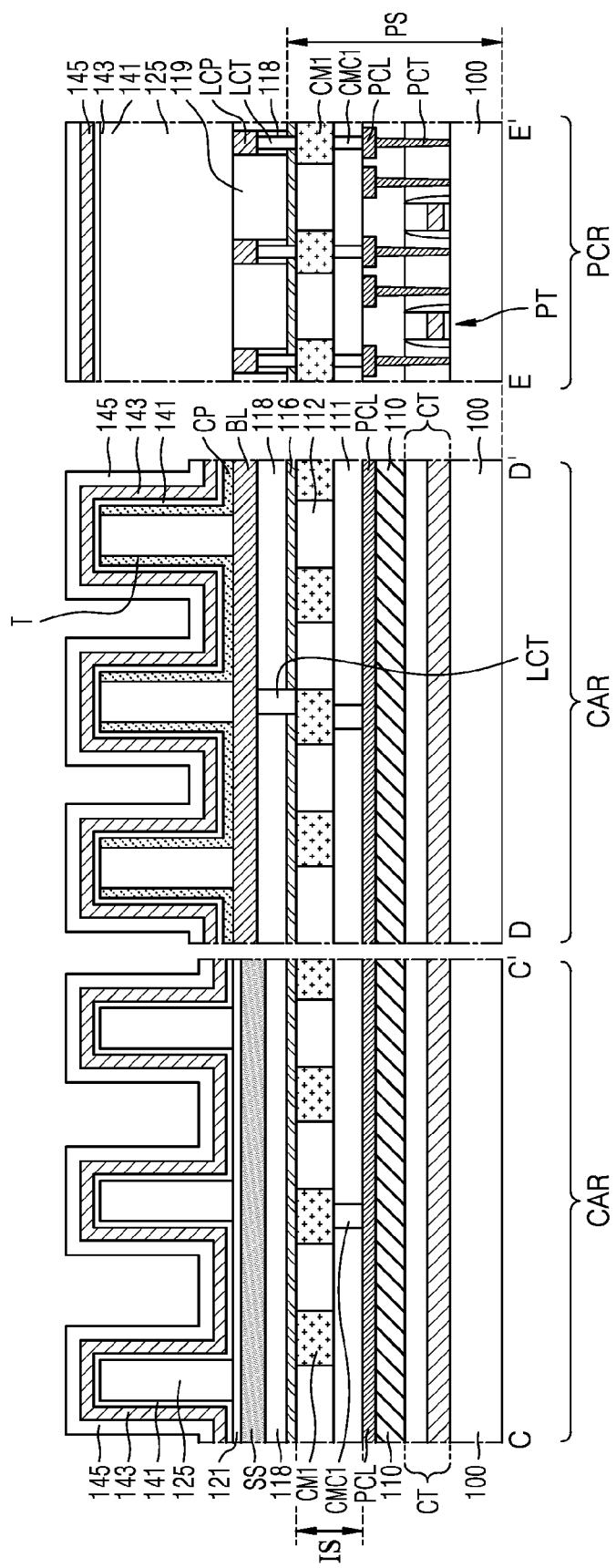
Figure 15A:
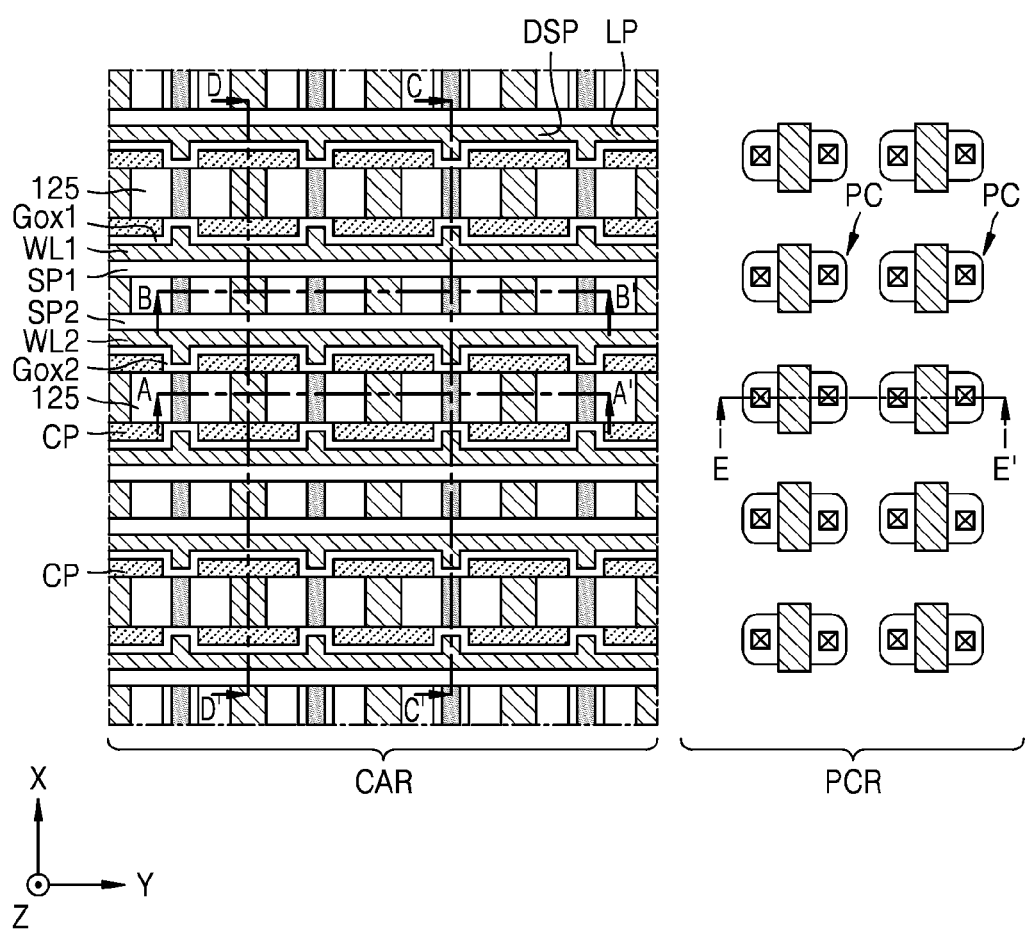
Figure 15B:
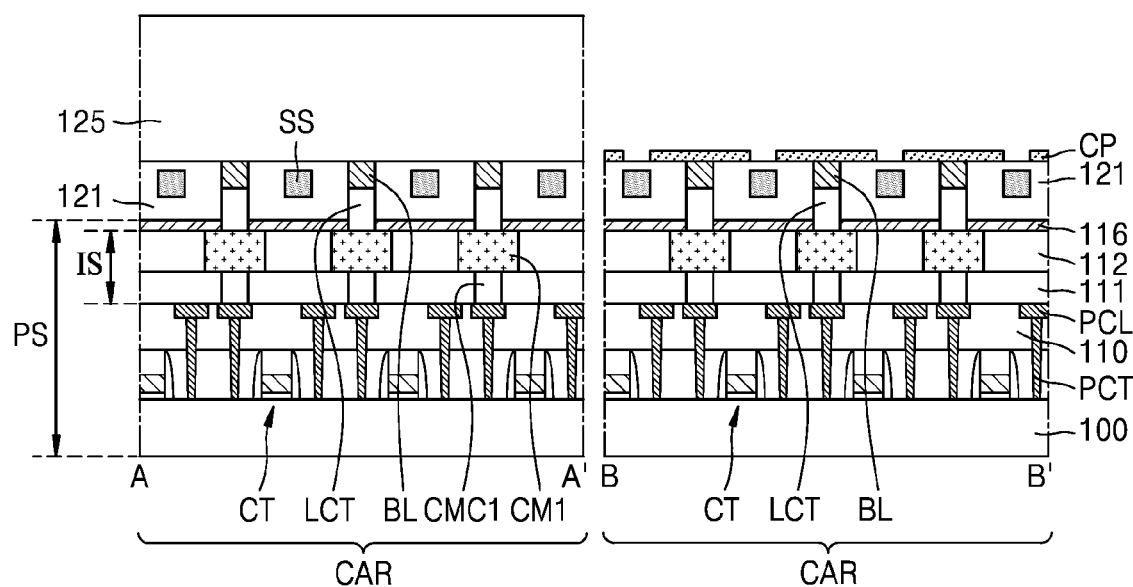
Figure 15C:
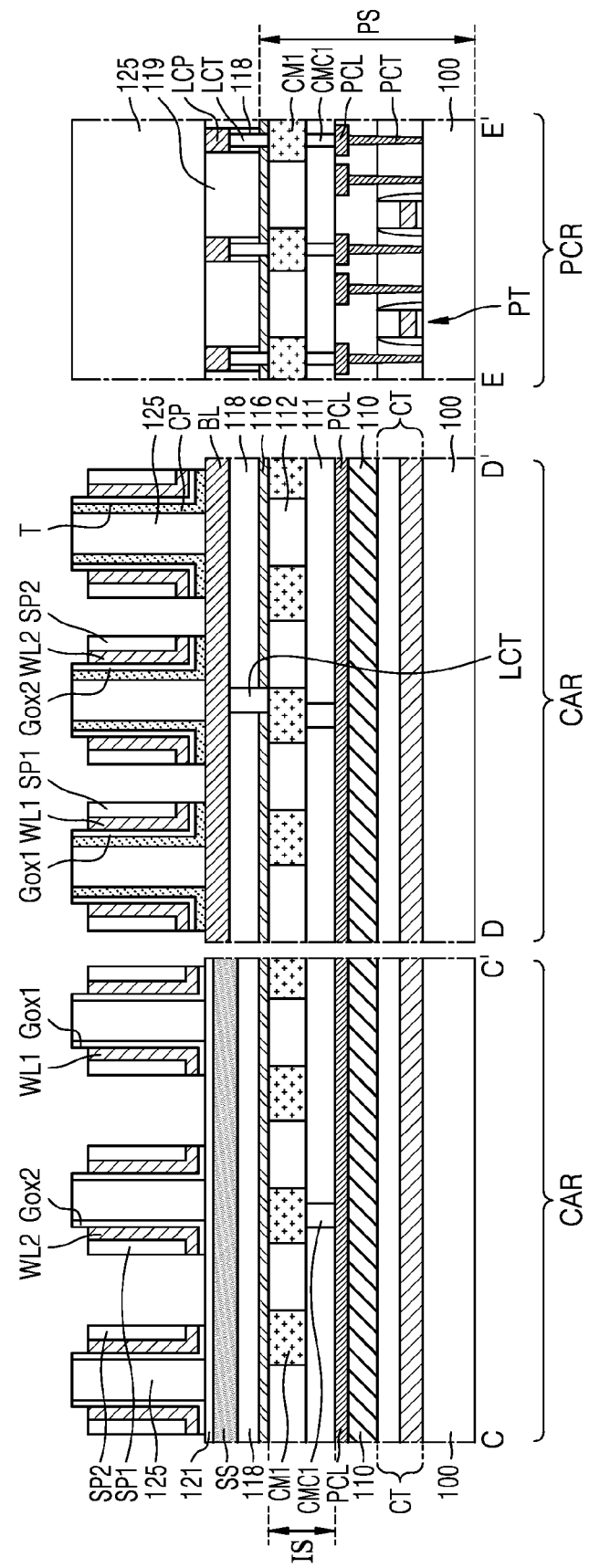

Specifically, FIGS. 8B and 8C show cross-sections taken along lines A-A', B-B', C-C', D-D', and E-E' of FIG. 8A, FIGS. 9B and 9C show cross-sections taken along line A-A', B-B', C-C', D-D', and E-E' of FIG. 9A, FIGS. 10B and 10C show cross-sections taken along line A-A', B-B', C-C', D-D', and E-E' of FIG. 10A, FIGS. 11B and 11C show cross-sections taken along line A-A', B-B', C-C', D-D', and E-E' of FIG. 11A, FIGS. 12B and 12C show cross-sections taken along lines A-A', B-B', C-C', D-D', and E-E' of FIG. 12A, FIGS. 13B and 13C show cross-sections taken along lines A-A', B-B', C-C', D-D', and E-E' of FIG. 13A, FIGS. 14B and 14C show cross-sections taken along lines A-A', B-B', C-C', D-D', and E-E' of FIG. 14A, FIGS. 15B and 15C show cross-sections taken along lines A-A', B-B', C-C', D-D', and E-E' of FIG. 15A, and FIGS. 16A, 16B, 17A, 17B, 18A, 18B, 19A, and 19B show cross-sections taken along lines A-A', B-B', C-C', D-D', and E-E' of FIG. 15A.

Referring to FIGS. 8A, 8B, and 8C together, the peripheral circuit structure PS including the first circuit transistors CT and the second circuit transistors PT may be formed on the semiconductor substrate 100.

The semiconductor substrate 100 may include the cell array region CAR and the peripheral circuit region PCR. In the cell array region CAR, the first circuit transistors CT may be formed on the semiconductor substrate 100. In the peripheral circuit region PCR, the first circuit transistors CT may be formed on the semiconductor substrate 100. The first circuit transistors CT and the second circuit transistors PT may include NMOS and PMOS transistors integrated on the semiconductor substrate 100.

A peripheral circuit insulating layer 110 may be formed on the entire surface of the semiconductor substrate 100. The peripheral circuit insulating layer 110 may surround the first circuit transistors CT, the second circuit transistors PT, and the peripheral circuit wirings PCL on the semiconductor substrate 100. The peripheral circuit insulating layer 110 may include insulating layers stacked in multiple layers. The peripheral circuit insulating layer 110 may include, for example, a silicon oxide layer, a silicon nitride layer, a silicon oxynitride layer, and/or a low-k layer.

The peripheral contact plugs PCT and peripheral circuit wirings PCL may be formed in the peripheral circuit insulating layer 110. The peripheral contact plugs PCT and the peripheral circuit wirings PCL may be electrically connected to the first circuit transistors CT and the second circuit transistors.

The connection wiring structure IS may be formed on the peripheral circuit insulating layer 110. The connection wiring structure IS may include the first wiring insulating layer 111, the second wiring insulating layer 112 stacked on the first wiring insulating layer 111, the first connection wirings CM1 passing through the second wiring insulating layer 112, and the first connection contact plugs CMC1 passing through the first wiring insulating layer 111 to electrically connect the peripheral circuit wirings PCL to the first connection wirings CM1. After the first wiring insulating layer 111 and the first connection contact plugs CMC1 are formed on the peripheral circuit insulating layer 110, the second wiring insulating layer 112 and the first connection wirings CM1 may be formed on the first wiring insulating layer 111. In some embodiments, the first wiring insulating layer 111 and the second wiring insulating layer 112 may be formed together to form an integral body, e.g., one body without any boundary within the integral body. In some embodiments, the first connection wirings CM1 and the first connection contact plugs CMC1 may be formed together through a damascene process to form an integral body. For example, each of the first connection contact plugs CMC1 may be formed as one body with one of the first connection wirings CM1 without any boundary within the one body. In some embodiments, a cover insulating layer 116 may be formed on the second wiring insulating layer 112 of the connection wiring structure IS.

The bit lines BL may be formed on the connection wiring structure IS in the cell array region CAR. The bit lines BL may extend in the first horizontal direction (the X direction) and may be apart from each other in the second horizontal direction (the Y direction). The bit lines BL on the cell array region CAR may be formed by forming a lower insulating layer covering the entire surface of the semiconductor substrate 100 on the connection wiring structure IS or the cover insulating layer 116, forming the lower contact plugs LCT electrically connected to or contacting the first connection wirings CM1 through the lower insulating layer, depositing the lower conductive layer on the lower insulating layer, and then patterning the lower conductive layer and the lower insulating layer in the cell array region CAR. In an etching process for forming the bit lines BL, the lower insulating layer may be etched to form the lower insulating pattern 118, and the cover insulating layer 116 may be exposed.

While the bit lines BL are formed, the lower conductive layer and the lower insulating layer may be patterned in the peripheral circuit region PCR to form the lower conductive patterns LCP. The lower conductive patterns LCP may be electrically connected to the first connection wirings CM1 through the lower contact plugs LCT. The lower conductive patterns LCP and the bit lines BL are portions of the lower conductive layer and may each include the same conductive material. For example, the lower conductive patterns LCP and the bit lines BL may be formed of the same conductive material.

Referring to FIGS. 9A, 9B, and 9C together, after the bit lines BL are formed, the first insulating layer 120 defining the gap region GR is formed between the bit lines BL. The first insulating layer 120 may have a substantially uniform thickness and may be deposited on the entire surface of the semiconductor substrate 100. For example, the first insulating layer 120 may be conformally formed on the substrate 100, e.g., above the bit lines BL. A deposition thickness of the first insulating layer 120 may be less than half an interval between the bit lines BL adjacent to each other. As the first insulating layer 120 is deposited as described above, the gap region GR may be defined between the bit lines BL by the first insulating layer 120. The gap region GR may extend in the first horizontal direction (the X direction) to be parallel with the bit lines BL. Before forming the first insulating layer 120, the charging insulating pattern 119 may be filled between the lower conductive patterns LCP in the peripheral circuit region PCR.

After the first insulating layer 120 is formed, shielding structures SS filling at least a portion of the gap regions GR may be formed on the first insulating layer 120. The shielding structures SS may be formed between the bit lines BL. The shielding structures SS may be formed by forming a shielding film on the first insulating layer 120 to fill the gap region GR and then recessing an upper surface of the shielding film. Upper surfaces of the shielding structures SS may be at a level lower than the upper surfaces of the bit lines BL. The shielding structures SS may include or be formed of, for example, a metal material such as tungsten (W), titanium (Ti), nickel (Ni), or cobalt (Co). Alternatively, the shielding structures SS may include or be formed of, for example, a conductive two-dimensional (2D) material, such as graphene.

In some embodiments, a space between the bit lines BL may be filled with the first insulating layer 120 without forming the shielding structures SS.

Referring to FIGS. 10A, 10B, and 10C together, after the insulating material layer is formed on the shielding structures SS, a planarization process may be performed on the insulating material layer and the first insulating layer, so that the upper surfaces of the bit lines BL are exposed, to form first insulating patterns 121 including a portion of the insulating material layer and a portion of the first insulating layer 120 between the bit lines BL and the shielding structures SS.

The mold insulating pattern 125 may be formed on the first insulating patterns 121 and the bit lines BL. The mold insulating pattern 125 may define trenches T that extend in the second horizontal direction (the Y direction) and are apart from each other in the first horizontal direction (the X direction). The trenches T may be formed across the bit lines BL and may expose portions of the bit lines BL. The mold insulating pattern 125 may include or be formed of an insulating material having etch selectivity with respect to the first insulating pattern 121. The mold insulating pattern 125 may include or be formed of, for example, a silicon oxide layer, a silicon nitride layer, a silicon oxynitride layer, and/or a low-k layer.

An interval between the channel patterns CP shown in FIGS. 4A to 4C may vary according to a width of the mold insulating pattern 125, that is, an interval between the trenches T. Also, an interval between the first and second word lines WL1 and WL2 shown in FIGS. 4A and 4C may vary according to a width of the trenches T.

Referring to FIGS. 11A, 11B, and 11C together, a channel layer 131 may be formed to conformally cover the mold insulating pattern 125 having the trenches T. The channel layer 131 may contact the bit lines BL in the trenches T and cover an upper surface and sidewalls of the mold insulating pattern 125. The channel layer 131 may cover the upper surface of the mold insulating pattern 125, bottom surfaces and inner walls of the trenches T with a substantially uniform thickness. For example, the channel layer 131 may be conformally formed on the upper surface of the mold insulating pattern 125, bottom surfaces and inner walls of the trenches T. The thickness of the channel layer 131 may be less than half the width of the trench T. The channel layer 131 may be formed to have a thickness of several nm to several tens of nm. For example, the channel layer 131 may be formed to have a thickness of about 1 nm to about 15 nm. In some embodiments, the channel layer 131 may be formed to a thickness of about 1 nm to about 10 nm. The channel layer 131 may include or be formed of a semiconductor material, an oxide semiconductor material, or a 2D semiconductor material.

A first sacrificial layer 133 filling the trenches T may be formed on the channel layer 131. The first sacrificial layer 133 may have a substantially flat upper surface. The first sacrificial layer 133 may include or be formed of an insulating material having etch selectivity with respect to the mold insulating pattern 125. In some embodiments, the first sacrificial layer 133 may be formed using a spin on glass (SOG) technology.

Referring to FIGS. 12A, 12B, and 12C together, a mask pattern MP may be formed on the first sacrificial layer 133. The mask pattern MP may be located across the mold insulating pattern 125 and may have openings having a major axis (e.g., extending) in the first horizontal direction (the X direction). The openings of the mask pattern MP may be apart from each other in the second horizontal direction (the Y direction). The openings of the mask pattern MP may be located between the bit lines BL and overlap the shielding structures SS in a plan view (e.g., vertically overlap).

The first sacrificial layer 133 and the channel layer 131 may be sequentially etched using the mask pattern MP as an etching mask to form openings OP exposing the first insulating pattern 121 between the bit lines BL. The openings OP may overlap the shielding structures SS in a plan view. The openings OP may extend in the first horizontal direction (the X direction) and may be apart from each other in the second horizontal direction (the Y direction).

By forming the openings OP, the channel layer 131 may be separated into a plurality of pieces apart from each other in the second horizontal direction (the Y direction). After forming the openings OP, the mask pattern MP may be removed.

Referring to FIGS. 12A, 12B, 12C, 13A, 13B, and 13C together, a second sacrificial layer filling the openings OP may be formed. The second sacrificial layer may include or be formed of the same material as that of the first sacrificial layer 133.

After forming the second sacrificial layer, a planarization process may be performed on the first sacrificial layer 133, the second sacrificial layer, and the plurality of separated channel layers 131 so that the upper surface of the mold insulating pattern 125 is exposed, thereby forming first sacrificial patterns 135, second sacrificial patterns 137, and channel patterns CP.

The channel patterns CP may be formed to be apart from each other in the first horizontal direction (the X direction) and the second horizontal direction (the Y direction). Each of the channel patterns CP may include a horizontal channel portion contacting the bit line BL and a pair of vertical channel portions extending from the horizontal channel portion and contacting sidewalls of each trench T. The channel patterns CP may be apart from each other in the first horizontal direction (the X direction) by the mold insulating pattern 125 and may be apart from each other in the second direction by the second sacrificial patterns 137.

The first sacrificial pattern 135 may be formed on each channel pattern CP, and the second sacrificial pattern 137 may be formed between the channel patterns CP adjacent to each other in the second horizontal direction (the Y direction) and between the first sacrificial patterns 135. After the channel patterns CP are formed, the first and second sacrificial patterns 135 and 137 may be removed to expose surfaces of the channel patterns CP.

Referring to FIGS. 14A, 14B, and 14C together, a gate insulating layer 141, a gate conductive layer 143, and a spacer layer 145 may be sequentially deposited to conformally cover the channel patterns CP. In some embodiments, a channel length of the vertical channel transistors may be adjusted according to a deposition thickness of the spacer layer 145.

The gate insulating layer 141, the gate conductive layer 143, and the spacer layer 145 may be formed to cover the horizontal and vertical channel portions of the channel patterns CP with a substantially uniform thickness. The sum of the thicknesses of the gate insulating layer 141, the gate conductive layer 143, and the spacer layer 145 may be less than half the width of the trench T. The spacer layer 145 may define a gap space in the trench T and may be deposited on the gate conductive layer 143.

The spacer layer 145 may include or be formed of an insulating material. The spacer layer 145 may include or be formed of, for example, silicon nitride (SiN), silicon oxynitride (SiON), silicon carbide (SiC), silicon carbon nitride (SiCN), or a combination thereof.

Referring to FIGS. 14A, 14B, 14C, 15A, 15B, and 15C together, an anisotropic etching process is performed on the spacer layer 145 to form a pair of first spacer SP1 and second spacer SP2 separated from each other on the gate conductive layer 143.

Thereafter, a portion of the gate conductive layer 143 may be removed to form a pair of first word lines WL1 and second word lines WL2 separated from each other in each trench T. The first word lines WL1 and the second word lines WL2 may be formed by performing an anisotropic etching process on the pair of gate conductive layers 143 using the pair of first and second spacers SP1 and SP2 as an etch mask.

Upper surfaces of the first word lines WL1 and the second word lines WL2 may be at a vertical level lower than the upper surface of the channel pattern CP. In some embodiments, an etching process may be additionally performed to remove upper portions of the first word lines WL1 and the second word lines WL2.

During the anisotropic etching process for the gate conductive layer 143, a portion of the gate insulating layer 141 may be removed together to expose a horizontal channel portion of the channel pattern CP. A portion of the gate insulating layer 141 may be removed to form first gate insulating patterns Gox1 and second gate insulating patterns Gox2.

In another embodiment, during the anisotropic etching process for the gate conductive layer 143, the horizontal channel portion of the channel pattern CP may be etched to expose portions of the bit lines BL in each trench, and a pair of first channel patterns (CP1 of FIG. 5C) and second channel patterns (CP2 in FIG. 5C) and a pair of gate insulating patterns (Gox1 in FIG. 5C) and second gate insulating patterns (Gox2 in FIG. 5C) separated from each other may be formed in each trench.

Figure 16A:
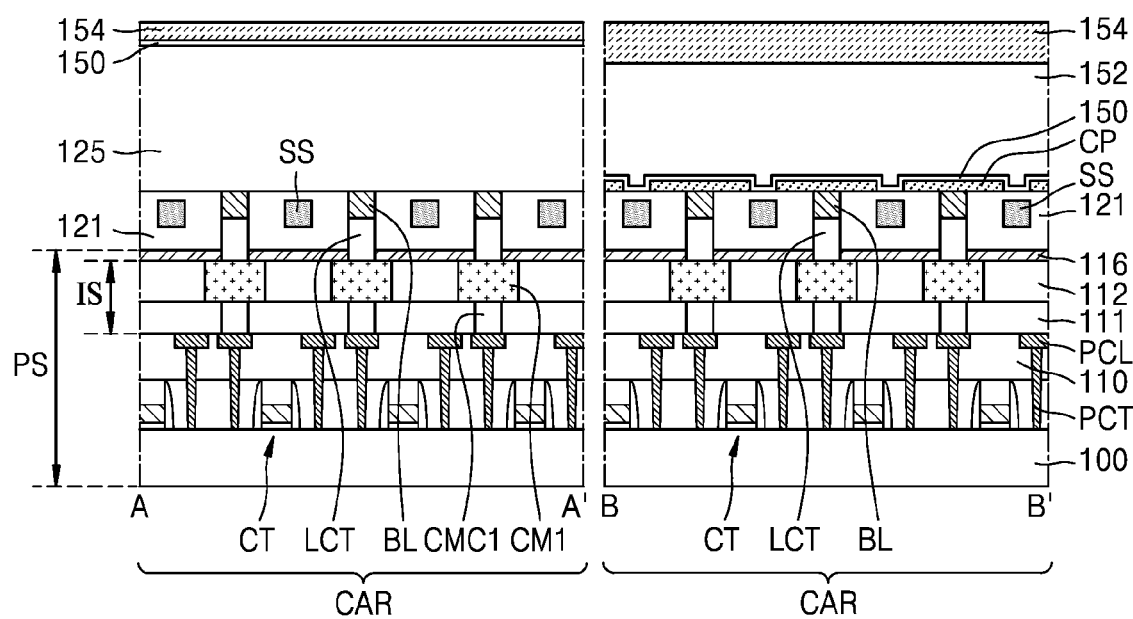
Figure 16B:
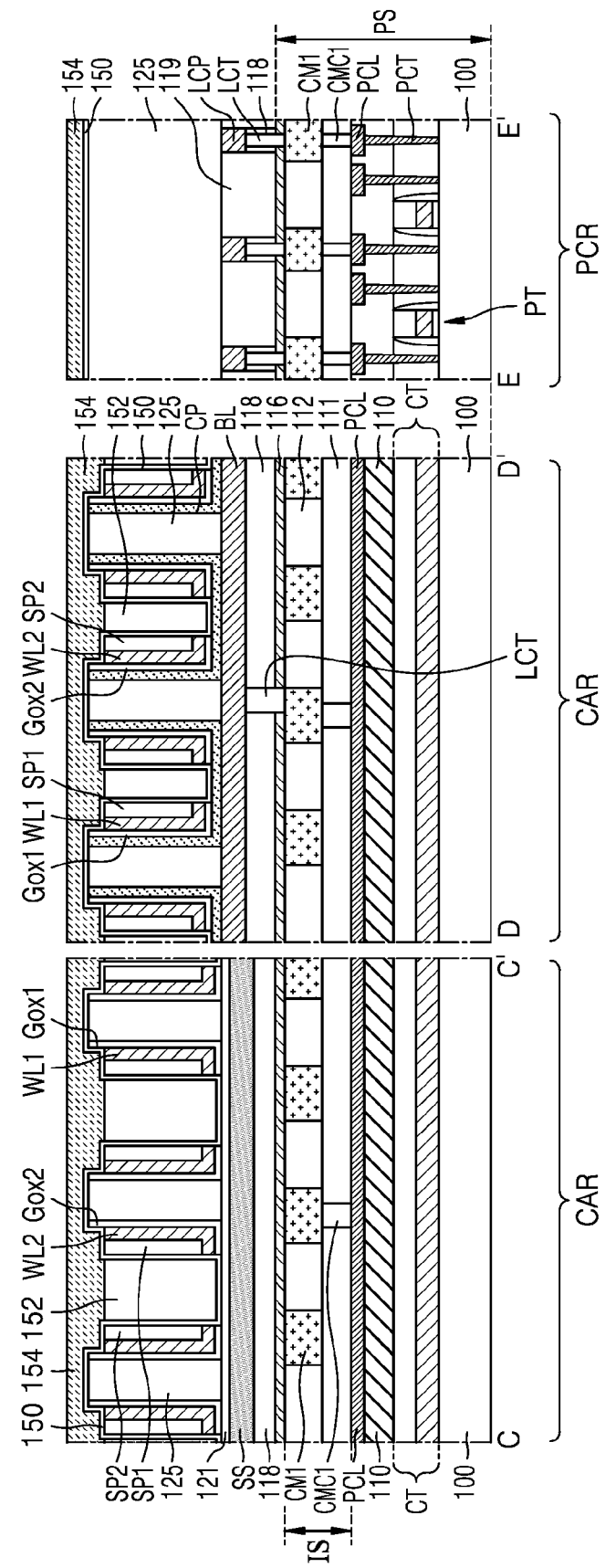

Referring to FIGS. 16A and 16B together, a first capping layer 150 may be conformally formed on the entire surface of the semiconductor substrate 100. The first capping layer 150 may include or be formed of, for example, silicon nitride (SiN), silicon oxynitride (SiON), silicon carbide (SiC), silicon carbon nitride (SiCN), and/or a combination thereof.

The first capping layer 150 may cover the surface of the channel patterns CP between the first word line WL1 and the second word line WL2. In another embodiment, before forming the first capping layer 150, the first spacers SP1 and the second spacers SP2 may be removed, so that the first capping layer 150 may directly cover surfaces of the first word line WL1 and the second word line WL2.

Subsequently, a second insulating layer 152 covering the first capping layer 150 and a second capping layer 154 may be sequentially formed. The second insulating layer 152 may include or be formed of an insulating material, different from that of the first capping layer 150. The second capping layer 154 may include or be formed of the same material as that of the first capping layer 150. In some embodiments, the second capping layer 154 may be omitted.

Figure 17A:
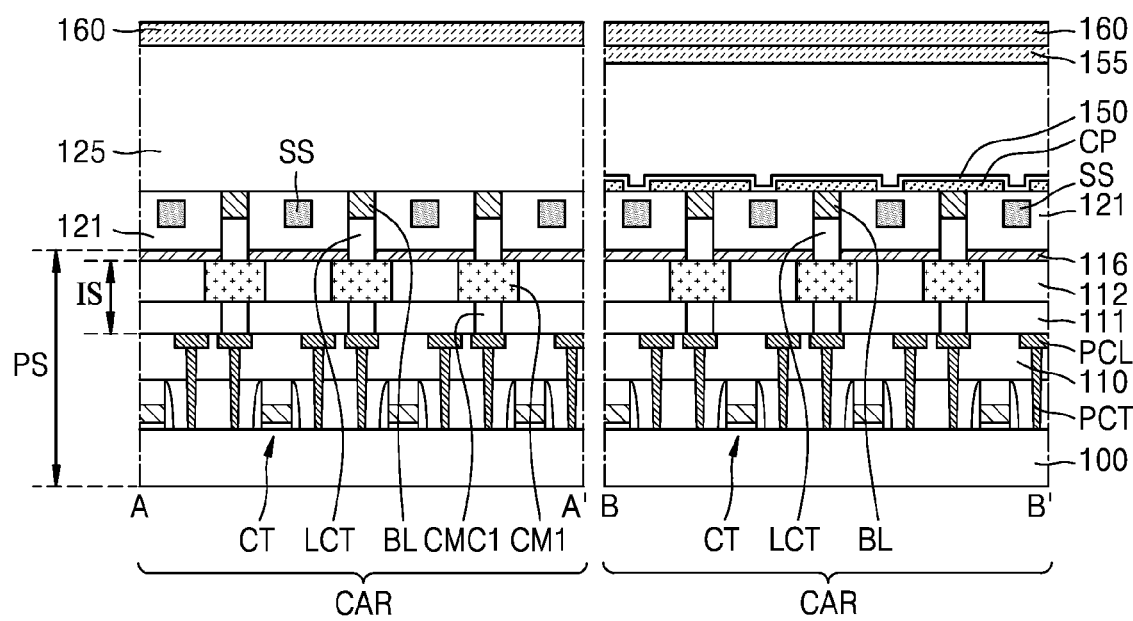
Figure 17B:
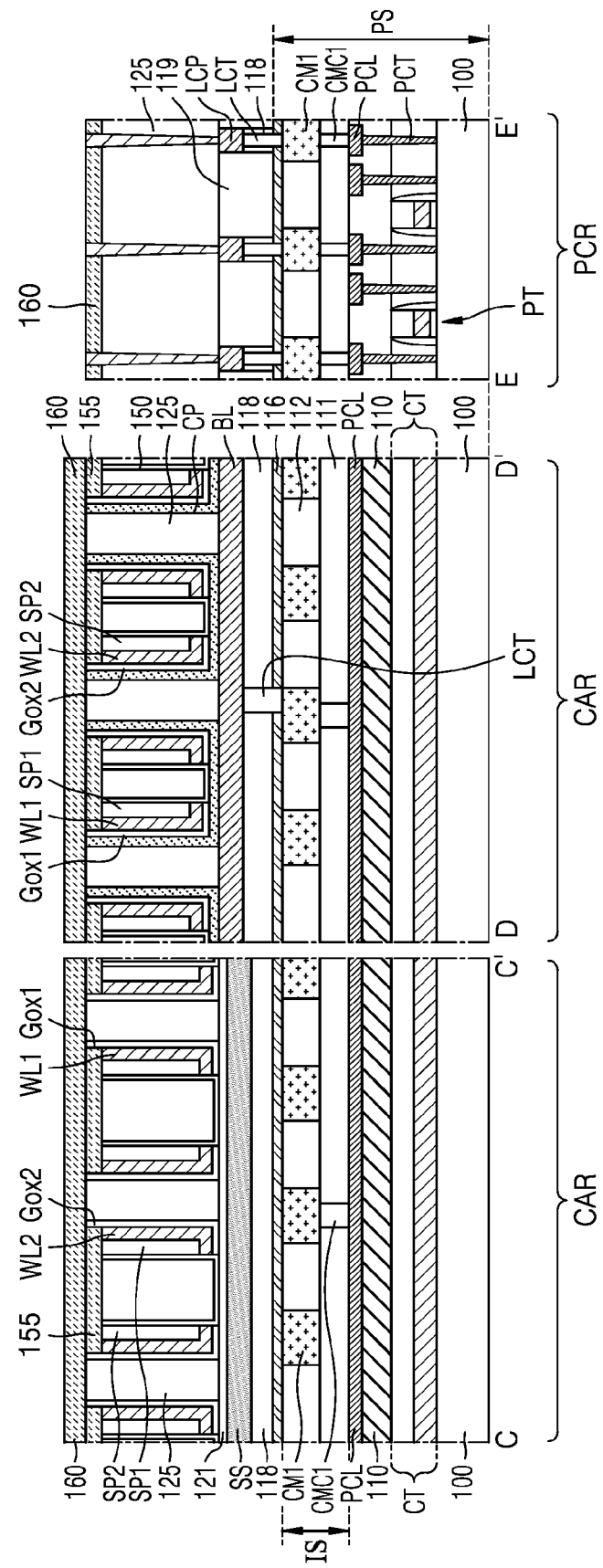
Figure 18A:
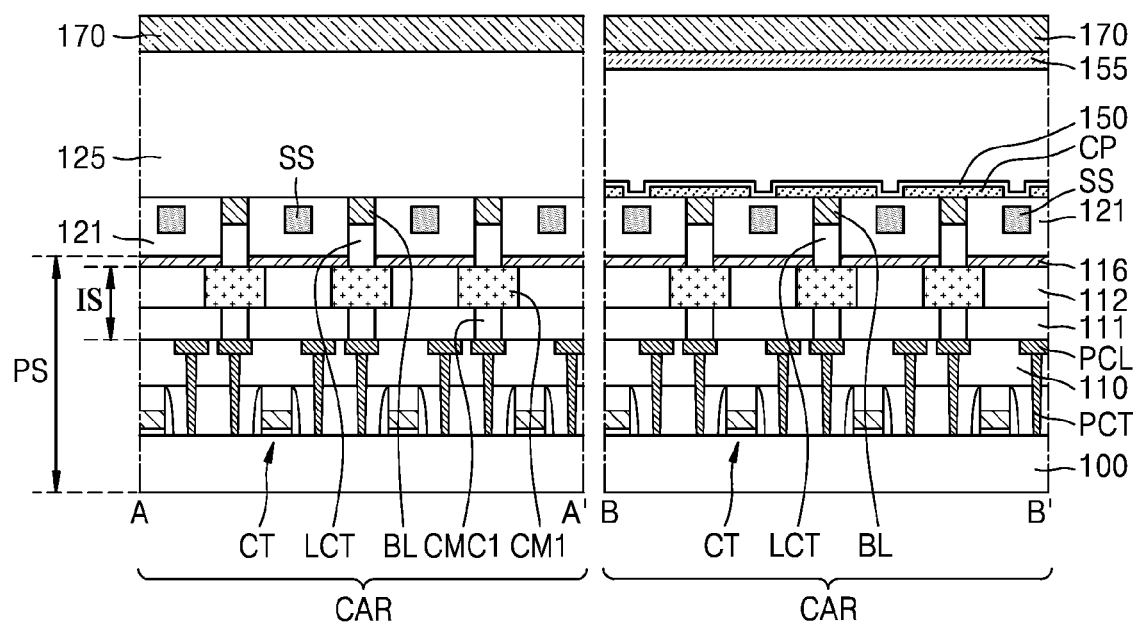
Figure 18B:
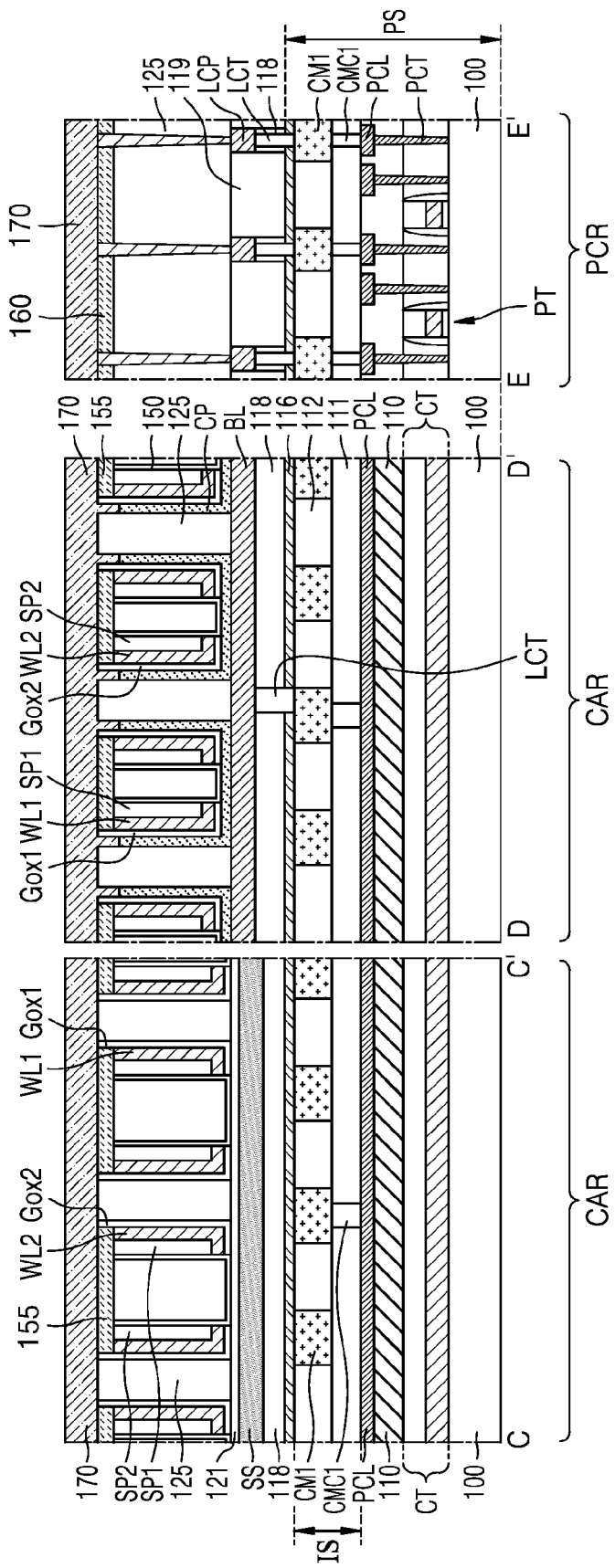
Figure 19A:
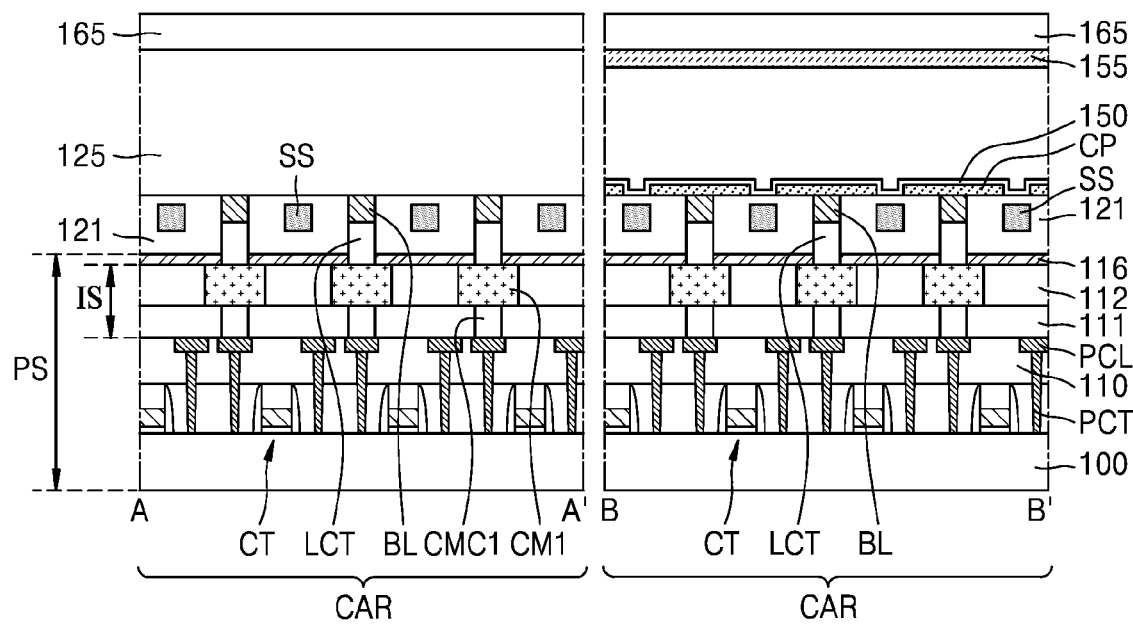
Figure 19B:
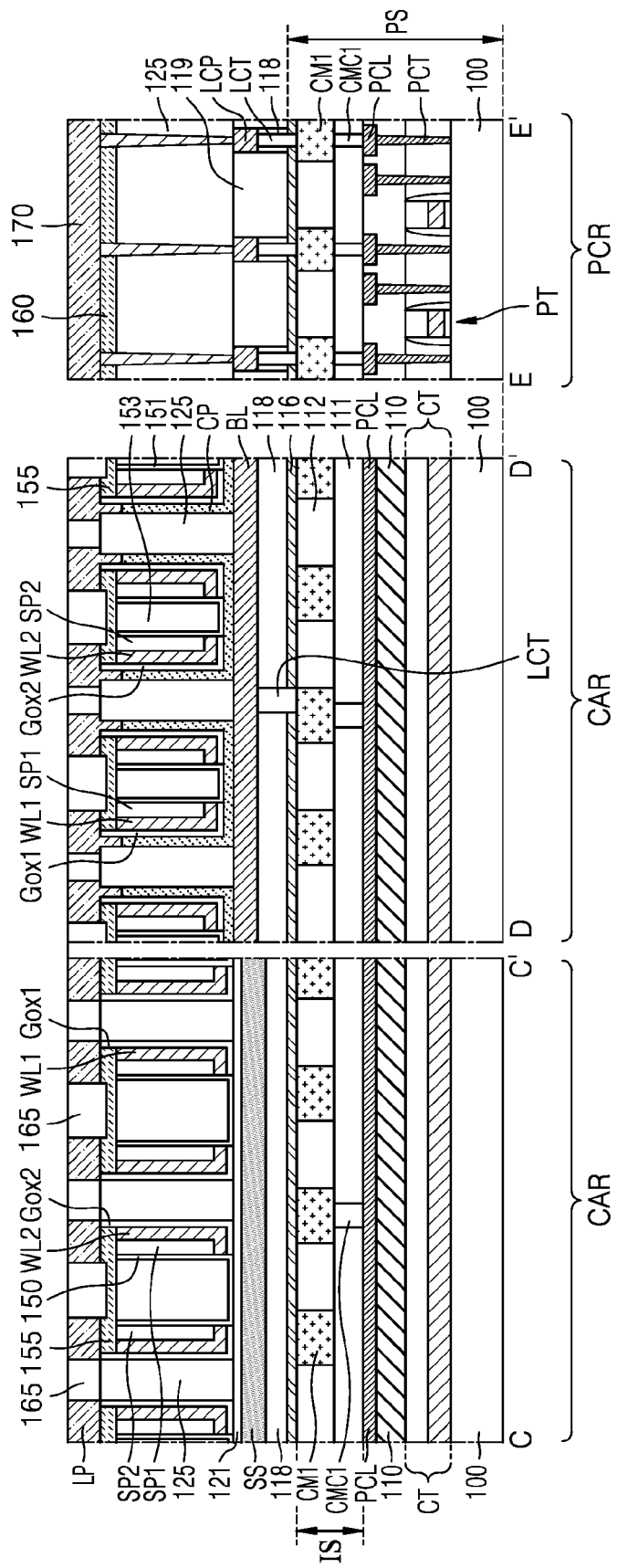

Referring to FIGS. 17A and 17B together, a planarization process may be performed on the first capping layer 150, the second insulating layer 152, and the second capping layer 154 so that the upper surface of the mold insulating pattern 125 is exposed, thereby forming the first capping pattern 151, the second insulating pattern 153, and the second capping pattern 155. The upper surface of the second capping pattern 155 and an upper surface of the mold insulating pattern 125 may be coplanar with each other.

After forming the first capping pattern 151, the second insulating pattern 153, and the second capping pattern 155, an etch stop layer 160 may be formed on the entire surface of the semiconductor substrate 100. The etch stop layer 160 may include or be formed of an insulating material having etch selectivity with respect to the mold insulating pattern 125. The etch stop layer 160 may include or be formed of, for example, silicon nitride (SiN), silicon oxynitride (SiON), silicon carbide (SiC), silicon carbon nitride (SiCN), a combination thereof, or the like.

After the etch stop layer 160 is formed, lower conductive vias LVP may be formed to be electrically connected to and/or contact the lower conductive pattern LCP through the mold insulating pattern 125 in the peripheral circuit region PCR.

Referring to FIGS. 17A, 17B, 18A, and 18B together, after the lower conductive vias LVP is formed, a mask pattern exposing the cell array region CAR may be formed on the etch stop layer 160, and the etch stop layer 160 may be subsequently etched using the mask pattern as an etch mask to expose an upper surface of the mold insulating pattern 125 and the upper surfaces of the channel patterns CP of the cell array region CAR.

Subsequently, an etching process may be performed on portions of the channel patterns CP so that upper surfaces of the channel patterns CP are located at a vertical level lower than the upper surface of the mold insulating pattern 125, thereby forming recess regions between the mold insulating pattern 125 and the first gate insulating patterns Gox1 and the second gate insulating patterns Gox2. The upper surfaces of the channel patterns CP may be at a vertical level lower than the upper surfaces of the first word lines WL1 and the second word lines WL2.

Subsequently, a conductive layer 170 covering the entire surface of the semiconductor substrate 100 and filling the recess regions may be formed. The conductive layer 170 may include or be formed of, for example, doped polysilicon, Al, Cu, Ti, Ta, Ru, W, Mo, Pt, Ni, Co, TiN, TaN, WN, NON, TiAl, TiAlN, TiSi, TiSiN, TaSi, TaSiN, RuTiN, NiSi, CoSi, IrO$_x$, RuO$_x$, or a combination thereof.

Referring to FIGS. 18A, 18B, 19A, and 19B together, the conductive layer 170 may be patterned to form landing pads LP that are in contact with the vertical portions of the channel patterns CP and are arranged to be apart from each other. Upper conductive patterns UCP electrically connected to and/or contact the lower conductive vias LVP may be formed in the peripheral circuit region PCR together with the landing pads LP.

After the landing pads LP and the upper conductive patterns UCP are formed, a third insulating pattern 165 filling the space between the landing pads LP and the upper conductive patterns UCP may be formed.

Subsequently, referring to FIGS. 4A, 4B, and 4C together, an etch stop layer 171 covering the upper surfaces of the landing pads LP and the upper conductive patterns UCP may be formed.

Data storage patterns DSP may be respectively formed on the landing pads LP. The data storage patterns DSP may pass through the etch stop layer 171 to contact the landing pads LP, respectively. In some embodiments, when the data storage patterns DSP include capacitors, lower electrodes, a capacitor dielectric layer, and an upper electrode may be sequentially formed, and the lower electrodes may pass through the etch stop layer 171 to be electrically connected to and/or contact the landing pads LP, respectively.

After the data storage patterns DSP are formed, a capping insulating layer 173 covering the entire surface of the semiconductor substrate 100 may be formed. The upper conductive vias UVP may pass through the capping insulating layer 173 in the peripheral circuit region PCR to be electrically connected to and/or contact the upper conductive patterns UCP. Connection lines CL electrically connected to and/or contact the upper conductive vias UVP may be formed on the capping insulating layer 173 in the peripheral circuit region PCR.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be interchangeably combined with components and/or features of other embodiments unless the context indicates otherwise.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
a semiconductor substrate;
a peripheral circuit structure disposed on the semiconductor substrate; and
a cell array structure located on the peripheral circuit structure and including a memory cell array including a plurality of memory cells,
wherein the peripheral circuit structure includes:
a first transistor integrated on an upper surface of the semiconductor substrate, and
a connection wiring structure located on the first transistor and including a first connection wiring and a first connection contact plug electrically connecting the first connection wiring to the first transistor,
wherein each of the plurality of memory cells of the cell array structure includes:
a bit line extending in a first horizontal direction and electrically connected to the first connection wiring;
a channel pattern including a horizontal channel portion on the bit line and a vertical channel portion vertically protruding from the horizontal channel portion;
a first word line extending in a second horizontal direction crossing the first horizontal direction on the channel pattern;
a first gate insulating pattern located between the channel pattern and the first word line;
a landing pad connected to the vertical channel portion of the channel pattern; and
a data storage pattern disposed on the landing pad,
wherein the first connection wiring and the first connection contact plug electrically connecting the bit line to the first transistor overlap the plurality of memory cells in a vertical direction, and
wherein the peripheral circuit structure includes a sense amplifier region, a sub-word line driver region, and a coupling region, and
wherein a portion of at least one of the sense amplifier region, the sub-word line driver region, and the coupling region overlaps the plurality of memory cells in the vertical direction.

2. The semiconductor memory device of claim 1, wherein the first transistor constitutes a sense amplifier located in the sense amplifier region.

3. The semiconductor memory device of claim 1, wherein the connection wiring structure further includes:
a second connection wiring including a connection pad on the first connection wiring and a connection wiring line extending in the first horizontal direction; and
a second connection contact plug connecting the second connection wiring to the first connection wiring,
wherein the bit line is electrically connected to the first transistor through the connection pad and the second connection contact plug.

4. The semiconductor memory device of claim 3, further comprising:
a second transistor integrated on the upper surface of the semiconductor substrate and configuring a sub-word line driver located in the sub-word line driver region,
wherein the connection wiring line is electrically connected to the second transistor through the second connection contact plug, the first connection wiring, and the first connection contact plug, and
wherein the second connection contact plug overlaps the plurality of memory cells in the vertical direction.

5. The semiconductor memory device of claim 1, wherein the first word line includes a horizontal portion on the horizontal channel portion of the channel pattern and a vertical portion, on the vertical channel portion, protruding from the horizontal portion in the vertical direction.

6. The semiconductor memory device of claim 5, wherein
the horizontal portion of the first word line has a first thickness on an upper surface of the horizontal channel portion, and
the vertical portion of the first word line has a second thickness on a sidewall of the vertical channel portion, wherein the second thickness is substantially equal to the first thickness.

7. The semiconductor memory device of claim 5, wherein at least a portion of the horizontal portion of the first word line is buried in an upper portion of the bit line.

8. The semiconductor memory device of claim 1, further comprising:
a second word line,
wherein the first word line and the second word line are symmetrically disposed on the horizontal channel portion,
wherein each of the first word line and the second word line includes a horizontal portion on the horizontal channel portion and a vertical portion, on the vertical channel portion, protruding from the horizontal portion in the vertical direction.

9. The semiconductor memory device of claim 8, further comprising:
a second gate insulating pattern apart from the first gate insulating pattern and between the second word line and the channel pattern.

10. A semiconductor memory device comprising:
a semiconductor substrate;
a peripheral circuit structure including a sense amplifier region disposed on the semiconductor substrate, in which a sense amplifier is located, a sub-word line driver region in which a sub-word line driver is located, and a coupling region in which a driving circuit driver and a switch for driving the sub-word line driver or the sense amplifier are located; and
a cell array structure located on the peripheral circuit structure and including a memory cell array including a plurality of memory cells each including a selection device and a data storage device,
wherein the selection device is a vertical channel transistor,
wherein at least a portion of at least one of the sense amplifier region, the sub-word line driver region, and the coupling region overlaps the plurality of memory cells in a vertical direction, and
wherein an electrical path of the plurality of memory cells and the sense amplifier overlaps the plurality of memory cells in the vertical direction.

11. The semiconductor memory device of claim 10, wherein at least a portion of the sense amplifier region overlaps the plurality of memory cells in the vertical direction.

12. The semiconductor memory device of claim 11, wherein
the peripheral circuit structure includes:
a first transistor integrated on an upper surface of the semiconductor substrate and constituting the sense amplifier; and
a connection wiring structure located on the first transistor and including a first connection wiring and a first connection contact plug electrically connecting the first connection wiring to the first transistor, wherein each of the plurality of memory cells includes:
a bit line extending in a first horizontal direction and electrically connected to the first connection wiring;
a channel pattern including a horizontal channel portion on the bit line and a vertical channel portion vertically protruding from the horizontal channel portion;
a word line extending in a second horizontal direction intersecting with the first horizontal direction on the channel pattern;
a gate insulating pattern located between the channel pattern and the word line;
a landing pad electrically connected to the vertical channel portion of the channel pattern; and
a data storage pattern disposed on the landing pad,
wherein the first connection wiring and the first connection contact plug electrically connecting the bit line to the first transistor vertically overlap the plurality of memory cells.

13. The semiconductor memory device of claim 12, wherein
the peripheral circuit structure further includes a second transistor integrated on the upper surface of the semiconductor substrate and constituting the sub-word line driver,
wherein the connection wiring structure further includes:
a second connection wiring including a connection pad on the first connection wiring and a connection wiring line extending in the first horizontal direction; and
a second connection contact plug electrically connecting the second connection wiring to the first connection wiring,
wherein the bit line is electrically connected to the first transistor through the connection pad and the second connection contact plug, and
wherein the connection wiring line is electrically connected to the second transistor through the second connection contact plug, the first connection wiring, and the first connection contact plug overlapping the plurality of memory cells in the vertical direction.

14. The semiconductor memory device of claim 12, wherein
the peripheral circuit structure further includes:
a peripheral contact plug electrically connected to the first transistor; and
a peripheral circuit wiring located between the peripheral contact plug and the first connection wiring.

15. The semiconductor memory device of claim 11, wherein
the sense amplifier region is positioned on a first horizontal direction side of the memory cell array, and the sub-word line driver region is positioned on a second horizontal direction side of the memory cell array, in a plan view.

16. The semiconductor memory device of claim 11, wherein the sense amplifier region is positioned on a second horizontal direction side of the memory cell array, and the sub-word line driver region is positioned on a first horizontal direction side of the memory cell array, in a plan view.

17. A semiconductor memory device comprising:
a semiconductor substrate;
a peripheral circuit structure including a sense amplifier region disposed on the semiconductor substrate, in which a sense amplifier is located, a sub-word line driver region in which a sub-word line driver is located, and a coupling region in which a driving circuit driver and a switch for driving the sub-word line driver or the sense amplifier are located; and
a cell array structure disposed on the peripheral circuit structure and including a memory cell array constituted by a plurality of memory cells,
wherein the peripheral circuit structure includes:
a first transistor integrated on an upper surface of the semiconductor substrate and constituting the sense amplifier and a second transistor constituting the sub-word line driver;
a peripheral contact plug electrically connected to each of the first transistor and the second transistor;
a peripheral circuit wiring electrically connected to the peripheral contact plug; and
a connection wiring structure disposed on the peripheral circuit wiring and including a first connection wiring and a first connection contact plug electrically connecting the first connection wiring to the peripheral circuit wiring,
wherein each of the plurality of memory cells of the cell array structure includes:
a bit line extending in a first horizontal direction and electrically connected to the firs connection wiring;
a channel pattern including a horizontal channel portion on the bit line and a vertical channel portion vertically protruding from the horizontal channel portion;
a first word line extending in a second horizontal direction intersecting with the first horizontal direction on the channel pattern;
a first gate insulating pattern located between the channel pattern and the first word line;
a landing pad electrically connected to the vertical channel portion of the channel pattern; and
a data storage pattern disposed on the landing pad,
wherein:
at least a portion of the sense amplifier region overlaps the plurality of memory cells in a vertical direction, and
the first connection wiring, the first connection contact plug, the peripheral circuit wiring, and the peripheral contact plug electrically connecting the bit line to the first transistor vertically overlap the plurality of memory cells.

18. The semiconductor memory device of claim 17, wherein
the connection wiring structure further includes:
a second connection wiring including a connection pad on the first connection wiring and a connection wiring line extending in the first horizontal direction; and
a second connection contact plug electrically connecting the second connection wiring to the first connection wiring,
wherein:
the bit line is electrically connected to the first transistor through the connection pad and the second connection contact plug,
at least a portion of the sub-word line driver region overlaps the plurality of memory cells in the vertical direction, and
the connection wiring line is electrically connected to the second transistor through the second connection contact plug, the first connection wiring, the first connection contact plug, the peripheral circuit wiring, and the peripheral contact plug overlapping the plurality of memory cells in the vertical direction.

19. The semiconductor memory device of claim 17, further comprising:
a second word line, and
a second gate insulating pattern located apart from the first gate insulating pattern and between the second word line and the channel pattern,
wherein the first and second word lines are symmetrically disposed on the horizontal channel portion, and
wherein each of the first word line and the second word line includes a horizontal portion on the horizontal channel portion and a vertical portion, on the vertical channel portion, protruding from the horizontal portion in the vertical direction.

* * * * *